United States Patent [19]
Miyawaki

[11] Patent Number: 5,031,015
[45] Date of Patent: Jul. 9, 1991

[54] SOLID-STATE HETEROJUNCTION ELECTRON BEAM GENERATOR

[75] Inventor: Mamoru Miyawaki, Tokyo, Japan

[73] Assignee: Canon Kabushiki Kaisha, Tokyo, Japan

[21] Appl. No.: 563,852

[22] Filed: Aug. 7, 1990

Related U.S. Application Data

[63] Continuation of Ser. No. 391,683, Aug. 10, 1989, abandoned, which is a continuation of Ser. No. 281,969, Nov. 30, 1988, abandoned, which is a continuation of Ser. No. 84,517, Aug. 12, 1987, abandoned.

[30] Foreign Application Priority Data

| | | | |
|---|---|---|---|
| Aug. 12, 1986 | [JP] | Japan | 61-189392 |
| Aug. 12, 1986 | [JP] | Japan | 61-189393 |
| Aug. 12, 1986 | [JP] | Japan | 61-189394 |
| Aug. 12, 1986 | [JP] | Japan | 61-189395 |
| Aug. 12, 1986 | [JP] | Japan | 61-189396 |
| Aug. 12, 1986 | [JP] | Japan | 61-189397 |
| Aug. 12, 1986 | [JP] | Japan | 61-189398 |
| Aug. 12, 1986 | [JP] | Japan | 61-189399 |

[51] Int. Cl.[5] .......... H01L 29/161
[52] U.S. Cl. .......... 357/016; 357/034; 357/056; 357/055; 357/052; 313/346 R; 313/446
[58] Field of Search .......... 357/30, 34, 16, 56, 357/55, 4, 52 C, 29, 31, 13, 52; 313/346 R, 446

[56] References Cited

U.S. PATENT DOCUMENTS

| | | | |
|---|---|---|---|
| 4,000,503 | 12/1976 | Matare | 357/52 X |
| 4,015,284 | 3/1977 | Hara et al. | 357/52 X |
| 4,040,080 | 8/1977 | Hara et al. | 357/52 X |
| 4,352,117 | 9/1982 | Cuomo et al. | 357/52 X |
| 4,506,284 | 3/1985 | Shannon | 357/4 X |
| 4,523,961 | 6/1985 | Hartman et al. | 357/63 X |
| 4,574,216 | 3/1986 | Hoeberechts et al. | 313/446 X |
| 4,593,305 | 6/1986 | Kurata et al. | 357/34 |
| 4,625,223 | 11/1986 | Komatsubara et al. | 357/16 X |
| 4,712,121 | 12/1987 | Yokoyama | 357/16 X |

FOREIGN PATENT DOCUMENTS

| | | | |
|---|---|---|---|
| 61-150373 | 7/1986 | Japan | 357/34 HB |

OTHER PUBLICATIONS

Yokoyama et al., "A New Functional Resonant-Tunneling Hot Electron Transistor (RHET)", *Jap. Jour. of Appl. Phys.*, vol. 24, No. 11, Nov. 1985, 2853–2854.

Pearson et al., "Hydrogenation of GaAs on Si: Effects on Diode Reverse Leakage Current", *Appl. Phys. Lett.*, 51(7), 17 Aug. 1987, 496–498.

*Primary Examiner*—William Mintel
*Attorney, Agent, or Firm*—Fitzpatrick, Cella Harper & Scinto

[57] ABSTRACT

A solid-state electron beam generator has a hetero bipolar structure comprising an emitter region having a first band gap, a base region having a second band gap narrower than the first band gap, and a collector region having an electron-emitting surface. Electrons are injected from the emitter region into the base region while a backward bias voltage being applied between the base region and the collector region. In consequence, electrons are emitted from the electron-emitting surface of the collector region. The emitter region is constituted by an N-type $Al_xGa_{1-x)}As$ layer ($0<x\leqq 1$) having the first band gap and formed on an n-type or $n^+$-type GaAs substrate or a semi-insulating GaAs substrate, the base region is constituted by a P-type $Al_zGa_{(1-z)}As$ layer ($0\leqq z<x$) having the second band gap, and the collector region is constituted by an n-type $Al_tGa_{(1-t)}As$ layer ($0\leqq t\leqq 1$) formed on the n-type or $n^+$-type GaAs substrate or a semi-insulating GaAs substrate.

40 Claims, 27 Drawing Sheets

SOLID-STATE HETEROJUNCTION ELECTRON BEAM GENERATOR

This application is a continuation of application Ser. No. 07/391,683 filed Aug. 10, 1989, now abandoned, which is a continuation of application Ser. No. 07/281,969 filed Nov. 30, 1988, now abandoned, which is a continuation of application Ser. No. 07/084,517 filed Aug. 12, 1987, now abandoned.

BACKGROUND OF THE INVENTION

1. Field of the Invention

The present invention relates to a solid-state electron beam generator.

2. Related Background Art

A known solid-state electron beam generators is shown in, for example, specification of U.S. Pat. No. 4,259,678. This known electron beam generator has a pn junction formed on a Si semiconductor substrate. A reverse voltage is applied to the pn junction so as to produce avalanche effect thereby generating electrons (referred to as "hot electrons" hereinunder) having energy level higher than that in a thermal equilibrium state. An electron beam is then emitted into vacuum by the kinetic energy of the hot electrons.

In this known electron beam generator, the proportion of number of hot electrons having energy levels higher than the vacuum energy level to the total number of hot electrons produced by the avalanche effect is rather small, so that only a small electric current is obtained.

Another type of known solid-state electron beam generator has, as disclosed in Japanese Patent Publication No. 30274/1979, a pn junction composed of a $Al_xGa_{(1-x)}P$ layer ($0 \leqq x \leqq 1$) which is formed on a GaP semiconductor substrate and a forward voltage is applied to the pn junction region thereby causing emission of electrons which have been injected from the n-type region into the p-type region.

This solid-state electron beam generator can provide a greater number of carriers than in the first-mentioned known electron beam generator disclosed in U.S. Pat. No. 4,259,678, but the efficiency of emission of electrons into vacuum is impractically low because of lack of any region for forming hot electrons. In addition, a GaP substrate in general tends to have crystalline defects such that it is rather difficult to form good pn junction region.

In advancement of the above-mentioned two types of known solid-state electron beam generators, a solid-state electron beam generator has been proposed in the specification of U.S. Pat. No. 3,119,947 in which an npn region is formed on a Si semiconductor substrate and a voltage is applied between both n-type regions thereby causing electrons to be emitted. This known electron beam generator employing an npn junction can increase the emission efficiency to an order of $10^{-4}$ which is much higher than $10^{-6}$ which is obtained in the first-mentioned known electron beam generator which employs a pn junction. This solid-state electron beam generator, however, is generally difficult to produce because the p-type region and the n-type region on the emission side have to be formed in an extremely small thickness on the order of several hundreds of angstroms and, in addition, with a high degree of uniformity in thickness. Thus, the solid-state electron beam generator of the third type cannot easily be put into practical use.

SUMMARY OF THE INVENTION

Accordingly, an object of the present invention is to provide a solid-state electron beam generator with a construction which is so simple that the production process is remarkably simplified and yet can operate at much higher electron emission efficiency than known solid-state electron beam generators.

To this end, according to one form of the present invention, there is provided a solid-state electron beam generator having a hetero bipolar structure comprising an emitter region having a first band gap, a base region having a second band gap narrower than the first band gap, and a collector region having an electron-emitting surface. Electrons from the emitter region are injected into the base region. A backward bias voltage is applied between the base region and the collector region. Whereby the electrons are emitted from the electron-emitting surface.

In operation, electrons are injected from the emitter region having greater band gap into the base region having the smaller band gap and the electrons are accelerated by the electric field formed in the collector region, so that the electrons are supplied with kinetic energy of a level which is high enough to cause the electrons to be emitted from the end surface of the collector region.

According to another form of the present invention, there is provided a solid-state electron beam generator having a hetero junction comprising a first region having a first band gap, and a second region having a second band gap narrower than the first band gap. Electrons from the first region are injected into the second region, thereby causing the electrons to be emitted from an end surface of the second region.

In operation, electrons are charged from the first region having greater band gap into the second region having the smaller band gap, thereby causing the electrons to be emitted directly from the end surface of the second region.

According to still another form of the present invention, there is provided a solid-state electron beam generator comprising: a hetero bipolar semiconductor formed on a GaAs epitaxial film on a Si substrate, the semiconductor comprising an emitter region having a first band gap, a base region having a second band gap narrower than the first band gap, and a collector region having an electron-emitting surface; means for injecting electrons from the emitter region into the base region. A backward bias voltage is applied between the base region and the collector region. Thereby the electrons are emitted from the electron-emitting surface.

The emitter region having greater band gap and the base region having smaller band gap are formed by growing an AlGaAs film on the Si substrate. In operation, electrons are injected from the emitter region having greater band gap into the base region having the smaller band gap and the electrons are accelerated by the electric field formed in the collector region, so that the electrons are supplied with kinetic energy of a level which is high enough to cause the electrons to be emitted from the end surface of the collector region. This electron beam generator can produce electric current of a high density because the Si substrate exhibits a small heat resistance. The use of a Si substrate facilitates connection of this electron beam generator to any integrated circuit having a Si substrate.

According to a further form of the present invention, there is provided a solid-state electron beam generator comprising: a hetero junction structure formed on a GaAs epitaxial film on an Si substrate, the hetero junction structure comprising a first region having a first band gap, and a second region having a second band gap narrower than the first band gap. Electrons from the first region are injected into the second region, thereby causing the electrons to be emitted from an end surface of the second region.

The first region having greater band gap and the second region having smaller band gap are formed by growing an AlGaAs film on the Si substrate. In operation, electrons are injected from the first region having greater band gap into the second region so as to be emitted from the end surface of the second region. This electron beam generator can produce electric current of a high density because the Si substrate exhibits a small heat resistance. The use of Si substrate facilitates connection of this electron beam generator to any integrated circuit having a Si substrate.

According to a still further form of the present invention, there is provided a solid-state electron beam generator having a hetero bipolar structure comprising an emitter region having a first band gap, a base region having a second band gap narrower than the first band gap, a collector region having an electron-emitting surface, and a graded layer between the emitter region and the base region and formed from a predetermined material in which the crystal mixing ratio is changed progressively. Electrons from the emitter region are injected into the base region. A backward bias voltage is applied between the base region and the collector region, whereby the electrons are emitted from the electron-emitting surface.

In operation, electrons are injected from the emitter region having greater band gap into the base region having smaller band gap through the graded region, and are accelerated by an electric field in the collector region so as to have kinetic energy of a level which is high enough to cause the electrons to be emitted from the end surface of the collector.

According to a still further form of the present invention, there is provided a solid-state electron beam generator having: a hetero junction comprising a first region having a first band gap, a second region having a second band gap narrower than the first band gap, and a graded region formed of a predetermined material in which the crystal mixing ratio is changed progressively. Electrons from the first region are injected into the second region, thereby causing the electrons to be emitted from an electron-emission surface of the second region.

In operation, electrons are charged from the first region having greater band gap into the second region having the smaller band gap, thereby causing the electrons to be emitted directly from the end surface of the second region.

According to a still further form of the present invention, there is provided a solid-state electron beam generator comprising: a hetero bipolar semiconductor formed on a GaAs epitaxial film on an Si substrate, the semiconductor comprising an emitter region having a first band gap, a base region having a second band gap narrower than the first band gap, a collector region having an electron-emitting surface, and a graded region formed of a predetermined material in which the crystal mixing ratio is changed progressively. Electrons from the emitter region are injected into the base region. A backward bias voltage is applied between the base region and the collector region, whereby the electrons are emitted from the electron-emitting surface.

The emitter region having greater band gap and the base region having smaller band gap are formed by growing an AlGaAs film on the Si substrate. In operation, electrons are injected from the emitter region having greater band gap into the base region through the graded region and are accelerated by electric field formed in the collector region so as to have kinetic energy of level which is high enough to cause the electrons to be emitted from the end surface of the collector region. This electron beam generator can produce electric current of a high density because the Si substrate exhibits a small heat resistance. The use of a Si substrate facilitates connection of this electron beam generator to any integrated circuit having a Si substrate.

According to a still further form of the present invention, there is provided a solid-state electron beam generator comprising: a hetero-junction structure formed on a GaAs epitaxial film on a Si substrate and comprising a first region having a first band gap, a second region having a second band gap narrower than the first band gap, and a graded region formed of a predetermined material in which the crystal mixing ratio is changed progressively. Electrons from the first region are injected into the second region, thereby causing the electrons to be emitted from an electron-emission surface of the second region.

The first region having greater band gap and the second region having smaller band gap are formed by growing an AlGaAs film on the Si substrate. In operation, electrons are injected through the graded region from the first region having greater band gap into the second region so as to be emitted from the end surface of the second region. This electron beam generator can produce electric current of a high density because the Si substrate exhibits a small heat resistance. The use of Si substrate facilitates connection of this electron beam generator to any integrated circuit having a Si substrate.

BRIEF DESCRIPTION OF THE DRAWINGS

FIG. 26 is an energy band diagram showing electron energy level in the thermal equilibrium state of the thirteenth embodiment;

DESCRIPTION OF THE PREFERRED EMBODIMENTS

Preferred embodiments of the present invention will be described hereinunder with reference to the accompanying drawings.

Figure 1:
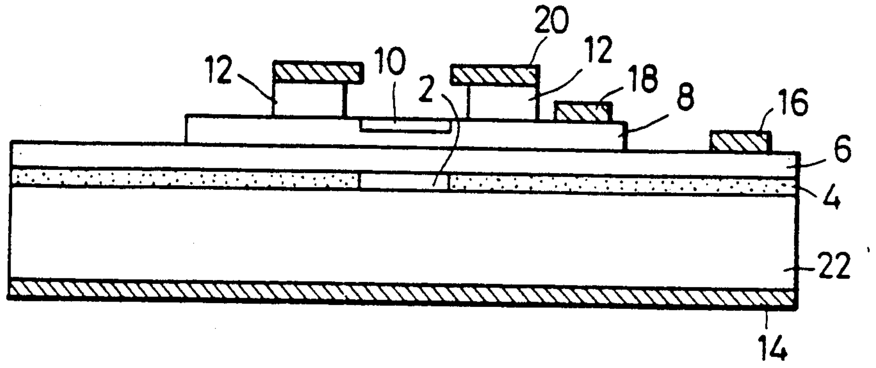
FIG. 1 is a sectional view of a first embodiment of the present invention.

FIG. 1 is a sectional view of an embodiment of a solid-state electron beam generator of the present invention which employs an n-type or $n^+$-type GaAs substrate 22. This embodiment has an N-type $Al_xGa_{(1-x)}As$ layer 2 serving as an emitter. The symbol x represents the crystal mixing ratio which is selected to meet the condition of $0<x\leqq 1$. The capital-letter symbol N represents an n-type region having a wide band gap. The embodiment further has an inert layer 4 which is formed by injecting oxygen into the N-type $Al_xGa_{(1-x)}As$ layer 2. The embodiment further has a p-type GaAs layer 6 which serves as a base. The small-letter symbol "p" is used to mean a p-type region with narrow band gap. In this embodiment, it is possible to include Al such that the p-type GaAs layer is substituted by a P-type $Al_zGa_{(1-z)}As$ layer ($0\leqq z<x$), thereby allowing a control of the band gap of the layer 6. The embodiment further has an n-type GaAs layer 8 serving as a collector. The small-letter "n" is used here to mean an n-type region of a narrow band gap. The n-type GaAs layer may be substituted by an n-type $Ag_tGa_{(1-t)}As$ layer ($0\leqq t\leqq 1$).

Thus, this embodiment of the solid-state electron beam generator in accordance with the present invention has a layered structure similar to that of a hetero-bipolar transistor.

A reference numeral 10 designates a cesium oxide (Cs-O) layer formed by deposition or diffusion on the surface of the collector layer 8. This Cs-O layer serves as an electron-emission surface. The Cs-O layer 10 may be substituted by another type of layer formed by deposition or diffusion from a material containing an alkali metal such as Cs and at least one element selected from the group consisting of Cu, Ag, Au, Sb, Bi, Se, As, P, Te, Si and O.

The solid-state electron beam generator further has a $SiO_2$ insulating layer 12, an emitter electrode 14, a base electrode 16, a collector electrode 18, an acceleration electrode 20 and an n-type or $n^+$type GaAs substrate. Electrodes for n- or N-type semiconductor may be formed from a composition such as Au-Ge or Au-Ge-Ni, while the electrode for the p-type semiconductor may be formed from Au-Sn, Ag-Zn, Au-Be or Au-Zn. In the illustrated embodiment, the electrode of the p-GaAs is formed directly on the surface of the p-type GaAs layer. This, however, is not exclusive and the electrode may be formed after doping the surface of this GaAs layer with Be ions so as to form a $p^+$-type region or may be formed on a $p^+$-type GaAs layer grown on the surface of the p-type GaAs layer surface.

The operation of this embodiment will be described with reference to FIGS. 2 and 3 which are energy band diagrams showing energy level of electrons as observed when the electron beam generator is in a thermally equilibrium state and when a bias voltage is being applied, respectively.

As explained before, the emitter layer 2 is formed from, for example, $Al_xGa_{(1-x)}As$ layer which has a wide band gap so as to ensure high efficiency of injection of current into the base layer 6. In the diagrams shown in FIGS. 2 and 3, the crystal mixing ratio x of Al is selected to be x=0.3 for attaining a good hetero junction and considering also influences of the L-band and X-band. This value of the crystal mixing ratio, however, is only illustrative.

The doping rate of the emitter layer is as high as $5\times10^{17}$ to $1\times10^{19}$ $cm^{-3}$ so as to allow a large number of carriers to be injected into the base region. It is, however, to be noted that the regions other than the electron beam generating region have been rendered inert by, for example, oxygen ion implantation. This high level of doping causes the state of the layer to be changed into a degenerating state and the Fermi level is set above the conductive band.

Figure 2:
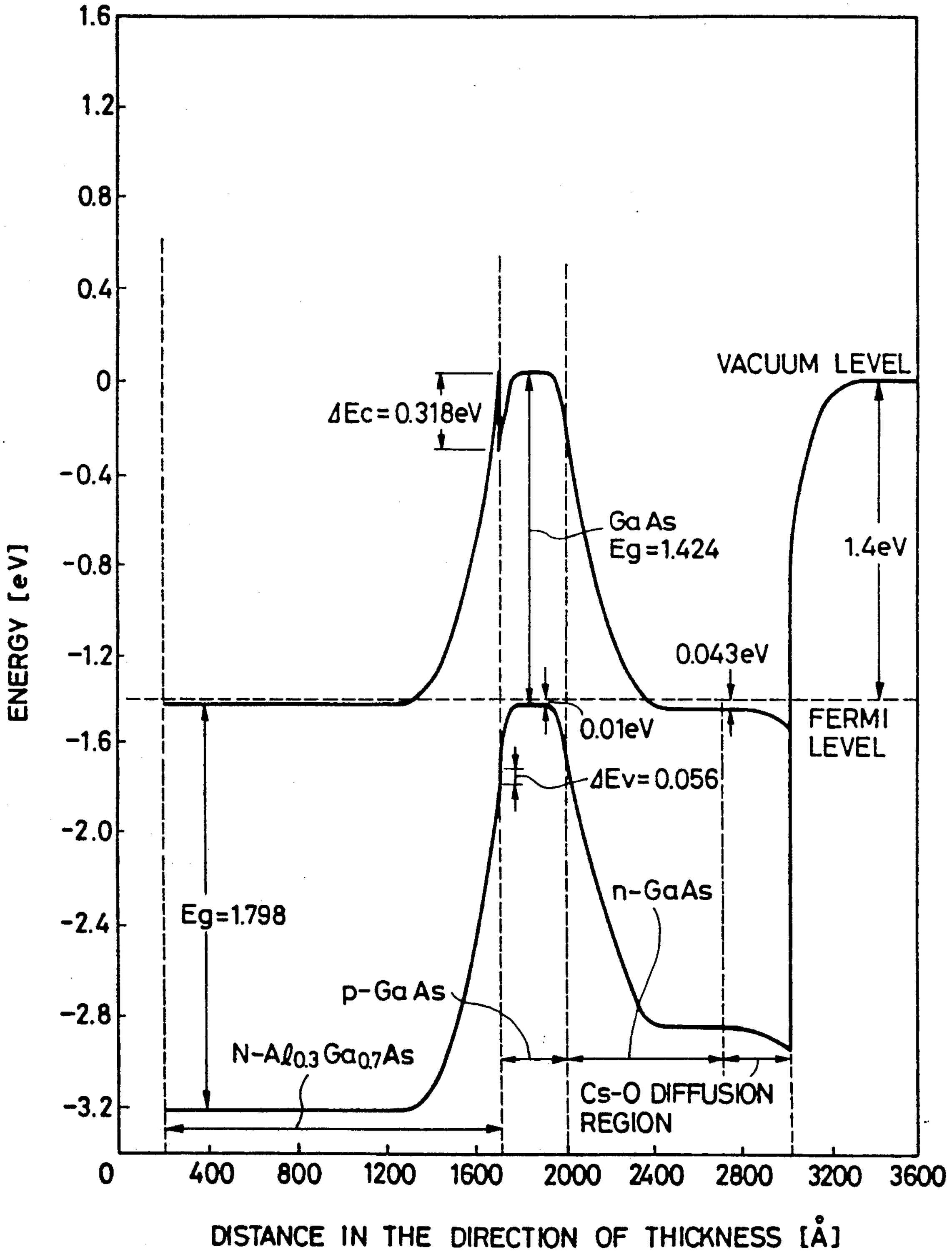
FIG. 2 is an energy band diagram showing electron energy level in the thermal equilibrium state of the first embodiment.

Although the thickness of the emitter layer is selected to be 1500 Å in FIG. 2, the thickness of this layer may be varied as desired insofar as it ensures a large rate of injection of carriers into the base layer 6.

Referring now to the base layer 6, this layer 6 is formed from a p-type GaAs layer having a narrow band gap, in order to ensure a high efficiency of injection of current into the base layer 6. The amount of dopant in this p-type GaAs layer is selected to be on the order of $5\times10^{18}$ $cm^{-3}$ so as to reduce resistance, and the thickness of the base layer 6 is selected to be about 300 Å so as to reduce scattering in this layer.

Since the emitter layer 2 and the base layer 6 have different band gap widths, a spike is formed at the boundary of these layers as shown in FIG. 2. When $Al_{0.3}Ga_{0.7}As$ is used as the material of the emitter layer while GaAs is used as the material of the base layer, the height $\Delta E_c$ of the spike is about 0.318 eV.

The work function at the collector surface is as small as 1.4 eV because the Cs-O layer is diffused in the surface of the collector layer 8. In order to realize an ohmic contact of a low resistance between the collector layer 8 and the collector electrode 18, a dopant amount which is as large as $1\times10^{18}$ $cm^{-3}$ is applied to the collector layer 8. Although in this embodiment the collector layer 8 has a thickness of 1000 Å, this thickness value is only illustrative. More specifically, the collector layer 8 has a smaller thickness provided that a good ohmic contact is attained between the collector electrode 18 and the collector layer 8. A high quality and uniformity of the collector layer 8 are obtainable by the use of a molecular beam epitaxy (MBE) device or a metalorganic chemical vapour deposition (MOCVD) device.

Figure 3:
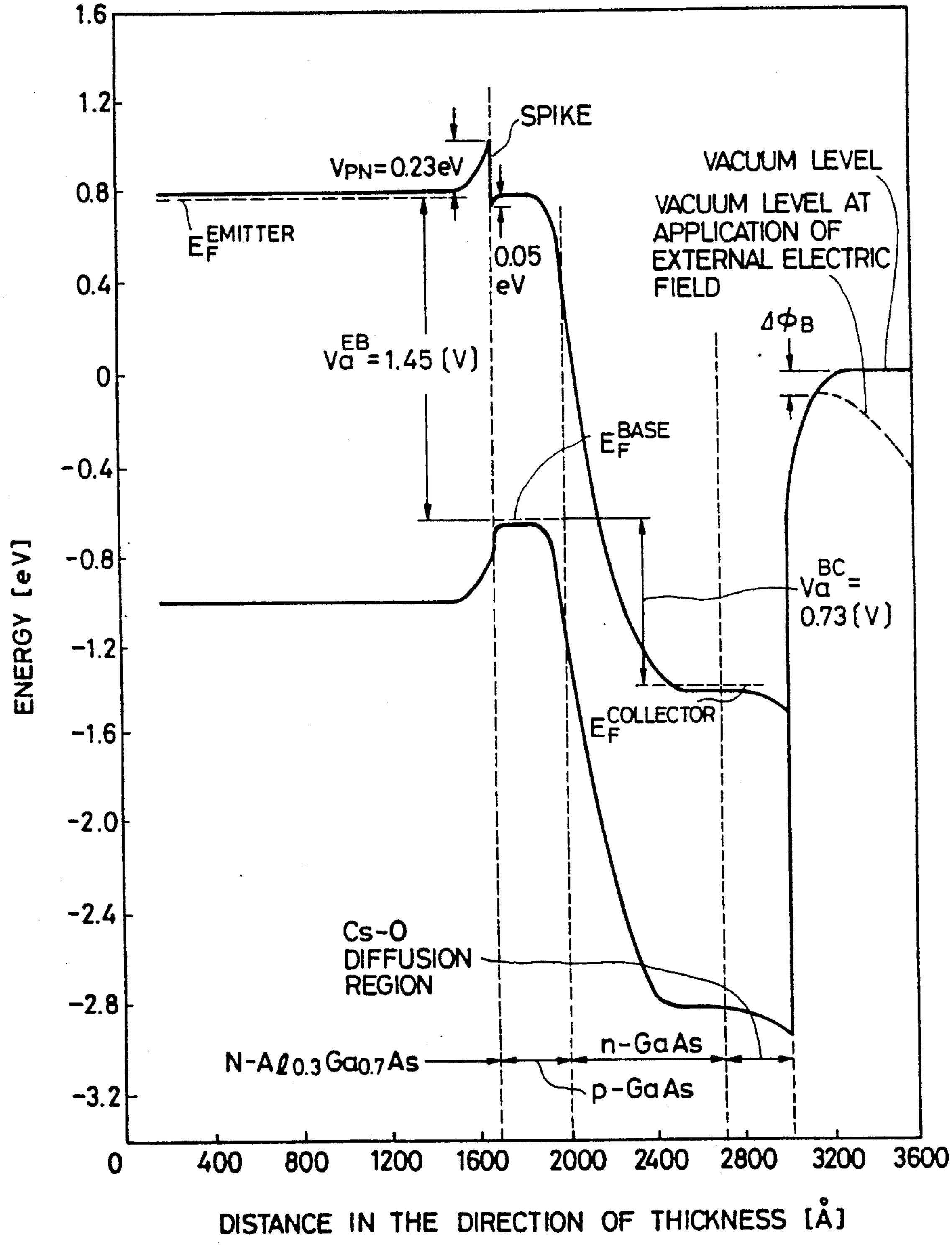
FIG. 3 is an energy band diagram showing electron energy level when a bias voltage is applied in the first embodiment.

FIG. 3 shows the state of the electron beam generator under application of a bias voltage. More specifically, FIG. 3 shows the energy band as obtained when a forward bias voltage $V_{EB}$ is applied between the emitter and the base while a backward bias voltage $V_{BC}$ is applied between the base and the collector in the device which is in thermally equilibrium state as shown in FIG. 1. When a voltage of 1.45 V is applied between the emitter and the base, the quasi Fermi level $E_F$ in the emitter layer 2 approaches the conduction band of the base layer 6.

Due to the presence of the spike as shown in FIG. 3, the carriers injected into the base layer 6 are changed into hot electrons due to thermal jumping or tunnel effect. The thus generated hot electrons are accelerated by the bias voltage $V_{BC}$ applied between the base and the collector, so as to have high level of kinetic energy.

The level of the energy possessed by the electrons passing through the base layer 6 is about 0.7 eV higher than the vacuum level. Therefore, a large proportion of electrons is emitted into vacuum through a considerable part of energy being lost due to scattering in the collector layer 8. It is also to be noted that, in the described embodiment, the regions of the collector layer surface with diffusion of Cs-O other than the electron emitting region 10 are provided with the $SiO_2$ insulating layer 12 and the external acceleration electrode 20. Therefore, the vacuum level is lowered by $\Delta\phi_B$ as shown by the broken line in FIG. 3, as a result of application of an external electric field, whereby the electron emission efficiency is further increased.

Figure 4:
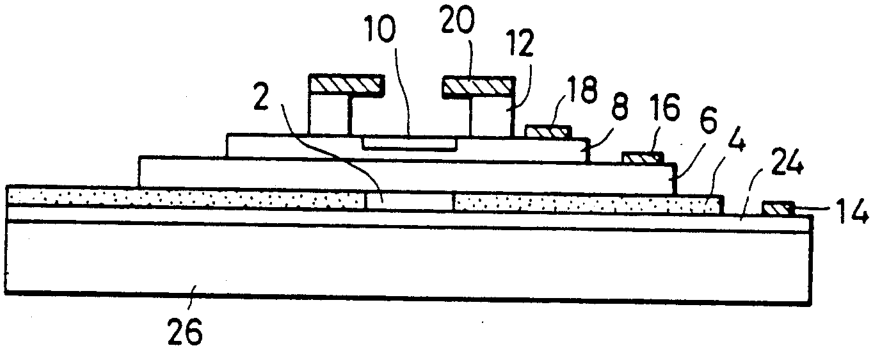
FIG. 4 is a sectional view of a second embodiment of the present invention.

FIG. 4 is a sectional view of a second embodiment of the solid-state electron beam generator of the invention, which makes use of a semi-insulating GaAs substrate 26. In this embodiment, therefore, the emitter electrode 14 is formed on an n-type or $n^+$-type GaAs layer 24. Other portions of the structure are materially the same as those of the embodiment shown in FIG. 1. Thus, the same reference numerals are used in FIG. 4 to denote the same parts as those in FIG. 1. Thus, the arrangement of layers of the compounds constituting hetero junction, as well as the principle of operation, is the same as that explained in connection with FIGS. 1, 2 and 3.

Figure 5:
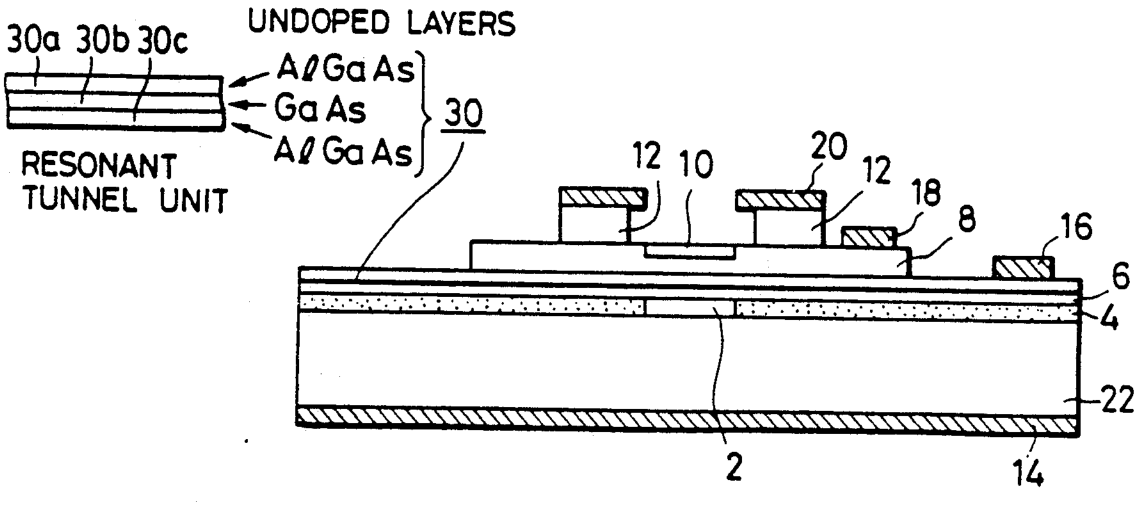
FIG. 5 is a sectional view of a third embodiment of the present invention.
Figure 6:
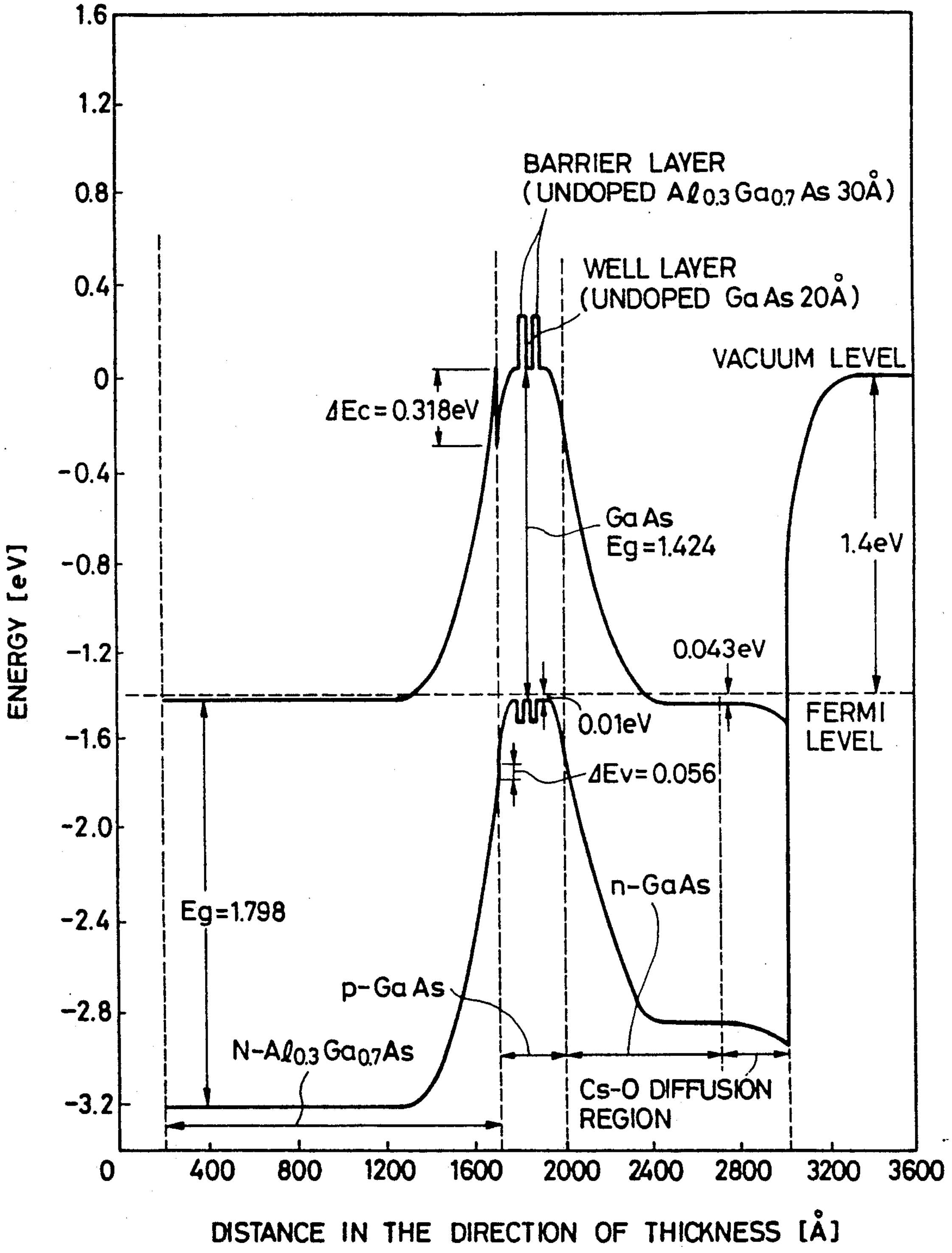
FIG. 6 is an energy band diagram showing electron energy level in the thermal equilibrium state of the third embodiment.
Figure 7:
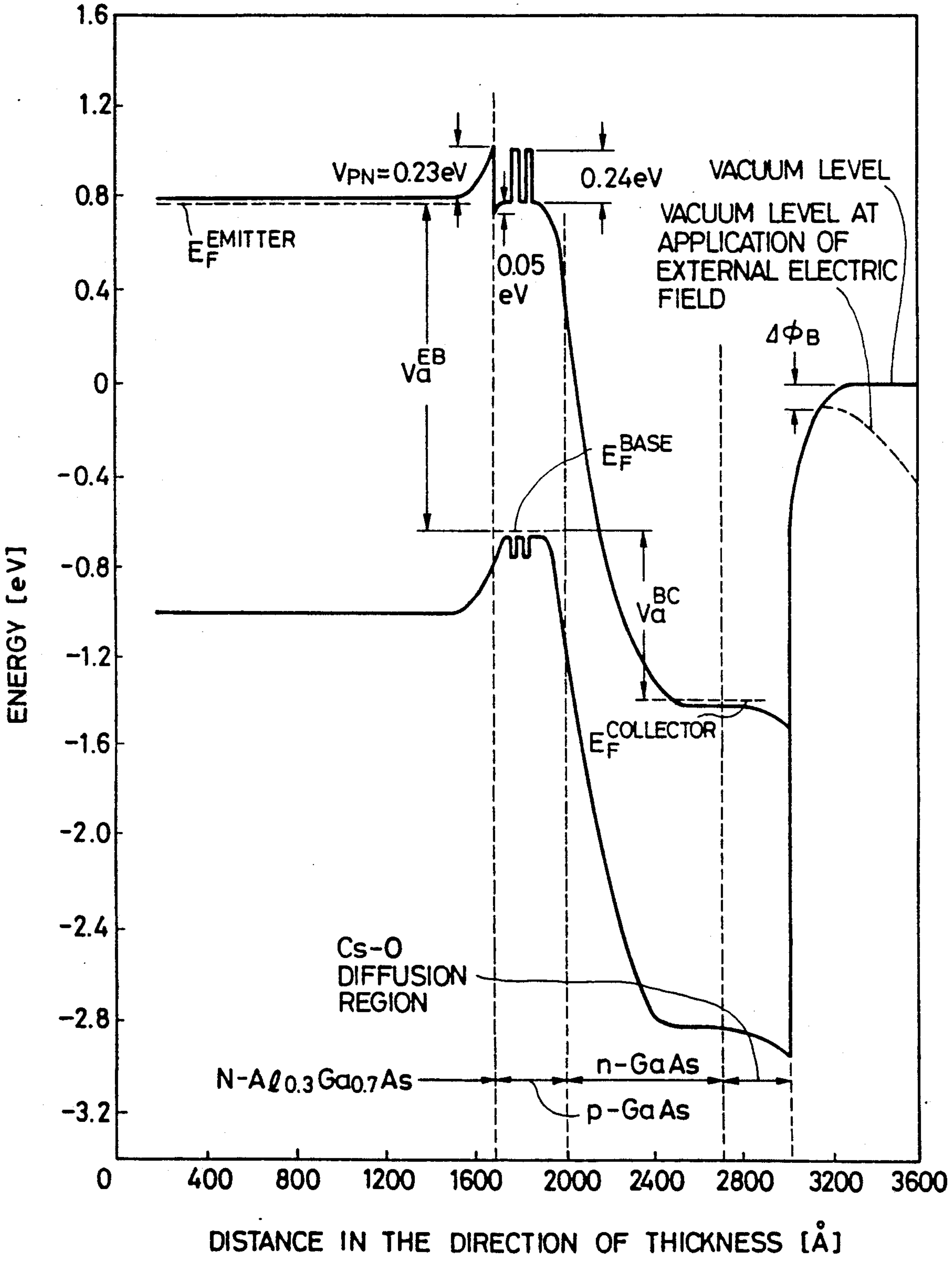
FIG. 7 is an energy band diagram showing electron energy level when a bias voltage is applied in the third embodiment.

FIG. 5 shows a third embodiment of the solid-state electron beam generator in accordance with the present invention. FIGS. 6 and 7 are energy band diagrams showing levels of energy of electrons as are obtained when the electron beam generator is in the thermally equilibrium state and when a bias voltage is applied, respectively.

The third embodiment shown in FIG. 5 is distinguished from the first embodiment shown in FIG. 1 in that the base region composed of the p-type GaAs layer 6 is provided with a resonance tunnel section 30 composed of a non-doped $Al_{0.3}Ga_{0.7}As$ layer 30a; serving as a barrier layer, a non-doped $Al_sGa_{(1-s)}As$ layer 30b serving as a well layer, and a non-doped $Al_{0.3}Ga_{0.7}As$ layer 30c such as to meet the condition of $0=<\times<y\leqq1$, thereby forming a resonance tunnel level. Other portions are materially the same as those of the first embodiment. The principle and operation also are the same as those in the first embodiment shown in FIGS. 1 to 3.

When the thicknesses of the barrier layer and the well layer in the resonance tunnel section 30 are 30 Å and 20 Å, respectively, the first resonance level appears at a point which is 0.11 eV above the conduction band in the base region. Therefore, as a forward voltage $V_{EB}$ is applied between the emitter and the base as shown in FIG. 7 so as to make the quasi Fermi level of the emitter region coincide with the resonance tunnel level, the hot electrons are made to pass through the base layer past the resonance tunnel.

When the amount of dopant of the emitter layer 2 is on the order of $1\times10^{18}$ $cm^{-3}$, the difference between the quasi Fermi level of the emitter layer and the energy level $E_C$ of the conduction band is given as follows.

$$\Delta E = E_F - E_C \simeq 0.01 \text{ (eV)}$$

This level difference coincides with the energy band width ΔE of the resonance tunnel level. In addition, since the p-type GaAs layer 6 constituting the base has a high rate of dope which is $1 \times 10^{19}$ $cm^{-3}$, the energy bands in the barrier layer and the well layer are flattened thus realizing a symmetrical double barrier structure. As a consequence, the proportion of the electrons passing through the resonance tunnel 30 is increased.

In the described embodiment of the present invention, energy band width of the hot electrons is limited by the energy band width ΔE of the resonance tunnel level, so that carriers of low energy levels cannot flow into the base layer and the collector layer. In consequence, the proportion of the carriers which fall to the level of the collector region surface, i.e., the proportion of electrons of low energy levels, is decreased, so that deterioration of the device can be suppressed advantageously.

In the third embodiment explained in connection with FIGS. 5 and 7, the hetero junction between the emitter region and the base region has a steep gradient so as to form a spike therebetween. This spike, however, is not essential because hot electrons can be formed also in the double-barrier structure which forms the resonance tunnel.

When the spike is eliminated, the composition of the boundary between the emitter region and the base region is progressively changed so as to provide a graded layer.

Figure 8:
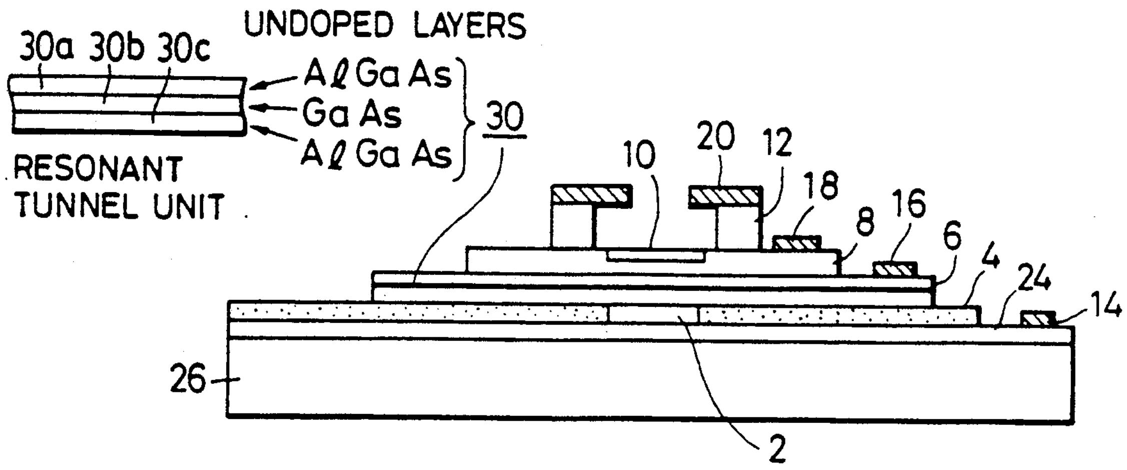
FIG. 8 is a sectional view of a fourth embodiment of the present invention.

FIG. 8 shows a fourth embodiment of the present invention. This embodiment is basically the same as the third embodiment shown in FIG. 5 except that a semiinsulating GaAs substrate 26 is used as the substrate. In this embodiment, therefore, the emitter electrode 14 is provided on the n-type GaAs layer 24. Other structural features, as well as operation, are materially the same as those in the third embodiment so that detailed description thereof is omitted.

Figure 9:
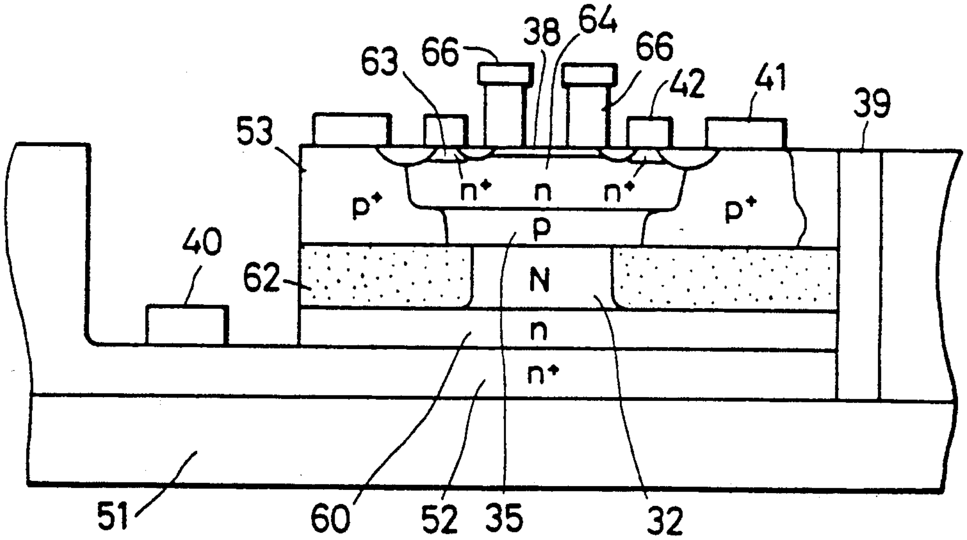
FIG. 9 is a sectional view of a fifth embodiment of the present invention.

FIG. 9 is a sectional view of a fifth embodiment of the present invention. Unlike the preceding embodiments, the fifth embodiment proposes a planar type device. This fifth embodiment is constituted by the following portions: an emitter electrode 40; $n^+$-type GaAs layers 52 (+ means high doping density); n-type GaAs layers 60, 64; an N-type $Al_xGa_{(1-x)}As$ layer ($0<x \leq 1$) 32 having a wide band gap; a p-type GaAs layer 35; a $p^+$ layer 53 doped with Be; and a surface layer 38 doped with an agent (Cs-O) for reducing the work function. A numeral 39 denotes a B-injected layer for isolating adjacent regions.

It will be seen that this planar structure is suitable for production of multiple-type device in which a multiplicity of devices are arranged on a common plan.

Although the described first to fifth embodiments make use of GaAs which is one of semiconductors of compoints of elements belonging to groups III to V, such a material is not exclusive and various other materials such as InGaAsP/InP type materials and SiC/Si type materials can be used equally well.

Examples of construction of the solid-state electron beam generator of the invention which incorporate such materials are shown in Table 1 below.

TABLE 1

| | InGaAsP/InP type | SiC/Si type |
|---|---|---|
| substrate | InP | Si or SiC |
| Growth method | liquid phase growth | Gaseous or liquid phase growth |

TABLE 1-continued

| | InGaAsP/InP type | SiC/Si type |
|---|---|---|
| Emitter | $N^+$ type InP<br>N type InP | $N^+$ type SiC<br>N type SiC |
| Base | p-type InGaAsP | p-type Si |
| Collector | n-type InGaAsP | n-type Si |
| n-type dopant | Te<br>($\simeq 2 \times 10^{19}$ $cm^{-3}$) | N ($\simeq 10^{20}$ $cm^{-3}$) |
| p-type dopant | Cd or Mg<br>($\simeq 5 \times 10^{18}$ $cm^{-3}$) | Al<br>($10^{18}$ $cm^{-3}$) |
| n-type electrode | Au, Au—Ti, Pt, Sn | Au, Au—Ta (99:1) |
| p-type electrode | For InP<br>Au, Ni, Cu<br>For InGaAsP<br>Au, Ag | Al—Si (89:11) |

As will be understood from the foregoing description, the first to fifth embodiments of the present invention offers the following advantages.

(1) Since the emitter and the base have different band gap widths, the rate of injection of carrier is remarkably increased as compared with the case where the band gap width is equal. In addition, the carriers changed into hot electrodes are directly emitted to the outside without propagating through the semiconductor. In consequence, the efficiency of emission of electrons is remarkably increased.

(2) The emitter region and the base region can be formed as epitaxial films having thicknesses on the order of several tens of angstroms (Å), by making an efficient use of an MBE device or an MOCVD device. Thus, the layered structure of the device exhibits a high degree of quality and uniformity. Since the thicknesses of layers can be reduced, it is possible to decrease the driving voltage.

(3) Since the electron beam generator is produced from semiconductor materials, it becomes easy to obtain a device having a plurality of electron beam generators on a common substrate or to couple the electron beam generator to another device or other devices. This obviously contributes to an enlargement in the scale of integration of semiconductor devices.

Furthermore, the electrons are changed into hot electrons by virtue of the spike caused by the hetero junction between the emitter region and the base region or a resonance tunnel in the base region, so that the efficiency of emission of electrons is further increased.

Figure 10:
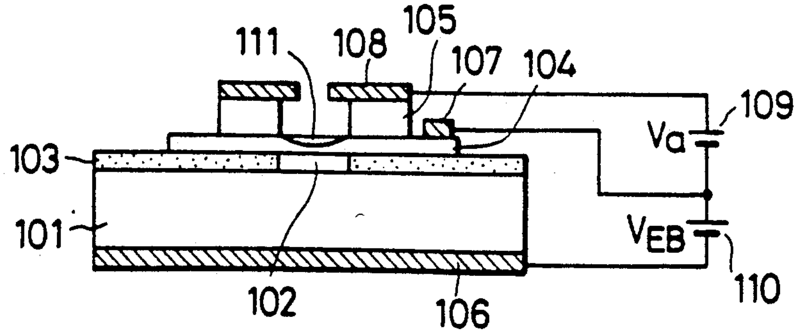
FIG. 10 is a sectional view of a sixth embodiment of the present invention.

FIG. 10 shows a sixth embodiment of the solid-state electron beam generator in accordance with the present invention. This embodiment has the following portions: an n-type or $n^+$-type GaAs substrate 101; an N-type $Al_xGa_{(1-x)}As$ layer 102 ($0<x\leq 1$); an inert layer 103 formed by, for instance, injection of ions of oxygen into the layer 102; a p-type GaAs layer 104; an insulating layer 105 such as of $SiO_2$; electrodes 106 and 107; an external accelerating electrode 108; bias voltage electrodes 109, 110; and a surface layer 111 of reduced work function through diffusion or deposition of, for example, cesium oxide (Cs-O).

The Cs-O layer 10 may be substituted by another type of layer formed by deposition or diffusion from a material containing an alkali metal such as Cs and at least one element selected from the group consisting of Cu, Ag, Au, Sb, Bi, Se, As, P, Te, Si and O.

The capital-letter symbol N represents an n-type region having a wide band gap. The small-letter symbols "p" and "n" are used to mean p-type region and n-type region with narrow band gaps, respectively.

In this embodiment, it is possible to add Al such that the p-type GaAs layer is substituted by a P-type $Al_zGa_{(1-z)}As$ layer ($0 \leqq z < x$), thereby allowing a control of the band gap of the layer 6. Electrodes for n- or N-type semiconductor may be formed from a composition such as Au-Ge or Au-Ge-Ni, while the electrode for the p-type semiconductor may be formed from Au-Sn, Ag-Zn, Au-Be or Au-Zn. In the illustrated embodiment, the electrode of the p-type GaAs is formed directly on the surface of the p-type GaAs layer. This, however, is not exclusive and the electrode may be formed after doping the surface of this GaAs layer with Be ions so as to form a $p^+$-type region or may be formed on a $p^+$-type GaAs layer grown on the surface of the p-type GaAs layer surface.

The operation of this embodiment will be described with reference to FIGS. 11 and 12 which are energy band diagrams showing energy levels of electrons as observed when the electron beam generator is in a thermally equilibrium state and when a bias voltage is being applied, respectively.

As explained before, the layer 102 is formed from, for example, $Al_xGa_{(1-x)}As$ layer which has a wide band gap so as to ensure high efficiency of injection of current into the layer 104. In the diagrams shown in FIGS. 11 and 12, the crystal mixing ratio x of Al is selected to be $x=0.3$ for attaining a good hetero junction and considering also influences of the L-band and X-band. This value of the crystal mixing ratio, however, is only illustrative.

The doping rate of the layer 102 is as high as $5\times10^{17}$ to $1\times10^{19}$ $cm^{-3}$ so as to allow a large number of carriers to be injected into the layer 104. It is, however, to be noted that the regions other than the electron beam generating region can be rendered inert by, for example, oxygen ion implantation. This high level of doping causes the state of the layer to be changed into a degenerating state and the Fermi level is set above the conductive band.

Figure 11:
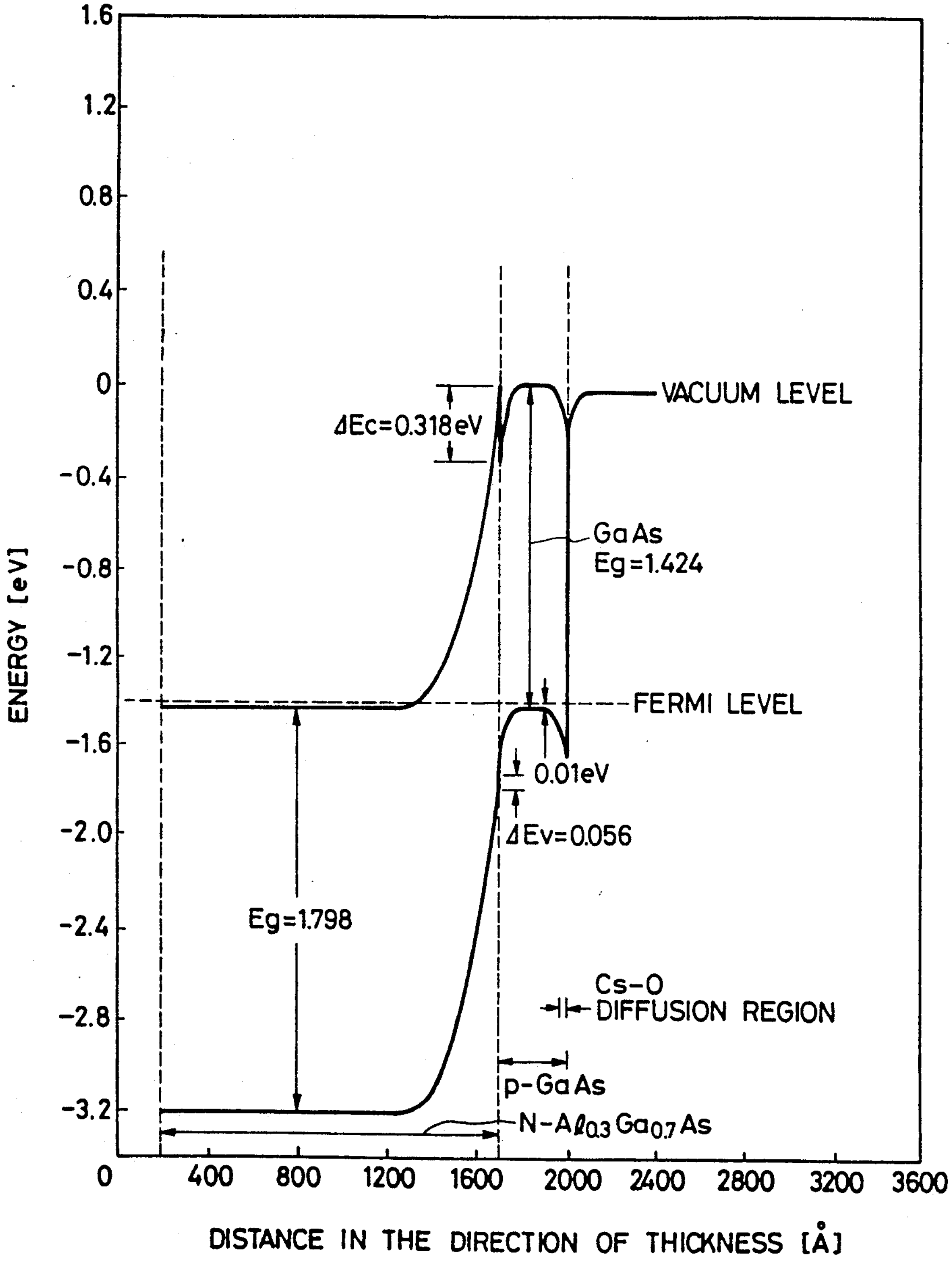
FIG. 11 is an energy band diagram showing electron energy level in the thermal equilibrium state of the sixth embodiment.
Figure 12:
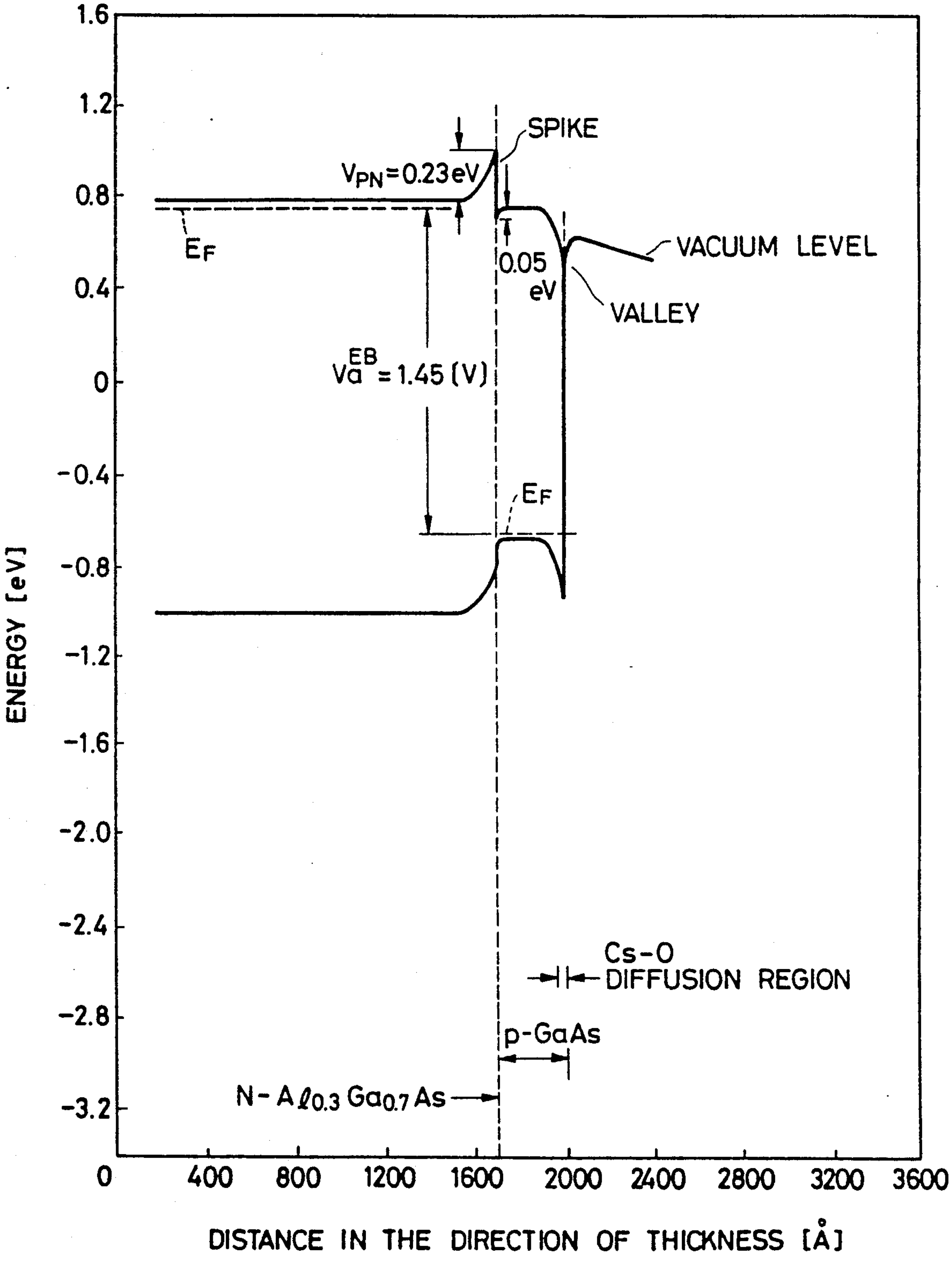
FIG. 12 is an energy band diagram showing electron energy level when a bias voltage is applied in the sixth embodiment.

Although the layer 102 is formed by an MBE device or an MOCVD device in a thickness selected to be 1500 Å in FIG. 11, the thickness of this layer 102 may be varied as desired insofar as it ensures a large rate of injection of carriers into the layer 104.

The electrode of the layer 102 is provided on the reverse side of the n-type or $n^+$-type GaAs substrate. It is, therefore, preferred that the substrate has a high rate of doping, so as to minimize the voltage drop across this substrate.

Referring now to the layer 104, this layer 104 is grown on the layer 102 by an MBE device or an MOCVD device from a p-type GaAs layer having a narrow band gap, in order to ensure a high efficiency of injection of current into the layer 104. The amount of dopant in this p-type GaAs layer is selected to be on the order of $5\times10^{18}$ $cm^{-3}$ so as to reduce resistance, and the thickness of the layer 104 is selected to be about 300 Å for the purpose of suppressing scattering in the above-mentioned region.

Since the layer 102 and the layer 104 have different band gap widths, a spike is formed at the boundary of these layers as shown in FIG. 11. When $Al_{0.3}Ga_{0.7}As$ is used as the material of the layer 102 while p-type GaAs is used as the material of the layer 104, the height $\Delta E_C$ of the spike is about 0.318 eV.

The work function at the base surface is as small as 1.4 eV because the Cs-O layer is diffused in this surface. As stated before, the surface layer for reducing the work function may be formed from a composite material containing another alkali metal, oxygen and at least one element selected from a group consisting of Sb, Bi, As, Ag, P, Te, Cu, Au and Si.

The state of energy band in this embodiment under application of a bias voltage will be explained with reference to FIG. 12. Using a first power supply 110 shown in FIG. 10, a forward bias voltage $V_{EB}$ is applied between the layers 102 and 104. Meanwhile, a voltage Va is applied between the external acceleration electrode 108 and the layer 104 by a second power supply 109 such that the external electrode 108 constitutes the plus side.

When the voltage $V_{EB}$ is 1.45 V, the quasi Fermi level $E_F$ in the layer 102 approaches the conduction band of the layer 104. The carriers injected into the layer 104 are those which have thermally skipped over the spike shown in FIG. 12 or permeated by a tunnel effect and, hence, have been changed into hot electrons.

The work function of the p-type GaAs layer 104 with diffused Cs-O is 1.4 eV, while the electronic affinity of the p-type GaAs layer is 4.07 eV. Therefore, the band of the p-type GaAs is deflected downward at a region in the vicinity of the surface. However, the carriers injected into the layer 104 have been changed into hot electrons since they are emitted into vacuum without dropping into the valley near the surface, as shown in FIG. 12. This is because the vacuum level is 1.4 eV which is lower than the band gap (1.42 eV) of the p-type GaAs. The vacuum level is deflected downward as shown in FIG. 12, because of application of the voltage Va between the external acceleration electrode 108 and the layer 104, so that an electric field is formed which acts to accelerate the emitted electrons.

The sixth embodiment shown in FIG. 10 makes use of an n-type or an $n^+$-type GaAs substrate. This, however, is not exclusive and the solid-state electron beam generator of the invention may be realized with the use of a semi-insulating GaAs substrate, by forming the electrode for the layer 102 on the obverse side by making use of, for example, a technique called "biahole" (Mitsui et al., refer to "BIAHOLE STRUCTURE GAAS LARGE OUTPUT MONOLITHICK AMPLIFIER", All Japan Conference of Electro-Communication, 1983, Semiconductor and Material Section, No. 122). An embodiment which makes use of such a substrate will be explained hereinunder.

Figure 13:
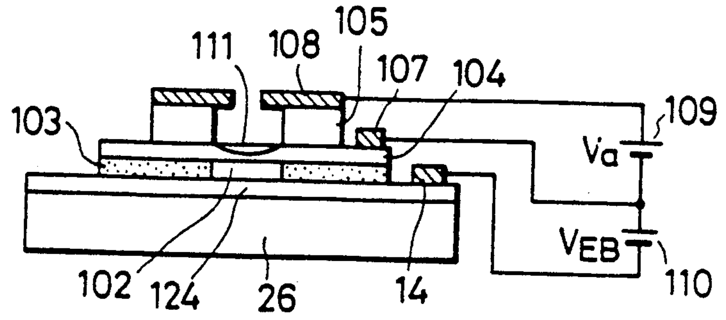
FIG. 13 is a sectional view of a seventh embodiment of the present invention.

FIG. 13 is a sectional view of a second embodiment of the solid-state electron beam generator of the invention, which makes use of a semi-insulating GaAs substrate 26. In this embodiment, therefore, the electrode 14 for the layer 102 is formed on an n-type or $n^+$-type GaAs layer 124. Other portion(s) of the structure are materially the same as those of the embodiment shown in FIG. 10. Thus, the same reference numerals are used in FIG. 13 to denote the same parts as those in FIG. 10. Thus, the arrangement of layers of the compounds constituting the hetero-junction, as well as the principle of operation, is the same as that explained in connection with FIGS. 11 and 12.

Figure 14:
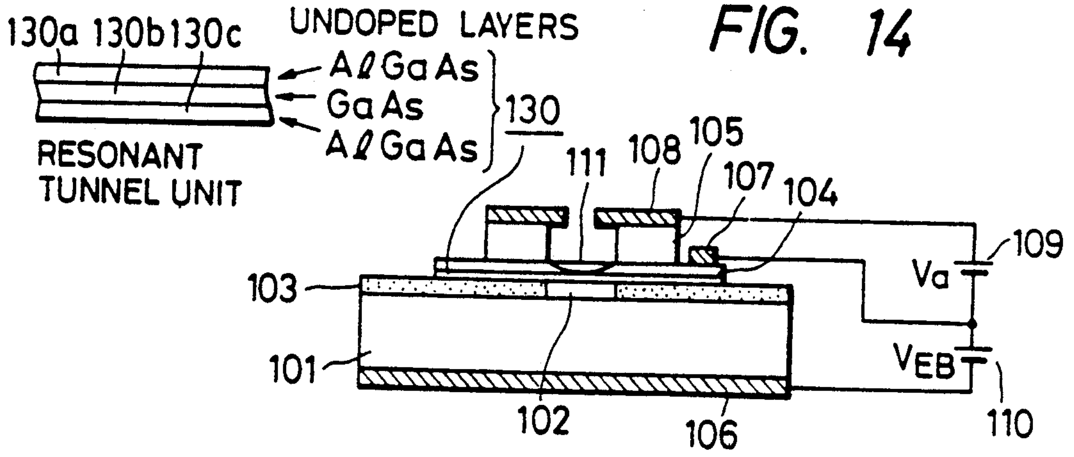
FIG. 14 is a sectional view of an eighth embodiment of the present invention.
Figure 15:
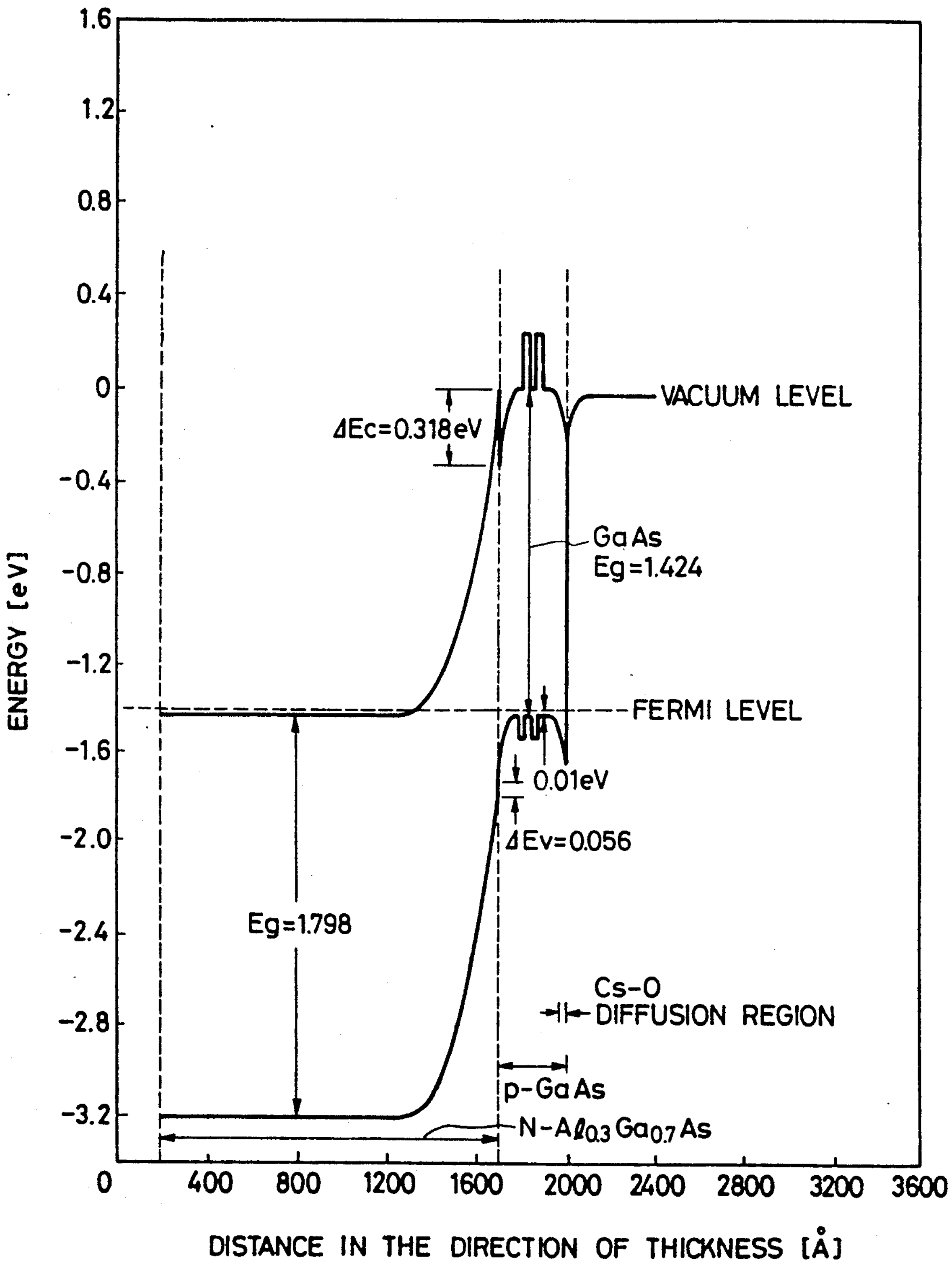
FIG. 15 is an energy band diagram showing electron energy level in the thermal equilibrium state of the eighth embodiment.
Figure 16:
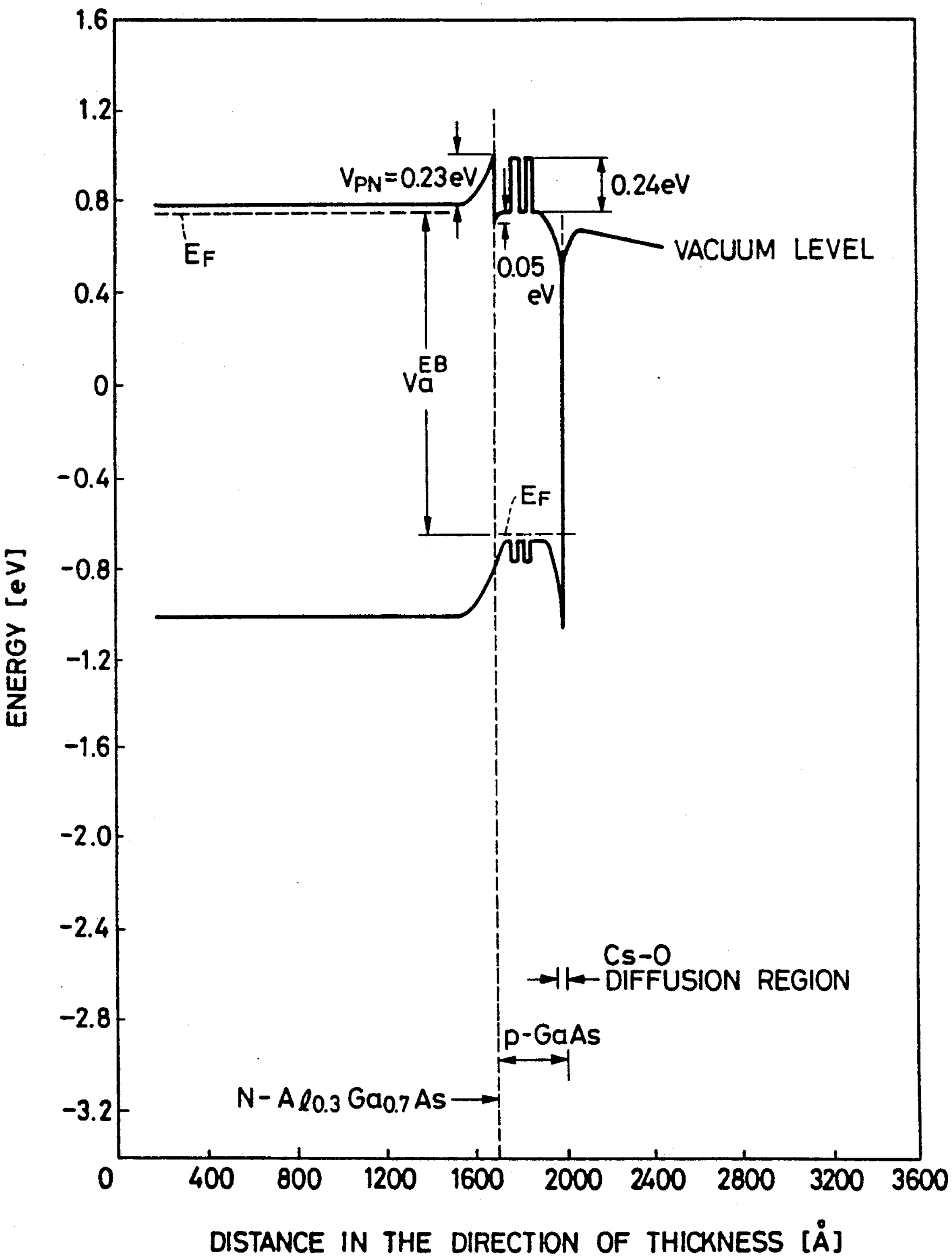
FIG. 16 is an energy band diagram showing electron energy level when a bias voltage is applied in the eighth embodiment.

FIG. 14 shows an eighth embodiment of the solid-state electron beam generator in accordance with the present invention. FIGS. 15 and 16 are energy band diagrams showing levels of energy of electron as obtained when the electron beam generator is in the thermally equilibrium state and when a bias voltage is applied, respectively.

The eighth embodiment shown in FIG. 14 is distinguished from the first embodiment shown in FIG. 10 in that the region composed of the p-type GaAs layer 104 is provided with a resonance tunnel section 130 composed of a non-doped $Al_{0.3}Ga_{0.7}As$ layer 130a, serving as a barrier layer, a non-doped $Al_sGa_{(1-s)}As$ layer 130b serving as a well layer, and a non-doped $Al_{0.3}Ga_{0.7}As$ layer 130c. Other portions are materially the same as those of the embodiment shown in FIG. 10. The principle and operation also are the same as those in the embodiment shown in FIGS. 10 to 12.

When the thicknesses of the barrier layer and the well layer in the resonance tunnel section 130 are 30 Å and 20 Å, respectively, the first resonance level appears at a point which is 0.11 eV above the conduction band in the layer 104. Therefore, as a forward voltage $V_{EB}$ is applied between the layers 102 and 104 as shown in FIG. 14 so as to make the quasi Fermi level of the layer 102 coincide with the resonance tunnel level, the hot electrons are made to pass through the layer 104 past the resonance tunnel.

When the amount of dopant of the emitter layer 102 is on the order of $1\times10^{18}$ cm$^{-3}$, the difference between the quasi Fermi level of the layer 102 and the energy level $E_C$ of the conduction band is given as follows.

$$\Delta E = E_F - E_C \simeq 0.01 \text{ (eV)}$$

This level difference coincides with the energy band width $\Delta E$ of the resonance tunnel level. In addition, since the p-type GaAs 104 has a high rate of dopant which is $1\times10^{19}$ cm$^{-3}$, the energy bands in the barrier layer and the well layer are flattened thus realizing a symmetrical double barrier structure. In consequence, the proportion of the electrons passing through the resonance tunnel 30 is increased.

In the described embodiment of the present invention, the energy band width of the hot electrons is limited by the energy band width $\Delta E$ of the resonance tunnel level, so that carriers of low energy levels cannot flow into the layer 104 and the collector layer. In consequence, the proportion of the carriers which fall to the level of the surface of the layer 104, i.e., the proportion of electrons of low energy levels, is decreased, so that deterioration of the device can be suppressed advantageously.

In the eighth embodiment, the hetero junction between the layers 102 and 104 has a steep gradient so as to form a spike therebetween. This spike, however, is not essential because hot electrons can be formed also in the double-barrier structure which forms the resonance tunnel. When the spike is eliminated, the composition of the boundary between the layers 102 and 104 is progressively changed so as to provide a graded layer.

Figure 17:
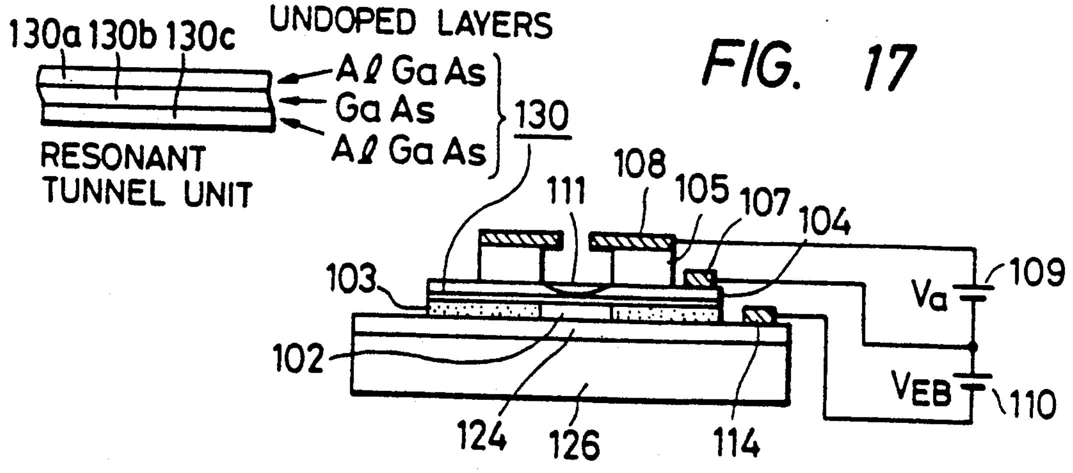
FIG. 17 is a sectional view of a ninth embodiment of the present invention.

FIG. 17 shows a ninth embodiment of the present invention. This embodiment is basically the same as the eighth embodiment shown in FIG. 14 except that a semi-insulating GaAs substrate 126 is used as the substrate. In this embodiment, therefore, the electrode 114 for the layer 102 is provided on the n-type GaAs layer 124. Other structural features, as well as operation, are materially the same as those in the eighth embodiment so that the detailed description thereof is omitted.

Figure 18:
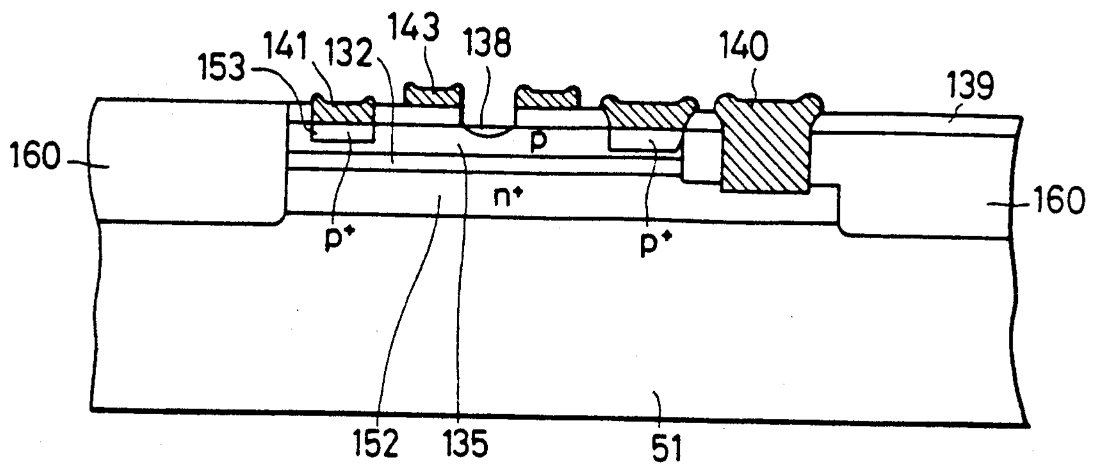
FIG. 18 is a sectional view of a tenth embodiment of the present invention.

FIG. 18 is a sectional view of a tenth embodiment of the present invention. Unlike the preceding embodiments, the tenth embodiment proposes a planar type device. This tenth embodiment is constituted by the following portions an electrode 140 for N-type AlGaAs layer 132; $n^+$-type GaAs layer 152 (+ means high doping density), an N-type $Al_xGa_{(1-x)}As$ layer ($0<x\leqq1$) 132 having a wide band gap, a p-type GaAs layer 135; a $p^+$ layer 153 doped with Be, and a surface layer 138 doped with an agent (Cs-O) for reducing the work function. A numeral 160 denotes a B-injected layer for isolating adjacent regions.

It will be seen that this planar structure is suitable for production of multiple-type device in which a multiplicity of devices are arranged on a common plan.

Although the described sixth to tenth embodiments make use of GaAs which is one of semiconductors of compounds of elements belonging to groups III to V, such a material is not exclusive and various other materials such as InGaAsP/InP type materials and SiC/Si type materials can be used equally well.

Examples of construction of the solid-state electron beam generator of the invention which incorporate such materials are shown in Table 2 below.

TABLE 2

| | InGaAsP/InP type | SiC/Si type |
|---|---|---|
| substrate | InP | Si or SiC |
| Growth method | liquid phase growth | Gaseous or liquid phase growth |
| N region | $N^+$ type InP<br>N type InP | $N^+$ type SiC<br>N type SiC |
| p region | p-type InGaAsP | p-type Si |
| n-type dopant | Te ($\simeq 2\times10^{19}$ cm$^{-3}$) | N ($\simeq 10^{20}$ cm$^{-3}$) |
| p-type dopant | Cd or Mg ($\simeq 5\times10^{18}$ cm$^{-3}$) | Al ($10^{18}$ cm$^{-3}$) |
| n-type electrode | Au, Au—Ti, Pt, Sn | Au, Au—Ta (99:1) |
| p-type electrode | For InP<br>Au, Ni, Cu<br>For InGaAsP<br>Au, Ag | Al—Si (89:11) |

As will be understood from the foregoing description, the first to fifth embodiments of the present invention offers the following advantages.

(1) Since the emitter and the base have different band gap widths (Npn structure), the rate of injection of carrier is remarkably increased as compared with the case where the band gap width is equal. In addition, the carriers injected into the base are accelerated to increase the level of kinetic energy. In consequence, the efficiency of emission of electrons is remarkably increased.

(2) The emitter region and the base region can be formed as epitaxial films having thicknesses on the order of several tens of angstroms (Å), by making an efficient use of an MBE device or an MOCVD device. Thus, the layered structure of the device in accordance with the above has high quality and uniformity. Since the thicknesses of layers can be reduced, it is possible to decrease the driving voltage.

(3) Fabrication is facilitated thanks to simple laminar structure.

(4) Since the electron beam generator is produced from semiconductor materials, it becomes easy to obtain a device having a plurality of electron beam generators on a common substrate or to couple the electron beam generator to other device or devices. This obviously contributes to an enlargement in the scale of integration of semiconductor devices.

Furthermore, the electrons are changed into hot electrons by virtue of the spike caused by the hetero junction between the emitter region and the base region or a resonance tunnel in the base region, so that the efficiency of emission of electrons is further increased.

Figure 19:
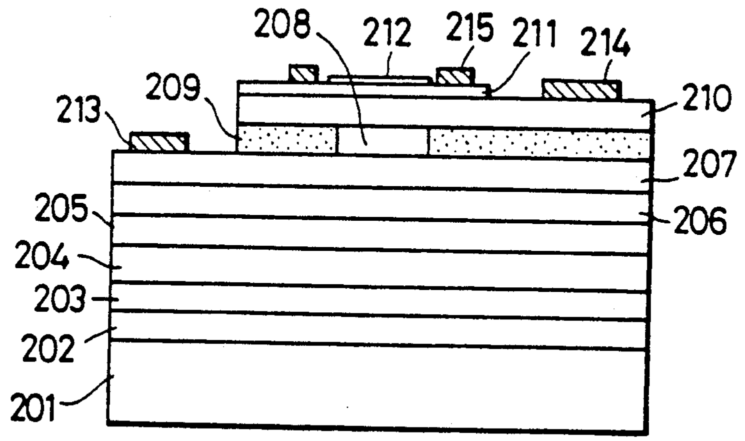
FIG. 19 is a sectional view of an eleventh embodiment of the present invention.

FIG. 19 is a sectional view of an eleventh embodiment of the solid-state electron beam generator of the present invention.

In this embodiment, an AlP layer 202 and an AlGaP layer 203 are made to grow on a Si substrate 201 by MOCVD (Metalorganic Chemical Vapor Deposition) method and then a super-grid layer 204 of GaP and GaAsP and a super-grid layer 205 of GaAsP and GaAs are formed. Then, a GaAs layer 206 is made to grow on these super-grid layers. Subsequently, an $n^+$-type GaAs layer 207 and an N-type $Al_xGa_{(1-x)}As$ layer 208 ($0<x\leqq 1$) are made to grow. Oxygen ions are injected by an ion injector into the $Al_xGa_{(1-x)}As$ layer 208 so as to form inert layer 209 in the regions of this layer 208 other than the electron beam generating region.

A p-type GaAs layer 210 and an n-type GaAs layer 211 are formed on the N-type $Al_xGa_{(1-x)}As$ layer 208. A layer 212 of material for reducing work function, e.g., cesium oxide (Cs-O) is formed by deposition or diffusion on the surface of the n-type GaAs layer 211.

The construction will be explained in more detail hereinunder.

As mentioned above, this embodiment incorporates an N-type $Al_xGa_{(1-x)}As$ layer 208 serving as a emitter. The symbol x represents the crystal mixing ratio which is selected to meet the condition of $0<x\leqq 1$. The capital-letter symbol N represents an n-type region having a wide band gap. A numeral 209 represents an inert layer formed by injecting oxygen ions into the N-type $Al_xGa_{(1-x)}As$ layer 208. The embodiment further has a p-type GaAs layer 210 which serves as a base. The small-letter symbol "p" is used to mean a p-type region with narrow band gap. In this embodiment, it is possible to add Al such that the p-type GaAs layer is substituted by a P-type $Al_zGa_{(1-z)}As$ layer ($0\leqq z<x$), thereby allowing a control of the band gap of the layer 206. The embodiment further has an n-type GaAs layer 211 serving as a collector. The small-letter "n" is used here to mean an n-type region of a narrow band gap. The n-type GaAs layer may be substituted by an n-type $Al_tGa_{(1-t)}As$ layer ($0\leqq t\leqq 1$).

Thus, this embodiment of the solid-state electron beam generator in accordance with the present invention has layered structure similar to that of a hetero-bipolar transistor.

A reference numeral 212 designates a cesium oxide (Cs-O) layer formed by deposition or diffusion on the surface of the collector layer 210. This Cs-O layer serves as an electron-emission surface. The Cs-O layer 10 may be substituted by another type of layer formed by deposition or diffusion from a material containing an alkali metal such as Cs and at least one element selected from the group consisting of Cu, Ag, Au, Sb, Bi, Se, As, P, Te, Si and 0.

The solid-state electron beam generator further has an $SiO_2$ insulating layer, an emitter electrode 213, a base electrode 214, and a collector electrode 215.

Electrodes for n- or N-type semiconductor may be formed from a composition such as Au-Ge or Au-Ge-Ni, while the electrode for the p-type semiconductor may be formed from Au-Sn, Ag-Zn, Au-Be or Au-Zn. In the illustrated embodiment, the electrode of the p-type GaAs is formed directly on the surface of the p-type GaAs layer. This, however, is not exclusive and the electrode may be formed after doping the surface of this GaAs layer with Be ions so as to form a $p^+$-type region or may be formed on a $p^+$-type GaAs layer grown on the surface of the p-type GaAs layer surface.

Thus, in this eleventh embodiment, an Npn-type epitaxial film of GaAs-$Al_xGa_{(1-x)}As$ system has grown on the Si substrate.

The operation of this embodiment will be described with reference to FIGS. 20 and 21 which are energy band diagrams showing energy level of electrons as observed when the electron beam generator is in a thermally equilibrium state and when a bias voltage is being applied, respectively.

As explained before, the emitter layer 208 is formed from, for example, $Al_xGa_{(1-x)}As$ layer which has a wide band gap so as to ensure high efficiency of injection of current into the base layer 210. In the diagrams shown in FIGS. 2 and 3, the crystal mixing ratio x of Al is selected to be $x=0.3$ for attaining a good hetero junction and considering also influences of the L-band and X-band. This value of the crystal mixing ratio, however, is only illustrative.

The doping rate of the emitter layer 208 is as high as $5\times10^{17}$ to $1\times10^{19}$ $cm^{-3}$ so as to allow a large number of carriers to be injected into the base region. It is, however, to be noted that the regions other than the electron beam generating region have been rendered inert by, for example, oxygen ion implantation. This high level of doping causes the state of the layer to be changed into a degenerating state and the Fermi level is set above the conductive band.

Figure 20:
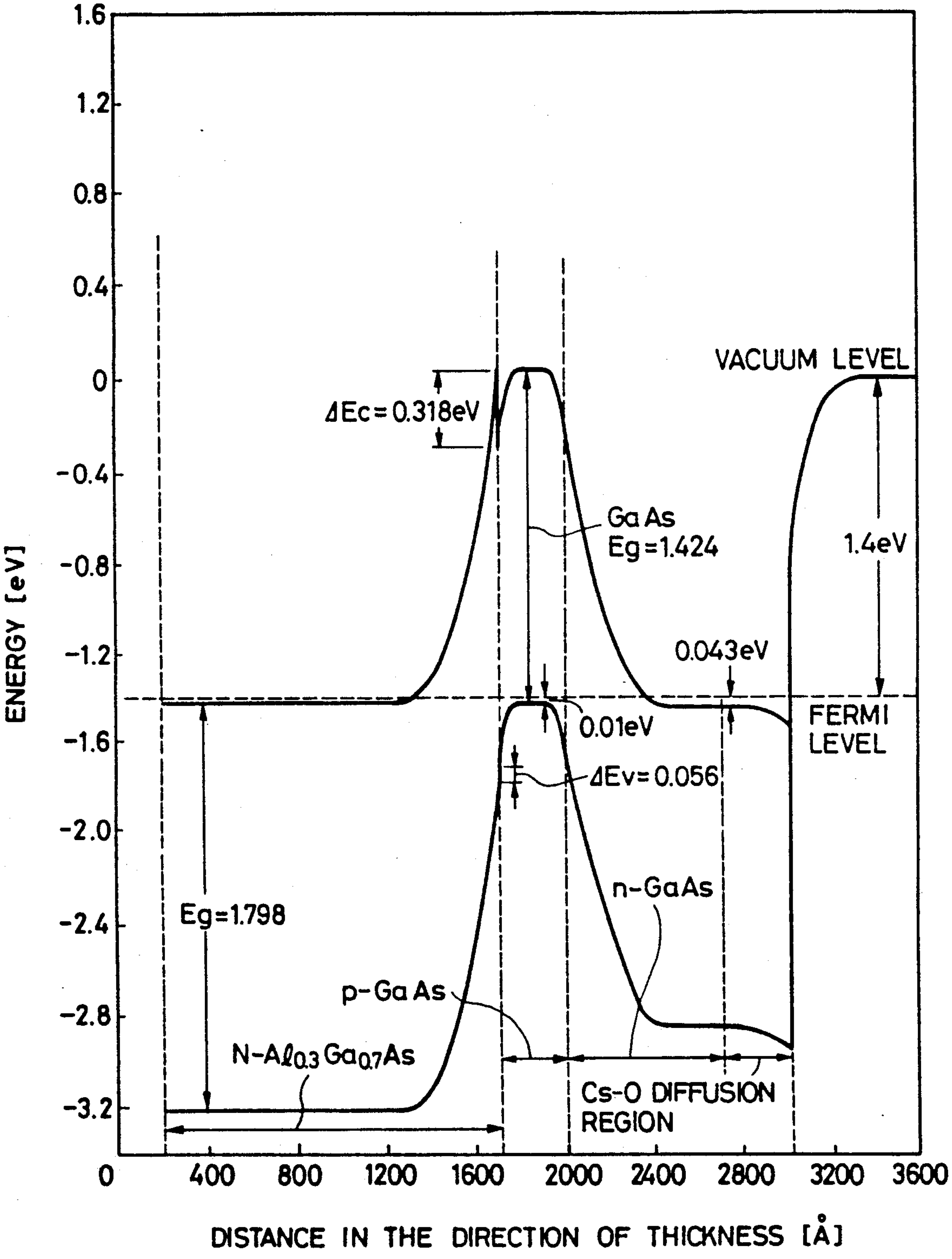
FIG. 20 is an energy band diagram showing electron energy level in the thermal equilibrium state of the eleventh embodiment.

Although the thickness of the emitter layer 208 is selected to be 1500 Å in FIG. 20, the thickness of this layer may be varied as desired insofar as it ensures a good ohmic contact between the emitter layer and the electrode 213 in the region of the $n^+$-type GaAs layer 207, as well as large rate of injection of carriers into the base layer 210.

Referring now to the base layer 210, this layer 210 is formed from a p-type GaAs layer having a narrow band gap, in order to ensure a high efficiency of injection of current into the base layer 210. The amount of dopant in this p-type GaAs layer is selected to be on the order of $5\times10^{18}$ $cm^{-3}$ so as to reduce resistance, and the thickness of the base layer 6 is selected to be about 300 Å so as to reduce scattering in this layer.

Since the emitter layer 208 and the base layer 210 have different band gap widths, a spike is formed at the boundary of these layers as shown in FIG. 20. When $Al_{0.3}Ga_{0.7}As$ is used as the material of the emitter layer while GaAs is used as the material of the base layer, the height $\Delta E_C$ of the spike is about 0.318 eV.

The work function at the collector surface is as small as 1.4 eV because the Cs-O layer is diffused in the surface of the collector layer 211. In order to realize an ohmic contact of a low resistance between the collector layer 211 and the collector electrode 218, a dopant amount which is as large as $1\times10^{18}$ $cm^{-3}$ is applied to the collector layer 8. Although in this embodiment the collector layer 211 has a thickness of 1000 Å, this thickness value is only illustrative. More specifically, the collector layer 211 has a smaller thickness provided that a good ohmic contact is attained between the collector electrode 218 and the collector layer 211. A high quality and uniformity of the collector layer 211 are obtainable by the use of a molecular beam epitaxy (MBE) device or a metalorganic chemical vapor deposition (MOCVD) device.

Figure 21:
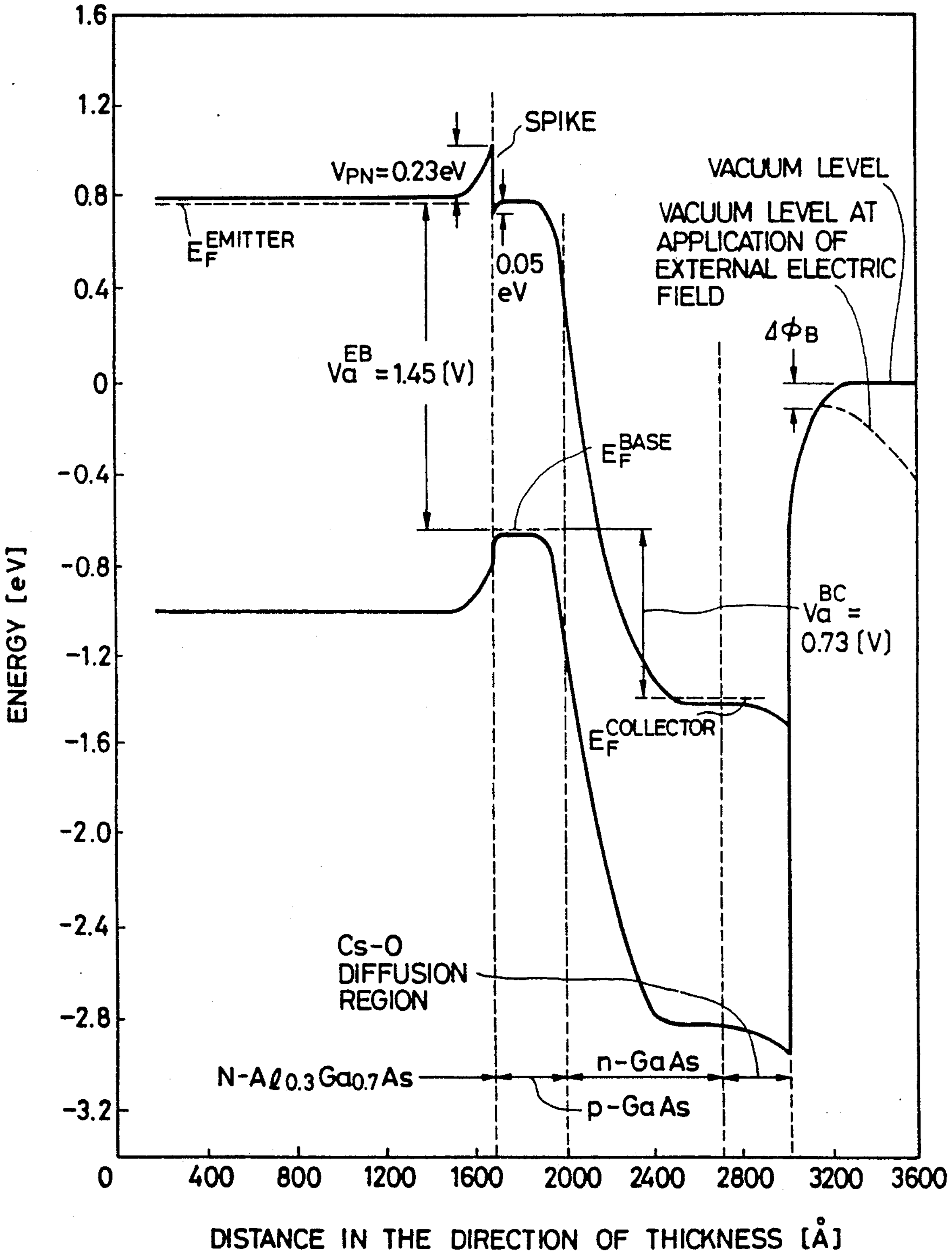
FIG. 21 is an energy band diagram showing electron energy level when a bias voltage is applied in the eleventh embodiment.

FIG. 21 shows the state of the electron beam generator under application of a bias voltage. More specifically, FIG. 21 shows the energy band as obtained when a forward bias voltage is applied between the emitter and the base while a backward bias voltage $V_{BC}$ is applied between the base and the collector in the device shown in FIG. 19 is in thermally equilibrium state. When a voltage of 1.45 V is applied as the voltage $V_{EB}$ between the emitter and the base, the quasi Fermi level $E_F$ in the emitter layer 208 approaches the conduction band of the base layer 210.

Due to the presence of the spike as shown in FIG. 21, the carriers injected into the base layer 210 are changed into hot electrons due to thermal jumping or tunnel effect. The thus generated hot electrons are accelerated by the bias voltage $V_{BC}$ applied between the base and the collector, so as to have high level of kinetic energy.

The level of the energy possessed by the electrons passing through the base layer 210 is about 0.7 eV higher than the vacuum level. Therefore, a large proportion of electrons is emitted into vacuum through a considerable part of energy being lost due to scattering in the collector layer 211. It is also to be noted that, in the described embodiment, the regions of the collector layer surface with diffusion of Cs-O other than the electron emitting region are provided with an $SiO_2$ insulating layer and an external acceleration electrode both of which are not shown. Therefore, the vacuum level is lowered by $\Delta\phi_B$ as shown by broken line in FIG. 21, as a result of application of an external electric field, whereby the electron emission efficiency is further increased.

Figure 22:
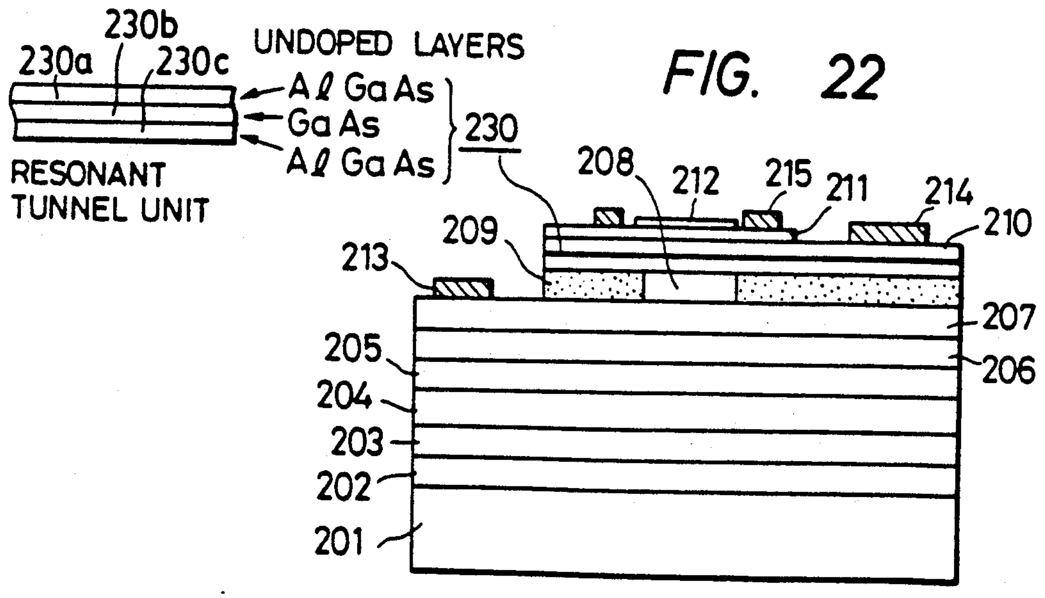
FIG. 22 is a sectional view of a twelfth embodiment of the present invention.
Figure 23:
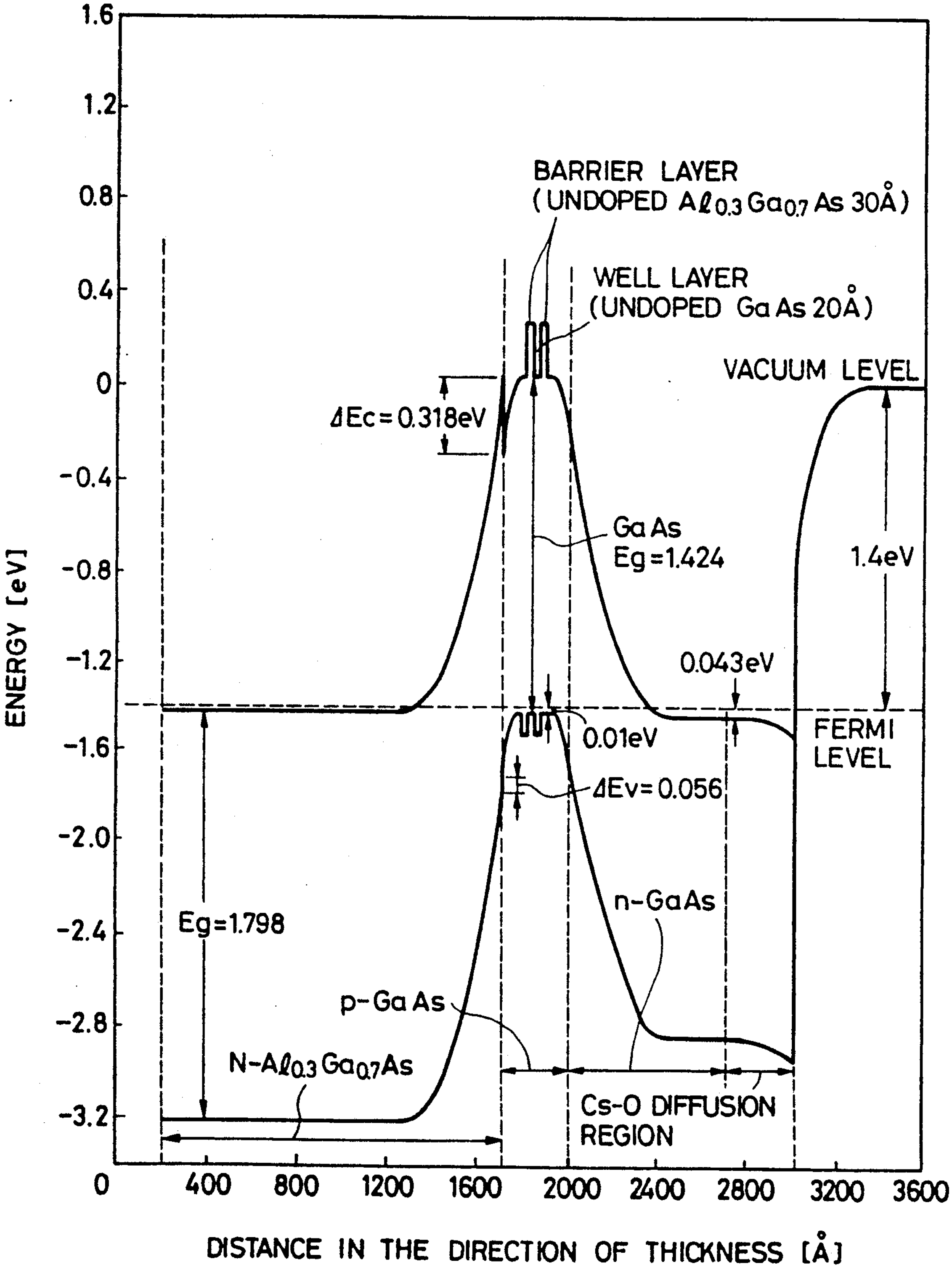
FIG. 23 is an energy band diagram showing electron energy level in the thermal equilibrium state of the twelfth embodiment.
Figure 24:
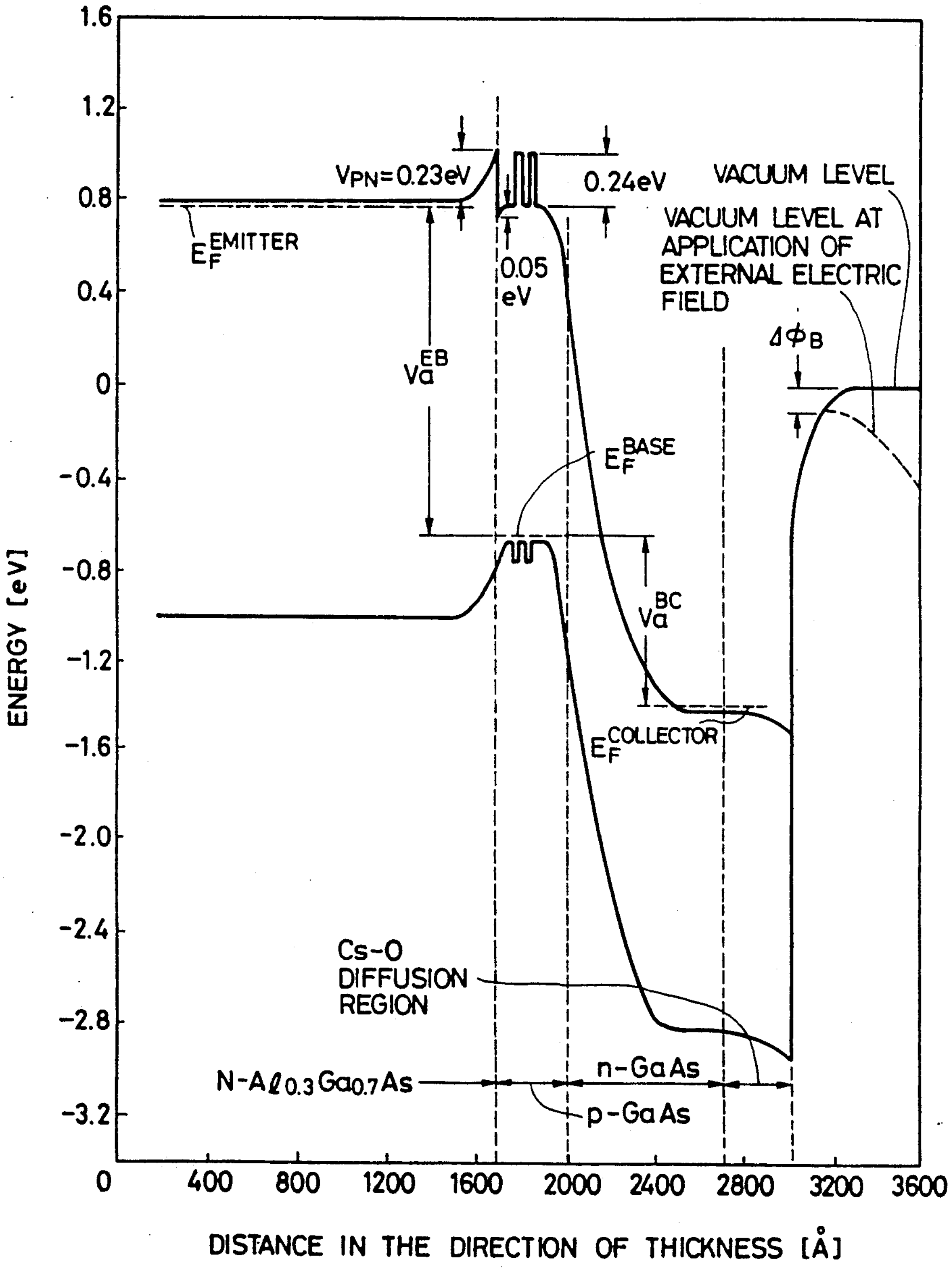
FIG. 24 is an energy band diagram showing electron energy level when a bias voltage is applied in the twelfth embodiment.

FIG. 22 shows a twelfth embodiment of the solid-state electron beam generator in accordance with the present invention. FIGS. 23 and 24 are energy band diagrams showing levels of energy of electron as obtained when the electron beam generator is in the thermally equilibrium state and when a bias voltage is applied, respectively.

The twelfth embodiment shown in FIG. 22 is distinguished from the first embodiment shown in FIG. 19 in that the base region composed of the p-type GaAs layer 210 is provided with a resonance tunnel section 230 composed of a non-doped $Al_{0.3}Ga_{0.7}As$ layer 230a, serving as a barrier layer, a non-doped $Al_sGa_{(1-s)}As$ layer 230b serving as a well layer, and a non-doped $Al_{0.3}Ga_{0.7}As$ layer 230c such as to meet the condition of $0 \leqq s < y \leqq 1$, thereby forming a resonance tunnel level. Other portions are materially the same as those of the first embodiment. The principle and operation also are the same as those in the eleventh embodiment shown in FIGS. 19 to 21 so that description of principle and operation is omitted.

When the thicknesses of the barrier layer and the well layer in the resonance tunnel section 230 are 30 Å and 20 Å, respectively, the first resonance level appears at a point which is 0.11 eV above the conduction band in the base region. Therefore, as a forward voltage $V_{EB}$ is applied between the emitter and the base as shown in FIG. 7 so as to make the quasi Fermi level of the emitter region coincide with the resonance tunnel level, the hot electrons are made to pass through the base layer 210 past the resonance tunnel.

When the amount of dopant of the emitter layer 208 is on the order of $1 \times 10^{18}$ cm$^{-3}$, the difference between the quasi Fermi level of the emitter layer and the energy level $E_C$ of the conduction band is given as follows.

$$\Delta E = E_F - E_C \simeq 0.01 \text{ (eV)}$$

This level difference coincides with the energy band width ΔE of the resonance tunnel level. In addition, since the p-type GaAs layer 210 constituting the base has a high rate of dope which is $1 \times 10^{19}$ cm$^{-3}$, the energy bands in the barrier layer and the well layer are flattened thus realizing a symmetrical double barrier structure. In consequence, the proportion of the electrons passing through the resonance tunnel 230 is increased.

In the described embodiment of the present invention, energy band width of the hot electrons is limited by the energy band width ΔE of the resonance tunnel level, so that carriers of low energy levels cannot flow into the base layer and the collector layer. In consequence, the proportion of the carriers which fall to the level of the collector region surface, i.e., the proportion of electrons of low energy levels, is decreased, so that deterioration of the device can be suppressed advantageously.

In the twelfth embodiment explained in connection with FIGS. 22 and 24, the hetero junction between the emitter region and the base region has a steep gradient so as to form a spike therebetween. This spike, however, is not essential because hot electrons can be formed also in the double-barrier structure which forms the resonance tunnel. When the spike is eliminated, the composition of the boundary between the emitter region and the base region is progressively changed so as to provide a graded layer.

The described eleventh and twelfth embodiments make use of a buffer layer constituted by super-grid layer. This, however, is only illustrative and the buffer layer may been extremely thin buffer layer grown on the Si substrate at a low temperature (GaAs/GaAs buffer layer (<200 Å)/Si system)/. It is also to be understood that, although the described embodiments utilize GaAs which is one of semiconductors of compounds of elements belonging to groups III to V, such a material is not exclusive and various other materials such as SiC/Si type materials can be used equally well.

An examples of construction of the solid-state electron beam generator of the invention which incorporate such material are shown in Table 3 below.

TABLE 3

| | SiC/Si type |
|---|---|
| substrate | Si or SiC |
| Growth method | Gaseous or liquid phase growth |
| Emitter | $N^+$ type SiC<br>N type SiC |
| Base | p-type Si |
| Collector | n-type Si |
| n-type dopant | N ($\simeq 10^{20}$ cm$^{-3}$) |
| p-type dopant | Al ($\simeq 10^{18}$ cm$^{-3}$) |
| n-type electrode | Au, Au—Ta (99:1) |
| p-type electrode | Al—Si (89:11) |

As will be understood from the foregoing description, the first to fifteenth embodiments of the present invention offers the following advantages.

(1) Since the emitter and the base have different band gap widths, the rate of injection of carrier is remarkably increased as compared with the case where the band gap width is equal. In addition, the carriers injected into the base is accelerated by the electric field so as to have greater kinetic energy. In consequence, the efficiency of emission of electrons is remarkably increased.

(2) The emitter region and the base region can be formed as epitaxial films having thicknesses on the order of several tens of angstroms (Å), by making an efficient use of an MBE device or an MOCVD device. Thus, the layered structure of the device in accordance with this has high quality and uniformity. Since the thicknesses of layers can be reduced, it is possible to decrease the driving voltage.

(3) Problems concerning heat generation is not so severe because the Si substrate exhibits only small heat resistance.

(4) Since the electron beam generator is produced by using an Si substrate, it becomes easy to obtain a device having a plurality of electron beam generators on a common substrate or to couple the electron beam generator to another device or other devices. This obviously contributes to an enlargement in the scale of integration of semiconductor devices.

Furthermore, the electrons are changed into hot electrons by virtue of the spike caused by the hetero junction between the emitter region and the base region or a resonance tunnel in the base region, so that the efficiency of emission of electrons is further increased.

Figure 25:
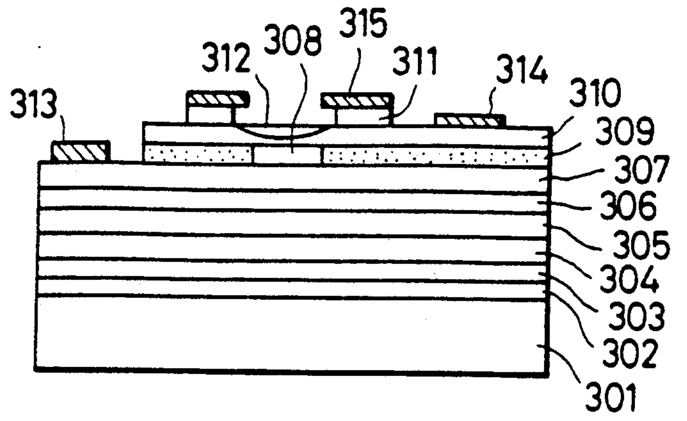
FIG. 25 is a sectional view of a thirteenth embodiment of the present invention.

FIG. 25 is a sectional view of a thirteenth embodiment of the solid-state electron beam generator of the present invention.

In this embodiment, an AlP layer 302 and an AlGaP layer 303 are made to grow on a Si substrate 301 by MOCVD (Metalorganic Chemical Vapor Deposition) method and then a super-grid layer 304 of GaP and GaAsP and a super-grid layer 305 of GaAsP and GaAs are formed. Then, a GaAs layer 306 is made to grow on these super-grid layers. Subsequently, an $n^+$-type GaAs layer 307 and an N-type $Al_xGa_{(1-x)}As$ layer 308 ($0<x \leqq 1$) are made to grow. Oxygen ions are injected into the $Al_xGa_{(1-x)}As$ layer 308 so as to form inert layer in the regions of this layer 308 other than the electron beam generating region.

A p-type GaAs layer 310 is formed on the N-type $Al_xGa_{(1-x)}As$ layer 308. A layer 312 of material for reducing work function is formed by deposition or diffusion on the surface of the o-type GaAs layer 310.

The construction will be explained in more detail hereinunder.

As mentioned above, this embodiment incorporates an N-type $Al_xGa_{(1-x)}As$ layer 308. The symbol x represents the crystal mixing ratio which is selected to meet the condition of $0<x \leqq 1$. The capital-letter symbol N represents an n-type region having a wide band gap. A numeral 309 represents an inert layer formed by injecting oxygen ions into the N-type $Al_xGa_{(1-x)}As$ layer 308. The embodiment further has the p-type GaAs layer 310. The small-letter symbol "p" is used to mean a p-type region with narrow band gap. In this embodiment, it is possible to add Al such that the p-type GaAs layer is substituted by a P-type $Al_zGa_{(1-z)}As$ layer ($0 \leqq z<x$), thereby allowing a control of the band gap.

A reference numeral 312 designates a cesium oxide (Cs-O) layer formed by deposition or diffusion on the surface of the collector layer 310. This Cs-O layer serves as an electron-emission surface. The Cs-O layer 10 may be substituted by another type of layer formed by deposition or diffusion from a material containing an alkali metal such as Cs and at least one element selected from the group consisting of Cu, Ag, Au, Sb, Bi, Se, As, P, Te, Si and O.

Electrodes for n- or N-type semiconductor may be formed from a composition such as Au-Ge or Au-Ge-Ni, while the electrode for the p-type semiconductor may be formed from Au-Sn, Ag-Zn, Au-Be or Au-Zn. In the illustrated embodiment, the electrode of the p-type GaAs is formed directly on the surface of the p-type GaAs layer. This, however, is not exclusive and the electrode may be formed after doping the surface of this GaAs layer with Be ions so as to form a $p^+$-type region or may be formed on a $p^+$-type GaAs layer grown on the surface of the p-type GaAs layer surface.

Thus, in this thirteenth embodiment, an Npn-type epitaxial film of GaAs-$Al_xGa_{(1-x)}As$ system has grown on the Si substrate.

The operation of this embodiment will be described with reference to FIGS. 26 and 27 which are energy band diagrams showing energy level of electrons as observed when the electron beam generator is in a thermally equilibrium state and when a bias voltage is being applied, respectively.

As explained before, the layer 308 is formed from, for example, $Al_xGa_{(1-x)}As$ layer which has a wide band gap so as to ensure high efficiency of injection of current into the base layer 210. In the diagrams shown in FIGS. 2 and 3, the crystal mixing ratio of x of Al is selected to be $x=0.3$ for attaining a good hereto junction and considering also influences of the L-band and X-band. This value of the crystal mixing ratio, however, is only illustrative.

The doping rate of the layer 308 is as high as $5\times10^{17}$ to $1\times10^{19}\ cm^{-3}$ so as to allow a large number of carriers to be injected into the base region. It is, however, to be noted that the regions other than the electron beam generating region have been rendered inert by, for example, oxygen ion implantation. This high level of doping causes the state of the layer to be changed into a degenerating state and the Fermi level is set above the conductive band.

Although the layer 308 is formed by an MBE device or an MOCVD device such that its thickness is 1500 Å in FIG. 20, the thickness of this layer may be varied as desired insofar as it ensures a large rate of injection of carriers into the base layer 210.

Referring now to the layer 310, this layer 310 is formed from a p-type GaAs layer having a narrow band gap, in order to ensure a high efficiency of injection of current into the layer 310. The amount of dope in this p-type GaAs layer is selected to be on the order of $5\times10^{18}\ cm^{-3}$ so as to reduce resistance, and the thickness of the layer 310 is selected to be about 300 Å so as to reduce scattering in this layer.

Since the layer 308 and the layer 310 have different band gap widths, a spike is formed at the boundary of these layers as shown in FIG. 26. When $Al_{0.3}Ga_{0.7}As$ is used as the material of the layer 308 while p-type GaAs is used as the material of the layer 310, the height $\Delta E_c$ of the spike is about 0.318 eV.

The work function at the surface of the layer 310 is as small as 1.4 eV because the Cs-O layer is diffused in the surface of the layer 310.

Figure 27:
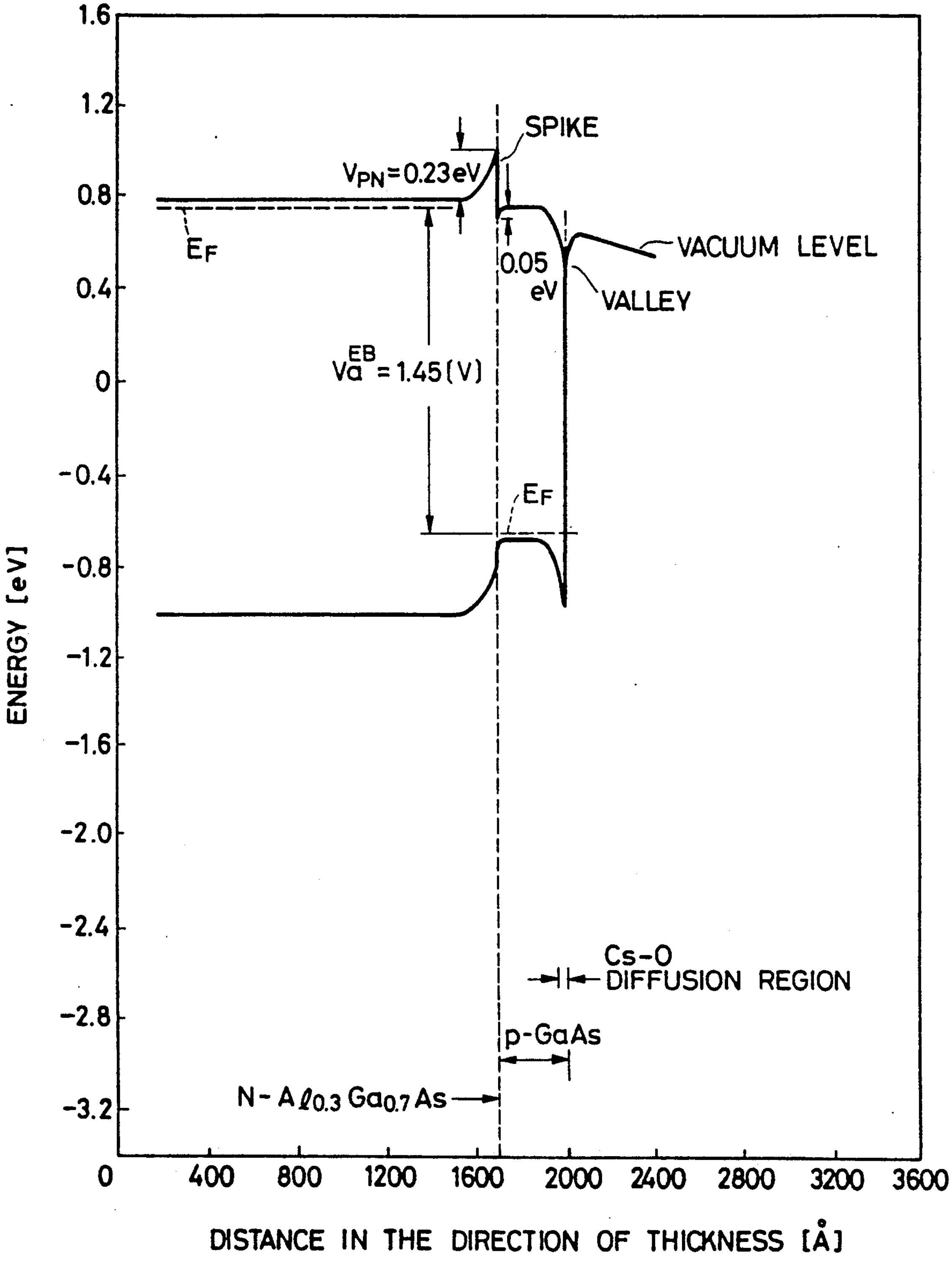
FIG. 27 is an energy band diagram showing electron energy level when a bias voltage is applied in the thirteenth embodiment.

FIG. 27 shows the state of the electron beam generator under application of a bias voltage. More specifically, FIG. 27 shows the energy band as obtained when a forward bias voltage $V_{EB}$ is applied between the layer 308 and the layer 310 while a voltage $V_a$ is applied between the layer 310 and an external acceleration electrode 315 (acceleration electrode constitutes plus side) when the device shown in FIG. 25 is in thermally equilibrium state. When a voltage of 1.45 V is applied as the voltage $V_{EB}$ between the layers 308 and 310, the quasi Fermi level $E_F$ in the layer 308 approaches the conduction band of the base layer 310.

Due to the presence of the spike as shown in FIG. 27, the carriers injected into the base layer 310 are changed into hot electrons due to thermal jumping or tunnel effect.

The work function of the p-type GaAs layer 310 with diffused CsO is 1.4 eV, while the electronic affinity of the p-type GaAs layer is 4.07 eV. Therefore, the band of the p-type GaAs is deflected downward at a region in the vicinity of the surface. However, the carriers injected into the layer 310 have been changed into hot electrons so that they are emitted into vacuum without dropping into the valley near the surface, as shown in FIG. 27. This is because the vacuum level is 1.4 eV which is lower than the band gap (1.42 eV) of the p-type GaAs. The vacuum level is deflected downward as shown in FIG. 27, because of application of the voltage Va between the external acceleration electrode 315 and the layer 310, so that an electric field is formed which acts to accelerate the emitted electrons.

Figure 28:
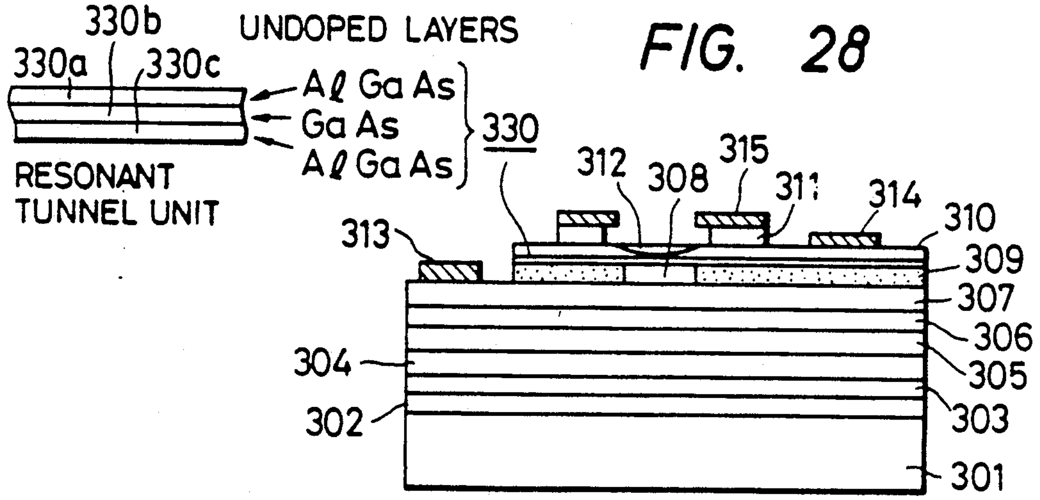
FIG. 28 is a sectional view of a fourteenth embodiment of the present invention.
Figure 29:
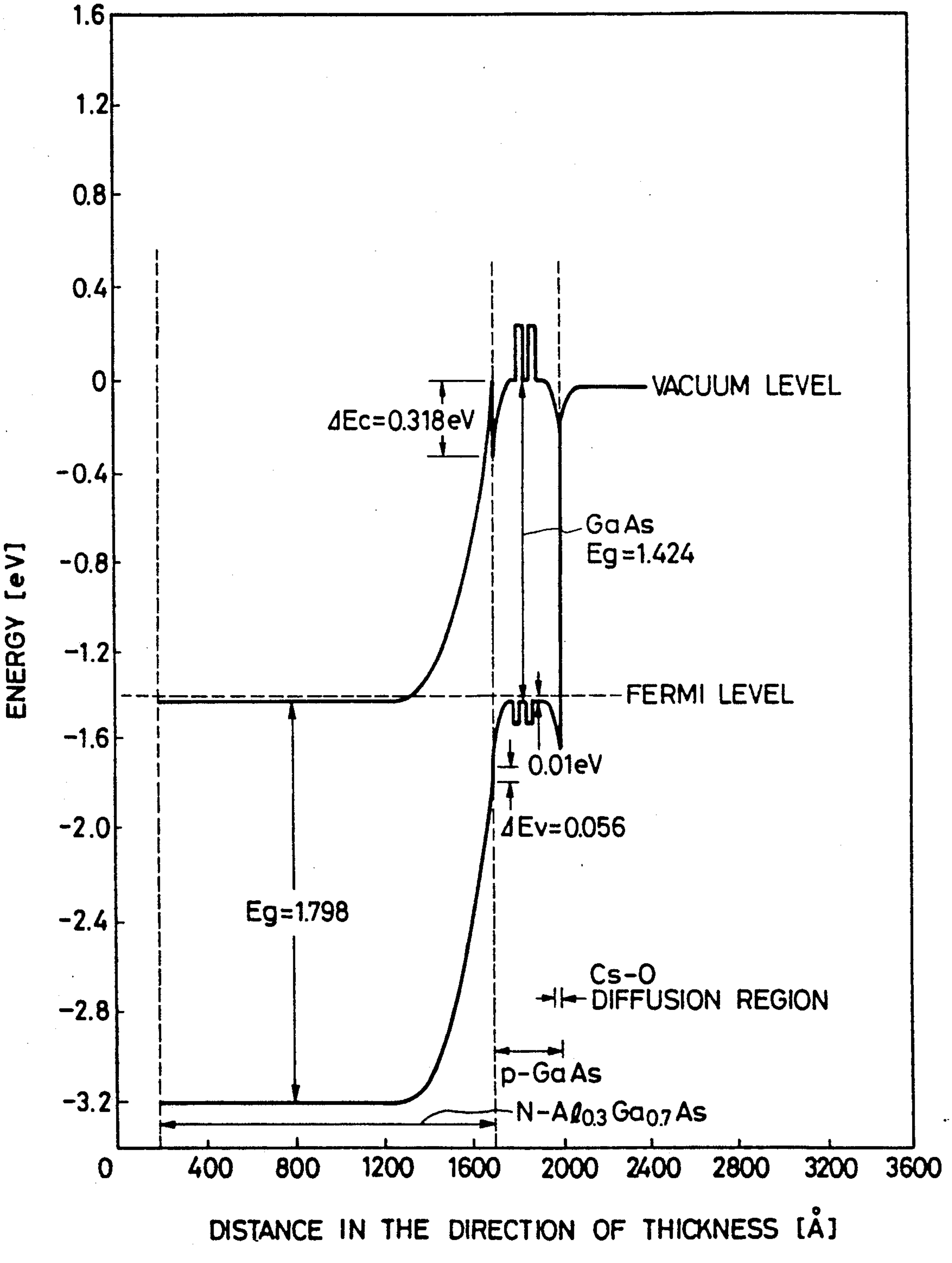
FIG. 29 is an energy band diagram showing electron energy level in the thermal equilibrium state of the fourteenth embodiment.
Figure 30:
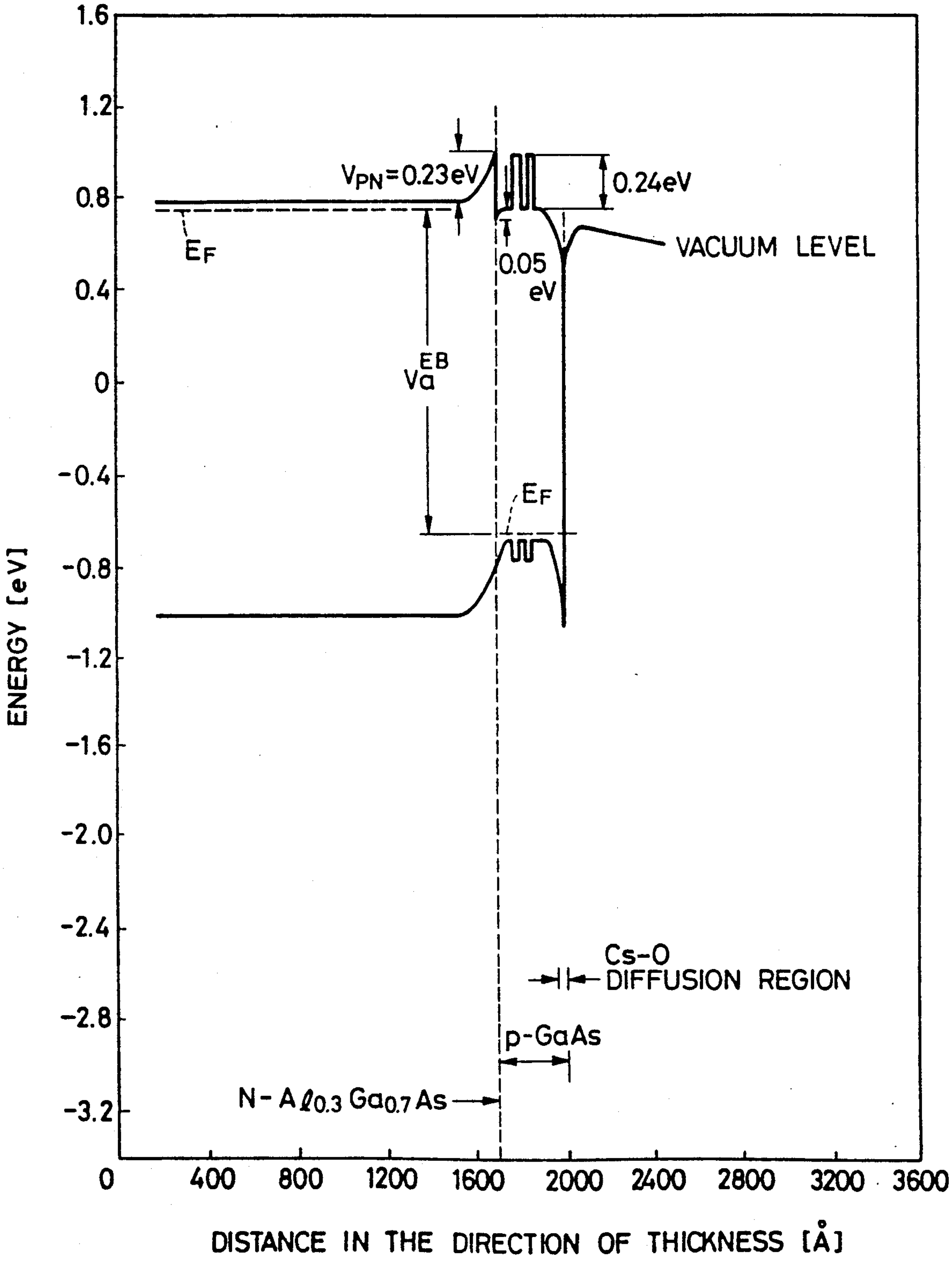
FIG. 30 is an energy band diagram showing electron energy level when a bias voltage is applied in the fourteenth embodiment.

FIG. 28 shows a fourteenth embodiment of the solid-state electron beam generator in accordance with the present invention. FIGS. 29 and 30 are energy band diagrams showing levels of energy of electron as obtained when the electron beam generator is in the thermally equilibrium state and when a bias voltage is applied, respectively.

The fourteenth embodiment shown in FIG. 28 is distinguished from the thirteenth embodiment shown in FIG. 25 in that the region composed of the p-type GaAs layer 310 is provided with a resonance tunnel section 310 composed of a non-doped $Al_{0.3}Ga_{0.7}As$ layer 310a, serving as a barrier layer, a non-doped $Al_sGa_{(1-s)}As$ layer 310b serving as a well layer, and a non-doped $Al_{0.3}Ga_{0.7}As$ layer 310c. Other portions are materially the same as those of the embodiment shown in FIG. 25. The principle and operation also are the same as those in the embodiment shown in FIGS. 25 to 27 so that description of principle and operation is omitted.

When the thicknesses of the barrier layer 330a and the well layer 330b in the resonance tunnel section 330 are 30 Å and 20 Å, respectively, the first resonance level appears at a point which is 0.11 eV above the conduction band in the layer 310. Therefore, as a forward voltage $V_{EB}$ is applied between the layers 308 and 310 as shown in FIG. 30 so as to make the quasi Fermi level of the layer 308 coincide with the resonance tunnel level, the hot electrons are made to pass through the layer 310 past the resonance tunnel.

When the amount of dopant of the emitter layer 308 is on the order of $1\times10^{18}\ cm^{-3}$, the difference between the quasi Fermi level of the layer 308 and the energy level $E_C$ of the conduction band is given as follows.

$$\Delta E = E_F - E_C \simeq 0.01\ [EV]$$

This level difference coincides with the energy band width ΔE of the resonance tunnel level. In addition, since the p-type GaAs 310 has a high rate of dopant which is $1\times10^{19}\ cm^{-3}$, the energy bands in the barrier layer and the well layer are flattened thus realizing a symmetrical double barrier structure. In consequence, the proportion of the electrons passing through the resonance tunnel 330 is increased.

In the described embodiment of the present invention, energy band width of the hot electrons is limited by the energy band width ΔE of the resonance tunnel level, so that carriers of low energy levels cannot flow into the layer 104 and the collector layer. In consequence, the proportion of the carriers which fall to the level of the surface of the layer 310, i.e., the proportion of electrons of low energy levels, is decreased, so that deterioration of the device can be advantageously suppressed.

In the fourteenth embodiment, the hetero junction between the layers 308 and 310 has a steep gradient so as to form a spike therebetween. This spike, however, is not essential because hot electrons can be formed also in the double-barrier structure which forms the resonance tunnel. When the spike is eliminated, the composition of the boundary between the layers 308 and 310 is progressively changed so as to provide a graded layer.

Although the described thirteenth and fourteenth embodiments make use of a buffer layer constituted by super-grid layer, this is only illustrative and the buffer layer may grown on the Si substrate at a low temperature (GaAs/GaAs buffer layer (<200 Å)/Si system). It is also to be understood that, although the described embodiments utilize GaAs which is one of semiconductors of compounds of elements belonging to groups III to V, such a material is not exclusive and various other materials such as SiC/Si type materials can be used equally well.

An example of construction of the solid-state electron beam generator of the invention which incorporates such material are shown in Table 4 below.

TABLE 4

| | SiC/Si type |
|---|---|
| substrate | Si or SiC |
| Growth method | Gaseous or liquid phase growth |
| n-type region | $N^+$-type SiC<br>N-type SiC |
| p-type region | p-type Si |
| n-type dopant | N ($\simeq10^{20}\ cm^{-3}$) |
| p-type dopant | Al ($10^{18}\ cm^{-3}$) |
| n-type electrode | Au, Au—Ta (99:1) |
| p-type electrode | Al—Si (89:11) |

As will be understood from the foregoing description, the first to fifth embodiments of the present invention offers the following advantages.

(1) Since two compound semiconductors have different band gap widths, the rate of injection of carrier from one semiconductor to another semiconductor is remarkably increased as compared with the case where the band gap width is equal. In addition, the carriers changed into hot electrons are directly emitted to the outside without propagating through the semiconductor. In consequence, the efficiency of emission of electrons is remarkably increased.

(2) The layers can be formed as epitaxial films having thicknesses on the order of several tens of angstrom (Å), by making an efficient use of an MBE device or an MOCVD device. Thus, the layered structure of the device in accordance with the above has high quality and uniformity. Since the thicknesses of layers can be reduced, it is possible to decrease the driving voltage.

(3) Problems concerning heat generation is not so severe because the Si substrate exhibits only small heat resistance.

(4) The layered structure constituting the operating portion has a simple structure so that the manufacture is facilitated.

(5) Since the electron beam generator is produced by using a Si substrate, it becomes easy to obtain a device having a plurality of electron beam generators on a common substrate or to couple the electron beam generator to other device or devices. This obviously contributes to an enlargement in the scale of integration of semiconductor devices.

Furthermore, the electrons are changed into hot electrons by virtue of the spike caused by the hetero junction between the emitter region and the base region or a resonance tunnel in the base region, so that the efficiency of emission of electrons is further increased.

Figure 31:
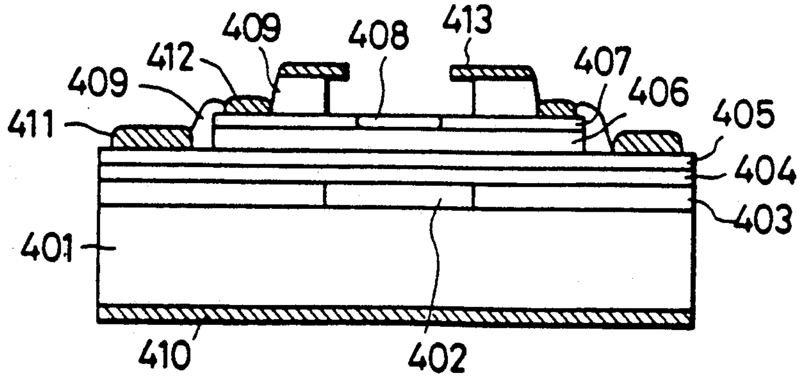
FIG. 31 is a sectional view of a fifteenth embodiment of the present invention.

FIG. 31 is a sectional view of a fifteenth embodiment of the solid-state electron beam generator of the present invention which employs an n-type or $n^+$-type GaAs substrate 401. This embodiment has an N-type $Al_xGa_{(1-x)}As$ layer 402 serving as an emitter. The symbol x represents the crystal mixing ratio which is selected to meet the condition of $0<x \leqq 1$. The capital-letter symbol N represents an n-type region having a wide band gap. The embodiment further has an inert layer 403 which is formed by injecting oxygen into the N-type $Al_xGa_{(1-x)}As$ layer 402.

A reference numeral 404 designates a graded layer which is formed by progressively decreasing the crystal mixing ratio x of the Al contained in the $Al_xGa_{(1-x)}As$ layer which serves as the emitter layer 402.

The embodiment further has a p-type GaAs layer 405 which serves as a base. The small-letter symbol "p" is used to mean a p-type region with narrow band gap. In this embodiment, it is possible to add Al such that the p-type GaAs layer is substituted by a P-type $Al_zGa_{(1-z)}As$ layer ($0 \leqq z<x$), thereby allowing a control of the band gap of the layer 405.

The embodiment further has an n-type GaAs layer 406 serving as a collector. The small-letter "n" is used here to mean an n-type region of a narrow band gap. The n-type GaAs layer may be substituted by an n-type $Al_tGa_{1-t)}As$ layer ($0 \leqq t \leqq 1$).

A numeral 407 denotes an $n^+$-type GaAs layer for attaining an ohmic contact between the collector layer 406 and its electrode.

A reference numeral 408 designates a cesium oxide (Cs-O) layer formed by deposition or diffusion on the surface of the collector layer 406. This Cs-O layer serves as an electron-emission surface. The Cs-O layer 408 may be substituted by another type of layer formed by deposition or diffusion from a material containing an alkali metal such as Cs and at least one element selected from the group consisting of Cu, Ag, Au, Sb, Bi, Se, As, P, Te, Si and 0.

The solid-state electron beam generator further has a $SiO_2$ protection (insulation) layer 409, an emitter electrode 410, a base electrode 411, a collector electrode 412, and an external acceleration electrode 413 for accelerating electrons emitted from the surface of the collector layer.

This embodiment is preferably produced by a process having the steps of: forming, on the n-type or $n^+$-type GaAs substrate, the N-type AlGaAs layer 402 by, for example, an MBE (Molecular Beam Epitaxy) device or an MOCVD (Metalorganic Chemical Vapor Deposition) device; injecting oxygen ions by an ion injector so as to form the inert region 403; successively conducting epitaxial growth of the graded layer 404, p-type GaAs layer 405, n-type GaAs layer 406 and $n^+$-type GaAs layer 407; and forming a region where the base electrode 411 is to be deposited, by etching. Then, the $SiO_2$ protection layer and electrodes 410 to 412 are formed followed by formation of the Cs-O diffusion layer 408, thus completing the production.

The electrodes 410, 412 for n-type GaAs may be formed from a composition such as Au-Ge or Au-Ge-Ni, while the electrode 411 for the p-type semiconductor is preferably formed from Au-Sn, Ag-Zn, Au-Be or Au-Zn.

Figure 32:
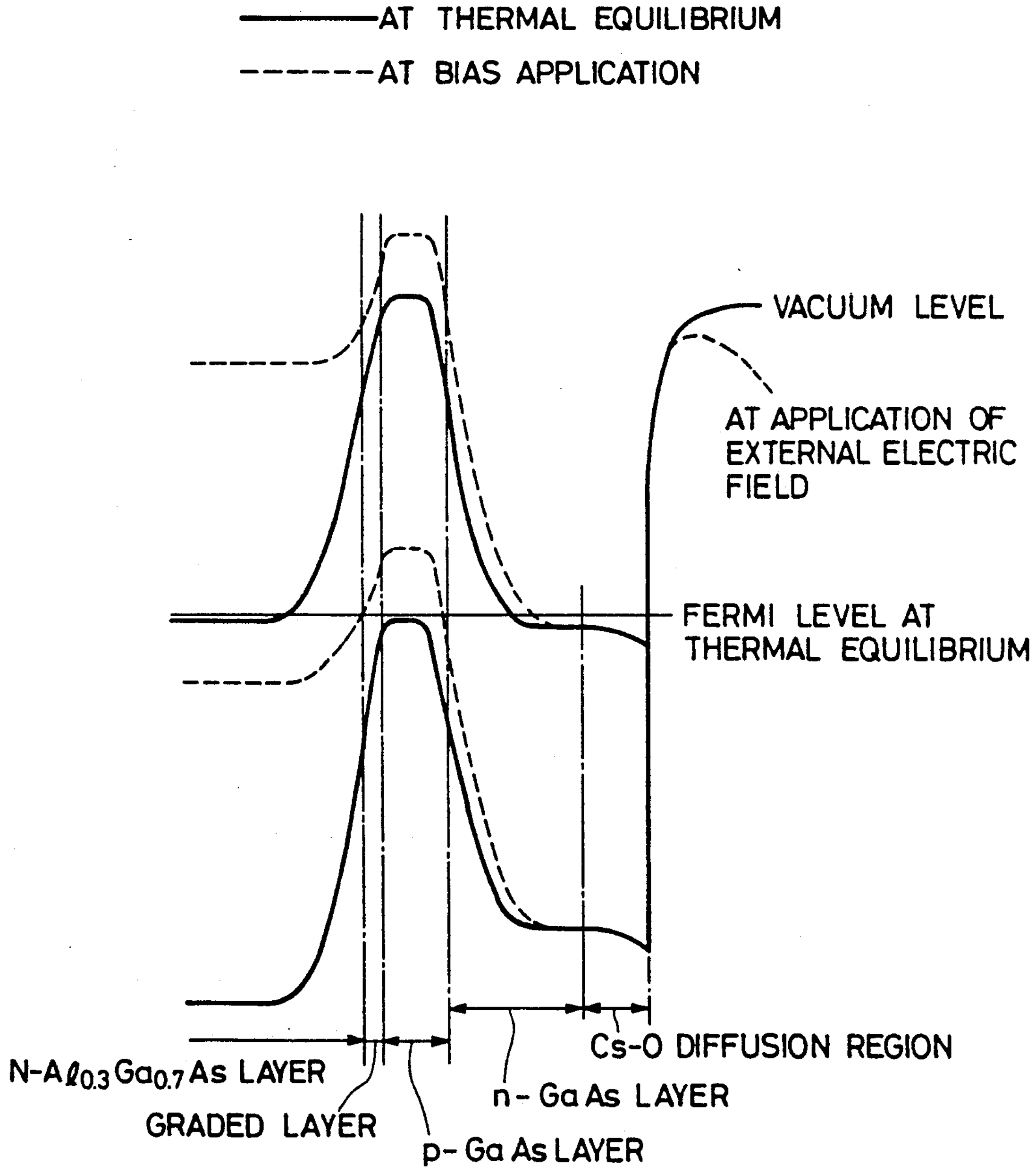
FIG. 32 is an energy band diagram showing electron energy level in the fifteenth embodiment.

The operation of this embodiment will be explained with reference to energy band diagram shown in FIG. 32. In this diagram, the full-line curve shows the energy level [eV] in the thermally equilibrium state of the electron beam generator, while broken-line curve shows the energy level [eV] in the state where a bias voltage is applied.

As explained before, the emitter is formed from, for example, $Al_xGa_{(1-x)}As$ layer which has a wide band gap so as to ensure high efficiency of injection of current into the base. The crystal mixing ratio x of Al is selected to be $x=0.3$ for attaining a good hetero junction and considering also influences of the L-band and X-band. This value of the crystal mixing ratio, however, is only illustrative.

The doping rate of the emitter layer 402 is as high as $5\times10^{17}$ to $1\times10^{19}\,cm^{-3}$ so as to allow a large number of carriers to be injected into the base layer 405. This high level of doping causes the state of the layer to be changed into degenerating state and the Fermi level is set above the conductive band.

Since the electrode 410 for the emitter layer is formed on the reverse side of the n-type GaAs substrate 401, it is preferred that the rate of doping is increased so as to minimize the voltage drop across the substrate.

Since the graded layer 404 is formed between the emitter layer 402 and the base layer 405, the crystal mixing ratio x of Al is progressively decreased and reaches zero at the boundary on the base layer 405. As shown in FIG. 32, no spike is formed in the hetero junction between the emitter layer 402 and the base layer 405, by virtue of the provision of the graded layer 404. The elimination of the spike, which usually acts as a barrier, enables a large number of carriers to be injected into the base layer 405, thus assuring a high injection efficiency.

Referring now to the base layer 405, this layer 405 is formed from a p-type GaAs layer having a narrow band gap, in order to ensure a high efficiency of injection of current into the base layer 405. The amount of dope in this p-type GaAs layer is selected to be on the order of $5\times10^{18}$ cm$^{-3}$ so as to reduce resistance, and the thickness of the base layer 6 is selected to be about 300 Å so as to reduce scattering in this layer.

The n-type GaAs collector layer 406 and the $n^+$-type GaAs layer 407 are made to grow on the p-type GaAs base layer 405. Cs-O is diffused or deposited on the surface of the $n^+$-type GaAs layer 407 so that the surface of the collector layer exhibits a work function which is as small as 1.4 eV. As stated before, the Cs-O used as the material for reducing the work function may be substituted by another material which contains an alkali metal other than Cs, one element selected from the group consisting of Sb, Bi, Se, As, P, Te, Cu, Ag, and Au, and oxygen.

In order to attain an ohmic contact between the collector layer 406 and the collector electrode and to reduce the level of the ohmic contact, the collector layer is doped at a high rate of $1\times10^{18/cm-3}$. The doping rate of the $n^+$-type GaAs layer 407 is on the order of $1\times10^{19}/cm^{-3}$.

In this embodiment, the n-type GaAs layer 406 and the $n^+$-type GaAs layer 407 are formed to have a total thickness of 1000 Å. This thickness, however, is only illustrative. Namely, this total thickness is preferably reduced provided that a good ohmic contact is maintained between the electrode and these layers. It is possible to form these layers in high quality and uniformity by growing them using an MBE device or an MOCVD device.

The operation under application of the bias voltage is as follows (See broken-line curve in FIG. 32).

A forward bias voltage is applied between the emitter and the base, while a backward bias voltage is applied between the base and the collector. At the same time, a bias voltage which is positive with respect to the collector is applied to the external accelerating electrode. In consequence, the carriers (electrons) injected from the emitter into the base are accelerated by the electric field formed between the base and the collector and are emitted through the surface in which the material for reducing the work function, e.g., Cs-O, is diffused. The emitted electrons are further accelerated by the external electric field formed by the accelerating electrode so as to have greater kinetic energy.

In this embodiment, there is no spike nor other barrier between the emitter layer and the base layer, because of the provision of the graded layer between these layers. In consequence, the rate of injection of carriers from the emitter layer into the base layer is increased. In addition, a large number of carriers are accelerated by the backward bias between the base and the collector. In consequence, the efficiency of emission of electrons is remarkably increased.

Figure 33:
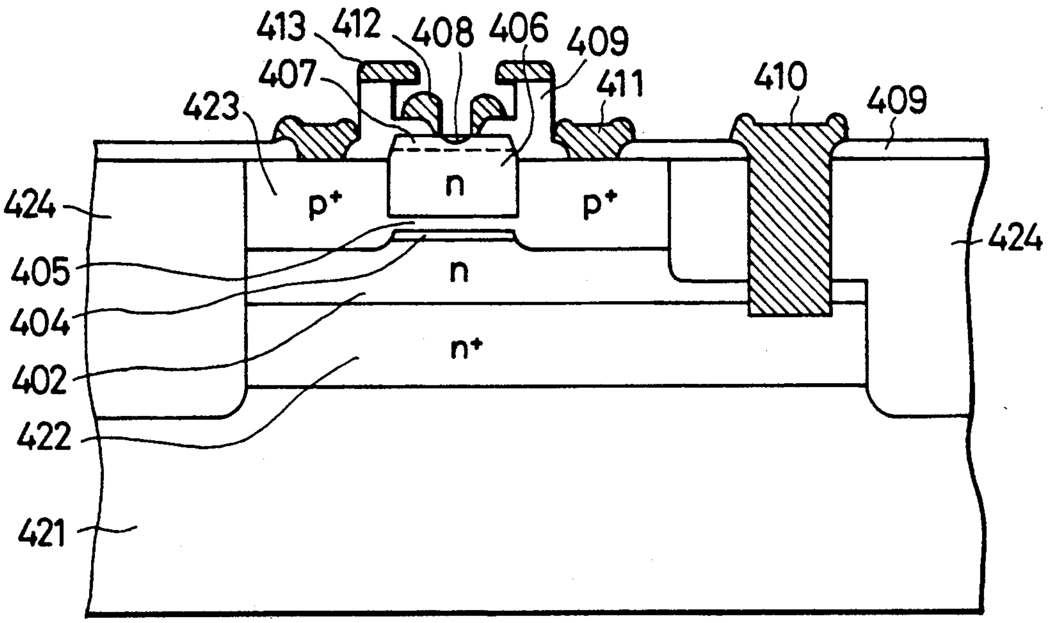
FIG. 33 is a sectional view of a sixteenth embodiment of the present invention.

FIG. 33 is a sectional view of a sixteenth embodiment which makes use of a semi-insulating substrate. This embodiment is formed by injecting elements similar to those used in the fifteenth embodiment shown in FIG. 31 by ion injection technique.

Referring to FIG. 33, a numeral 421 denotes a semi-insulating GaAs substrate, 422 denotes an $n^+$-GaAs layer for attaining an ohmic contact between the emitter electrode 410 and the emitter layer 402 formed of N-type $Al_xGa_{(1-x)}As$ layer ($0<x\leq1$), 404 denotes a graded layer in which the crystal mixing ratio of Al is progressively decreased as the distance from the emitter layer 402 is increased, 405 denotes a p-type GaAs base layer, 406 denotes an n-type GaAs collector layer, 407 denotes an $n^+$-type GaAs layer for attaining good ohmic contact between the collector layer 406 and a collector electrode 412, and 408 denotes a layer having diffused or deposited material such as Cs-O for reducing the work function.

This embodiment can be produced, for example, by the following process. The $n^+$-type GaAs layer 422, N-type $Al_xGa_{(1-x)}As$ layer 402, graded layer 404, p-type GaAs layer 405, n-type GaAs layer 406 and the $n^+$-type GaAs layer 407 are successively formed on the semi-insulating substrate 421. Then, Be ions are injected into the portion of the p-type GaAs base where the electrode is to be formed so as to form a $p^+$-type region 423. At the same time B ions are injected to form a region 424 which serves to insulate the base and emitter from each other and to isolate the device. Then, an $SiO_2$ protection layer 409 is formed and the collector electrode 412 and the base electrode 411 are formed. The laminated structure is locally recessed to expose the $n^+$-type GaAs layer 422 and the recess is filled with a material such as Au-Ge/Au thus forming the emitter electrode 10.

Finally, the external acceleration electrode 413 is formed and Cs-O is diffused, thus completing the production process.

This sixteenth embodiment is advantageous over the fifteenth embodiment in that troublesome works such as etching down to the p-type GaAs base layer 405 (see FIG. 31) are eliminated and in that the device can have a flat surface.

The principle of operation of this sixteenth embodiment is not described because it is materially the same as that of the fifteenth embodiment.

Although the described fifteenth and sixteenth embodiments make use of GaAs which is one of semiconductors of compounds of elements belonging to groups III to V, such a material is not exclusive and various other materials such as InGaAsP/InP type materials can be used equally well.

Examples of construction of the solid-state electron beam generator of the invention which incorporate such a material are shown in Table 5 below.

TABLE 5

| | InGaAsP/InP type |
|---|---|
| Substrate | Inp |
| Growth method | Liquid phase growth |
| Emitter | $N^+$-type InP<br>N-type InP |
| Graded layer | In n-type $In_xGa_{(1-x)}As_yP_{(1-y)}$, the crystal mixing ratio y is progressively increased from 0 while the crystal mixing ratio x is progressively decreased from 1 so as to provide smooth gradient in base layer band gap |
| Base | p-type InGaAsP |
| Collector | n-type InGaAsP |
| n-type dopant | Te<br>($\simeq 2\times10^{19}$ cm$^{-3}$) |
| p-type dopant | Cd or Mg<br>($\simeq 5\times10^{18}$ cm$^{-3}$) |
| n-type electrode | Au, Au—Ti, Pt, Sn |
| p-type electrode | For InP<br>Au, Ni, Cu<br>For InGaAsP<br>Au, Ag |

As will be understood from the foregoing description, the first to fifteenth embodiments of the present invention offers the following advantages.

(1) Since the emitter and the base have different band gap widths, and since a graded layer is disposed therebetween, the rate of injection of carrier from the emitter to the base is remarkably increased as compared with the case where the band gap width is equal. In addition, the carriers injected into the base are accelerated by the electric field so as to have greater kinetic energy. In consequence, the efficiency of emission of electrons is remarkably increased.

(2) The emitter region and the base region can be formed as epitaxial films having thicknesses on the order of several tens of angstrom (Å), by making an efficient use of an MBE device or an MOCVD device. Thus, the layered structure of the device in accordance with the has high quality and uniformity. Since the thicknesses of layers can be reduced, it is possible to decrease the driving voltage.

(3) Since the electron beam generator is produced from semiconductor materials, it becomes easy to obtain a device having a plurality of electron beam generators on a common substrate or to couple the electron beam generator to other device or devices. This obviously contributes to an enlargement in the scale of integration of semiconductor devices.

In particular, the sixteenth embodiment offers advantages such as elimination of complicated processes such as etching, flat surface of the produced device, and increase in the integration scale by forming this device together with other devices on the same substrate.

Figure 34:
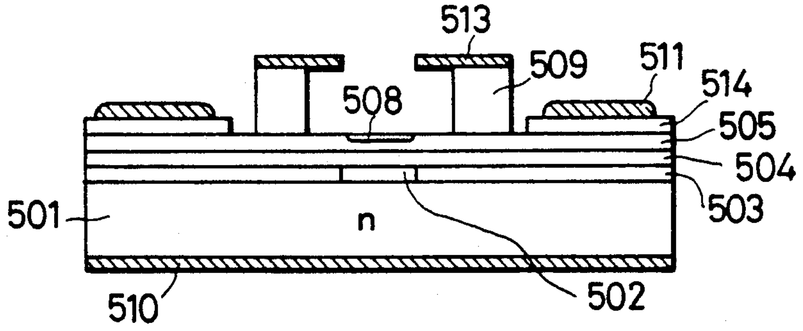
FIG. 34 is a sectional view of a seventeenth embodiment of the present invention.

FIG. 34 is a sectional view of a seventeenth embodiment of the solid-state electron beam generator of the present invention which employs an n-type or $n^+$-type GaAs substrate 501. This embodiment has an N-type $Al_xGa_{(1-x)}As$ layer 502 serving as a source of carriers for supplying carriers. The symbol x represents the crystal mixing ratio which is selected to meet the condition of $0<x\leq 1$. The capital-letter symbol N represents an n-type region having a wide band gap. The embodiment further has an inert layer 503 which is formed by injecting oxygen into the N-type $Al_xGa_{(1-x)}As$ layer 502.

A reference numeral 504 designates a graded layer which is formed by progressively decreasing the crystal mixing ratio x of the Al contained in the $Al_xGa_{(1-x)}As$ layer 502.

The embodiment further has a p-type GaAs layer 505. The small-letter symbol "p" is used to mean a p-type region with narrow band gap. In this embodiment, it is possible to add Al such that the p-type GaAs layer is substituted by a P-type $Al_zGa_{(1-z)}As$ layer ($0\leq z<x$), thereby allowing a control of the band gap of the layer 505.

A reference numeral 508 designates a cesium oxide (Cs-O) layer formed by deposition or diffusion on the surface of the p-type GaAs layer 505. This Cs-O layer serves as an electron-emission surface. The Cs-O layer 508 may be substituted by another type of layer formed by deposition or diffusion from a material containing an alkali metal such as Cs and at least one element selected from the group consisting of Cu, Ag, Au, Sb, Bi, Se, As, P, Te, Si and O.

The solid-state electron beam generator further has an $SiO_2$ protection (insulation) layer 509, electrodes 510, 511 for applying bias voltage, and an external acceleration electrode 513 for accelerating emitted electrons. A reference numeral 514 denotes a $p^+$-type GaAs layer for attaining an ohmic contact between the electrode 511 and the associated layer.

This embodiment is preferably produced by a process having the steps of: forming, on the n-type GaAs substrate, the N-type AlGaAs layer 502 by, for example, an MBE (Molecular Beam Epitaxy) device or an MOCVD (Metalorganic Chemical Vapor Deposition) device; injecting oxygen ions by an ion injector so as to form the inert region 503; successively conducting epitaxial growth of the graded layer 504 and the p-type GaAs layer 505. Then, the $SiO_2$ protection layer 509 and electrodes 510, 511 are formed followed by formation of the Cs-O diffusion layer 508, thus completing the production.

The electrodes 510 for n-type GaAs may be formed from a composition such as Au-Ge or Au-Ge-Ni, while the electrode 511 for the p-type GaAs is preferably formed from Au-Sn, Ag-Zn, Au-Be or Au-Zn.

The operation of this embodiment will be explained with reference to energy band diagram shown in FIG. 35. In this diagram, the full-line curve shows the energy level [eV] in the thermally equilibrium state of the electron beam generator, while broken-line curve shows the energy level [eV] in the state where a bias voltage is applied.

As explained before, the layer 502 is formed from, for example, $Al_xGa_{(1-x)}As$ layer which has a wide band gap so as to ensure high efficiency of injection of carriers into the layer 505. The crystal mixing ratio x of Al is selected to be $x=0.3$ for attaining a good hetero junction and considering also influences of the L-band and X-band. This value of the crystal mixing ratio, however, is only illustrative.

The doping rate of the emitter layer 502 is as high as $5\times10^{17}$ to $1\times10^{19}$ $cm^{-3}$ so as to allow a large number of carriers to be injected into the base layer 505. This high level of doping causes the state of the layer to be changed into a degenerate state and the Fermi level is set above the conductive band.

Since the electrode 510 for the emitter layer is formed on the reverse side of the n-type GaAs substrate 501, it is preferred that the rate of doping is increased so as to minimize the voltage drop across the substrate.

Since the graded layer 504 is formed between the layer 502 and the layer 505, the crystal mixing ratio x of Al is progressively decreased and reaches zero at the boundary on the layer 505. As shown in FIG. 35, no spike is formed in the hetero junction between the emitter layer 502 and the base layer 505, by virtue of the provision of the graded layer 504. The elimination of the spike, which usually acts as a barrier, enables a large number of carriers to be injected into the layer 505, thus assuring a high injection efficiency.

Referring now to the layer 505, this layer 505 is formed from a p-type GaAs layer having a narrow band gap. The amount of dope in this p-type GaAs layer 505 is selected to be on the order of $5\times10^{18}$ $cm^{-3}$ so as to reduce resistance, and the thickness of the layer 505 is selected to be about 300 Å so as to reduce scattering in this layer.

Cs-O is diffused or deposited on the surface of the p-type GaAs layer 505 so that the surface of the layer 505 exhibits a work function which is as small as 1.4 eV. As stated before, the Cs-O used as the material for reducing the work function may be substituted by another material which contains an alkali metal other than Cs, one element selected from the group consisting of Sb, Bi, Se, As, P, Te, Cu, Ag, Au, Si and O.

The operation under application of the bias voltage is as follows (See broken-line curve in FIG. 35).

A forward bias voltage is applied between the electrodes 510 and 511, while a bias voltage which is positive with respect to the electrode 511 is applied to the external accelerating electrode 513. As a result, the band of the p-type GaAs layer 505 is deflected downward as shown in FIG. 35, because the p-type GaAs layer with Cs-O diffused thereon exhibits a work function of 1.4 eV while the electronic affinity of the p-type GaAs layer is 4.07 eV. Since the p-type GaAs layer 505 is in the highly doped state, the valence band and the Fermi level substantially coincide with each other. In addition, the band gap of GaAs is 1.428 eV which is greater than the work function (1.4 eV) of the surface having diffused Cs-O. Therefore, the carriers (electrons) of low energy injected from the N-type AlGaAs layer 502 into the p-type GaAs layer 505 drop into the valley V which is formed in the vicinity of the surface as shown in FIG. 35. However, the absolute value of the number of the carriers injected into the layer 505 is increased by virtue of provision of the graded layer, so that the level of the current emitted also is increased correspondingly.

Figure 35:
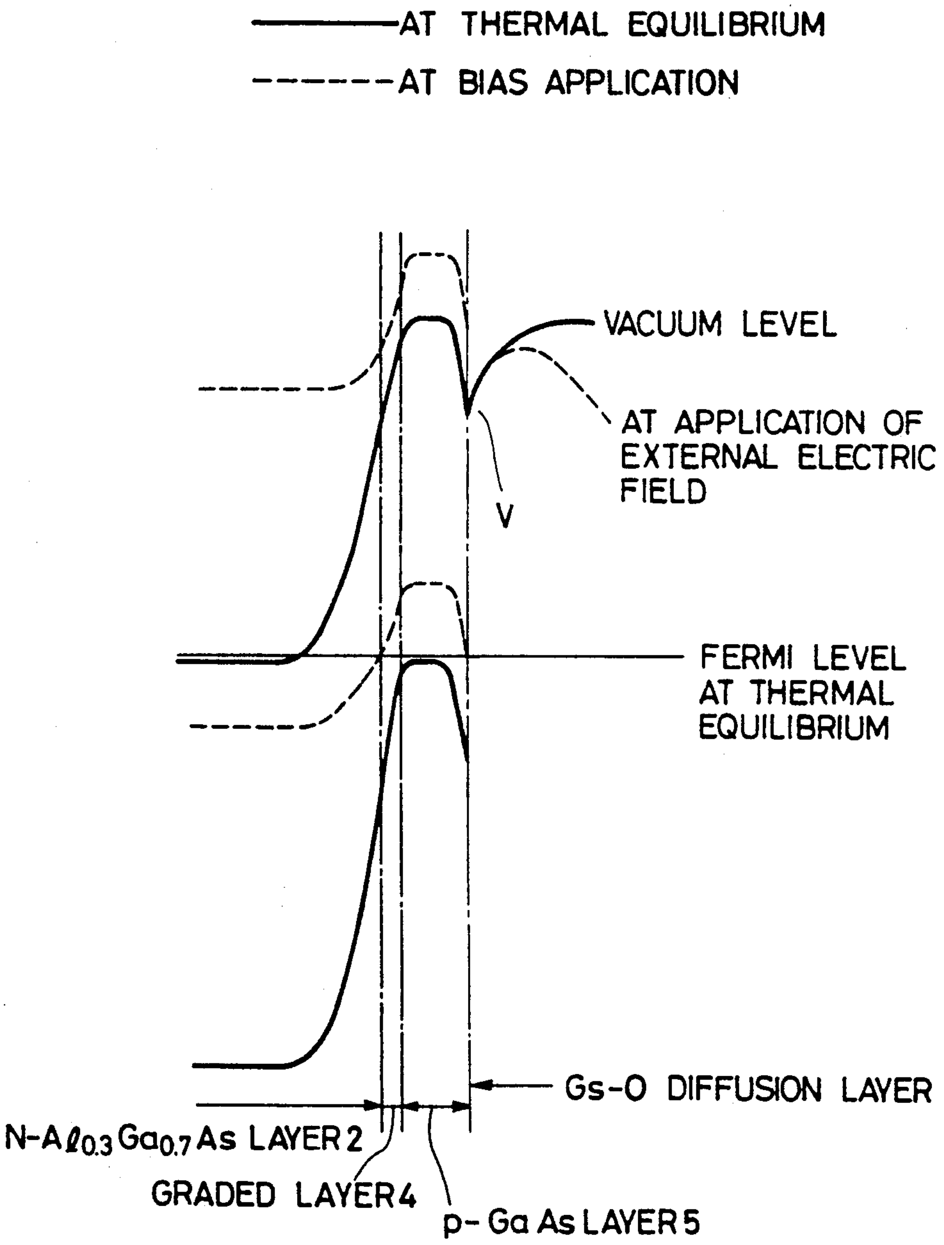
FIG. 35 is an energy band diagram showing electron energy level in the seventeenth embodiment.

The application of the external electric field by the external acceleration electrode 513 causes the vacuum level to be deflected downward as shown in FIG. 35, so that the emitted electrons are further accelerated by this electric field.

In consequence, the carriers (electrons) injected from the emitter into the base are accelerated by the electric field formed between the base and the collector and are emitted through the surface in which the material for reducing the work function, e.g., Cs-O, is diffused. The emitted electrons are further accelerated by the external electric field formed by the accelerating electrode so as to have greater kinetic energy.

In this embodiment, there is no spike nor other barrier between the emitter layer and the base layer, because of the provision of the graded layer between these layers. In consequence, the rate of injection of carriers from the emitter layer into the base layer is increased. In addition, a large number of carriers are accelerated by the backward bias between the base and the collector. In consequence, the efficiency of emission of electrons is remarkably increased.

Figure 36:
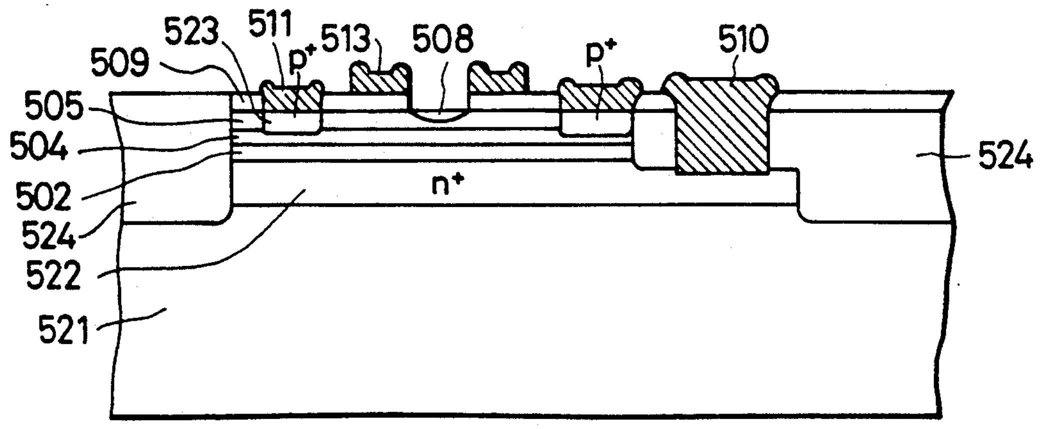
FIG. 36 is a sectional view of an eighteenth embodiment of the present invention.

FIG. 36 is a sectional view of an eighteenth embodiment which makes use of a semi-insulating substrate. This embodiment is formed by injecting elements similar to those used in the seventeenth embodiment shown in FIG. 34 by ion injection technique.

Referring to FIG. 36, a numeral 521 denotes a semi-insulating GaAs substrate, 522 denotes an n+-GaAs layer for attaining an ohmic contact with the electrode 510, a layer 502 formed of N-type $Al_xGa_{(1-x)}As$ layer ($0<x\leqq 1$), 504 denotes a graded layer in which the crystal mixing ratio of Al is progressively decreased as the distance from the layer 502 is increased, 505 denotes a p-type GaAs base layer, and 508 denotes a layer having diffused or deposited material such as Cs-O for reducing the work function.

This embodiment can be produced, for example, by the following process. The n+-type GaAs layer 522, N-type $Al_xGa_{(1-x)}As$ layer 502, graded layer 504, and p-type GaAs layer 505 are successively formed on the semi-insulating substrate 521. Then, B ions are injected to form a region 524 which serves to insulate the base and emitter from each other and to isolate the device. Then, an $SiO_2$ protection layer 509 is formed and the electrode 511 is formed. The laminated structure is locally recessed to expose the n+-type GaAs layer 522 and the recess is filled with a material such as Au-Ge/Au thus forming the other electrode 510.

Finally, the external acceleration electrode 513 is formed and Cs-O is diffused, thus completing the production process.

This eighteenth embodiment is advantageous over the seventeenth embodiment in that troublesome works such as etching down to the p-type GaAs base layer 505 (see FIG. 31) are eliminated and in that the device can have a flat surface.

The principle of operation of this eighteenth embodiment is not described because it is materially the same as that of the seventeenth embodiment.

Thus, the eighteenth embodiment proposes a planar-type construction which makes it easy to produce a multiple-type device in which a plurality of devices are arranged on a common plane.

Although the described fifteenth and sixteenth embodiments make use of GaAs which is one of semiconductors compounds of elements belonging to groups III to V, such a material is not exclusive and various other materials such as InGaAsP/InP type materials can be used equally well.

Examples of construction of the solid-state electron beam generator of the invention which incorporate such a material are shown in Table 6 below.

TABLE 6

| | InGaAsP/InP type |
|---|---|
| Substrate | InP |
| Growth method | liquid phase growth |
| N-type region | $N^+$ type InP<br>N type InP |
| Graded layer | In n-type $In_xGa_{(1-x)}As_yP_{(1-y)}$, the crystal mixing ratio y is progressively increased from 0 while the crystal mixing ratio x is progressively decreased from 1 so as to provide smooth gradient in base layer band gap |
| Bp-type region | p-type InGaAsP |
| n-type dopant | Te ($\simeq 2\times 10^{19}\ cm^{-3}$) |
| p-type dopant | Cd or Mg ($\simeq 5\times 10^{18}\ cm^{-3}$) |
| n-type electrode | Au, Au—Ti, Pt, Sn |
| p-type electrode | For InP<br>Au, Ni, Cu<br>For InGaAsP<br>Au, Ag |

As will be understood from the foregoing description, the first to fifteenth embodiments of the present invention offer the following advantages.

(1) Since two compounds have different band gap widths, and since a graded layer is provided between these compounds, the rate of injection of carrier from the one to the other compound semiconductor is remarkably increased. In consequence, the efficiency of emission of electrons is remarkably increased.

(2) The emitter region and the base region can be formed as epitaxial films having thicknesses on the order of several tens of angstrom (Å), by making an efficient use of an MBE device or an MOCVD device. Thus, the layered structure of the device in accordance with the has high quality and uniformity. Since the thicknesses of layers can be reduced, it is possible to decrease the driving voltage.

(3) Since the electron beam generator is produced from semiconductor materials, it becomes easy to obtain a device having a plurality of electron beam generators on a common substrate or to couple the electron beam generator to other device or devices. This obviously contributes to an enlargement in the scale of integration of semiconductor devices.

In particular, the sixteenth embodiment offers advantages such as elimination of complicated process such as etching, flat surface of the produced device, and increase in the integration scale by forming this device together with other devices on the same substrate.

Figure 37:
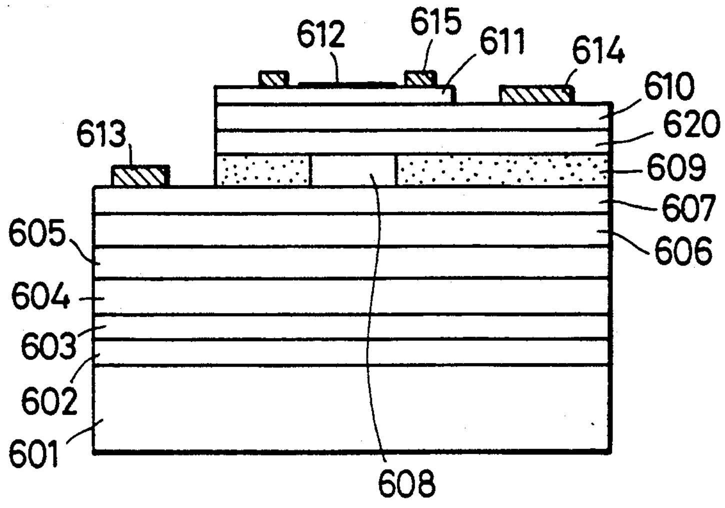
FIG. 37 is a sectional view of a nineteenth embodiment of the present invention.

FIG. 37 is a sectional view of a nineteenth embodiment of the solid-state electron beam generator of the present invention.

In this embodiment, an AlP layer 602 and an AlGaP layer 603 are made to grow on a Si substrate 601 by MOCVD (Metalorganic Chemical Vapor Deposition) method and then a super-grid layer 604 of GaP and GaAsP and a super-grid layer 605 of GaAsP and GaAs are formed. Then, a GaAs layer 606 is made to grow on these super-grid layers. Subsequently, an n+-type GaAs layer 607 and an N-type $Al_xGa_{(1-x)}As$ layer 608 ($0<x\leqq 1$) are made to grow. Oxygen ions are injected by an ion injector into the $Al_xGa_{(1-x)}As$ layer 608 so as to form inert layer 609 in the regions of this layer 608 other than the electron beam generating region.

On the N-type $Al_xGa_{(1-x)}As$ layer 608 is formed a graded layer 620 in which the crystal mixing ratio x of Al is progressively decreased towards the GaAs.

A p-type GaAs layer 610 and an n-type GaAs layer 611 are formed on the graded layer 620. A layer 612 of material for reducing work function, e.g., cesium oxide (Cs-O) is formed by deposition or diffusion on the surface of the n-type GaAs layer 611.

The construction will be explained in more detail hereinunder.

As mentioned above, this embodiment incorporates an N-type $Al_xGa_{(1-x)}As$ layer 608 serving as a emitter. The symbol x represents the crystal mixing ratio which is selected to meet the condition of $0<x\leqq 1$. The capital-letter symbol N represents an n-type region having a wide band gap. A numeral 609 represents an inert layer formed by injecting oxygen ions into the N-type $Al_xGa_{(1-x)}As$ layer 608. The embodiment further has a p-type GaAs layer 610 which serves as a base. The small-letter symbol "p" is used to mean a p-type region with narrow band gap. In this embodiment, it is possible to add Al such that the p-type GaAs layer is substituted by a P-type $Al_zGa_{(1-z)}As$ layer ($0\leqq z<x$), thereby allowing a control of the band gap. The embodiment further has an n-type GaAs layer 611 serving as a collector. The small-letter "n" is used here to mean an n-type region of a narrow band gap. The n-type GaAs layer may be substituted by an n-type $Al_tGa_{(1-t)}As$ layer ($0\leqq t\leqq 1$).

A reference numeral 612 designates a cesium oxide (Cs-O) layer formed by deposition or diffusion on the surface of the collector layer 611. This Cs-O layer serves as an electron-emission surface. The Cs-O layer 10 may be substituted by another type of layer formed by deposition or diffusion from a material containing an alkali metal such as Cs and at least one element selected from the group consisting of Cu, Ag, Au, Sb, Bi, Se, As, P, Te, Si and O.

Numerals 613, 614 and 615 denote, respectively, the electrodes for the emitter, base and the collector.

Electrodes for n- or N-type semiconductor may be formed from a composition such as Au-Ge or Au-Ge-Ni, while the electrode for the p-type semiconductor may be formed from Au-Sn, Ag-Zn, Au-Be or Au-Zn. In the illustrated embodiment, the electrode of the p-type GaAs is formed directly on the surface of the p-type GaAs layer. This, however, is not exclusive and the electrode may be formed after doping the surface of this GaAs layer with Be ions so as to form a $p^+$-type region or may be formed on a $p^+$-type GaAs layer grown on the surface of the p-type GaAs layer surface.

Thus, in this nineteenth embodiment, an Npn-type epitaxial film of GaAs-$Al_xGa_{(1-x)}As$ system has grown on the Si substrate.

Figure 38:
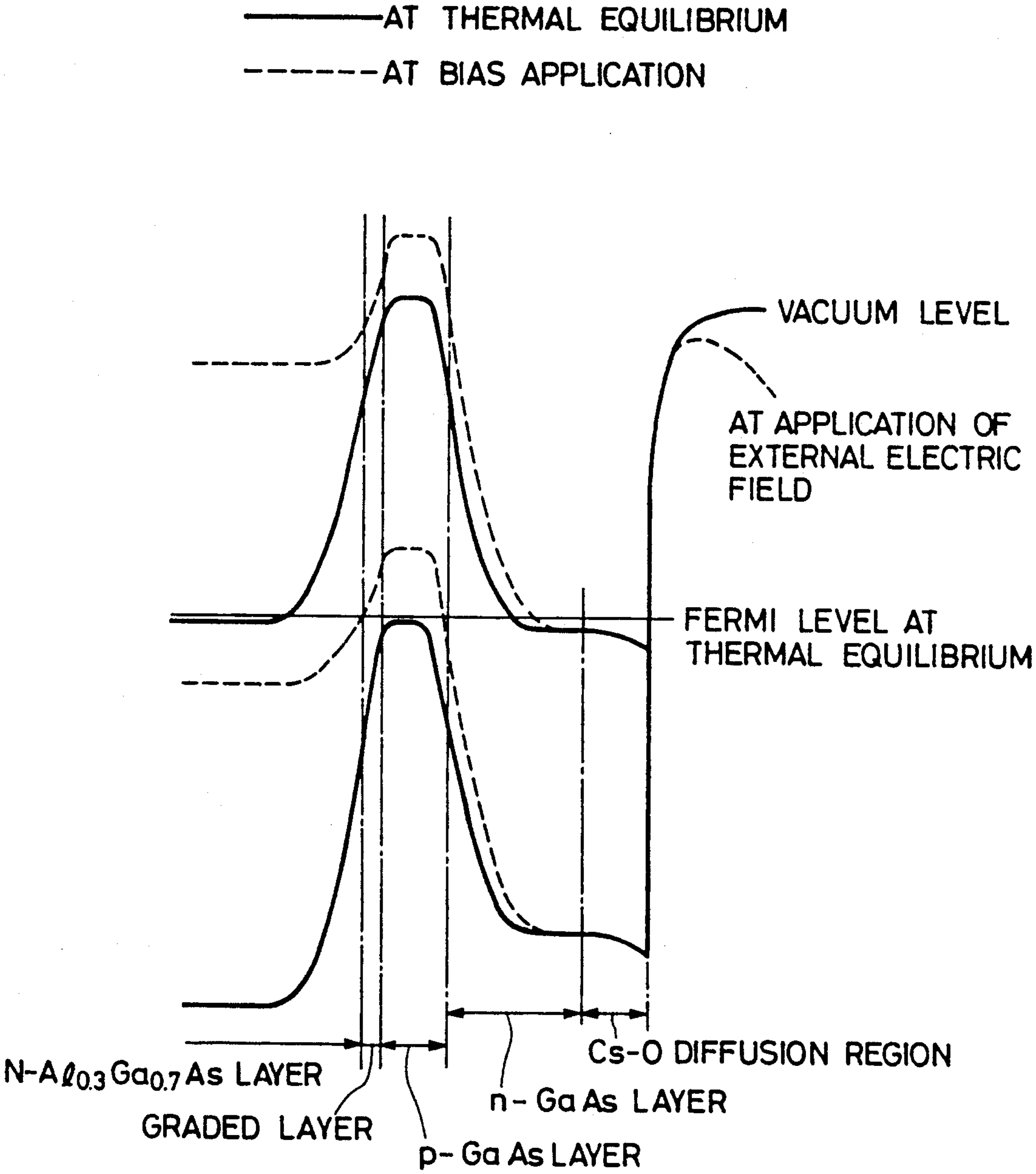
FIG. 38 is an energy band diagram showing electron energy level in the nineteenth embodiment.

The operation of this embodiment will be described with reference to FIG. 38 which is an energy band diagram.

In this diagram, the full-line curve shows the energy level [eV] in the thermally equilibrium state of the electron beam generator, while broken-line curve shows the energy level [eV] in the state where a bias voltage is applied.

As explained before, the emitter layer 608 is formed from, for example, $Al_xGa_{(1-x)}As$ layer which has a wide band gap so as to ensure high efficiency of injection of current into the base. The crystal mixing ration x of Al is selected to be $x=0.3$ for attaining a good hetero junction and considering also influences of the L-band and X-band. This value of the crystal mixing ratio, however, is only illustrative.

The doping rate of the emitter layer 608 is as high as $5\times10^{17}$ to $1\times10^{19}$ $cm^{-3}$ so as to allow a large number of carriers to be injected into the base layer 610. This high level of doping causes the state of the layer to be changed into degenerating state and the Fermi level is set above the conductive band.

Since the graded layer 604 is formed between the emitter layer 608 and the base layer 610, the crystal mixing ratio x of Al is progressively decreased and reaches zero at the boundary on the base layer 610. As shown in FIG. 38, no spike is formed in the hetero junction between the emitter layer 608 and the base layer 610, by virtue of the provision of the graded layer 604. The elimination of the spike, usually acts as a barrier, enables a large number of carriers to be injected into the base layer 610, thus assuring a high injection efficiency.

Referring now to the base layer 610, this layer 610 is formed a p-type GaAs layer having a narrow band gap. The amount of dope in this p-type GaAs layer is selected to be on the order of $5\times10^{18}$ $cm^{-3}$ so as to reduce resistance, and the thickness of the base layer 6 is selected to be about 300 Å so as to reduce scattering in this layer.

The n-type GaAs collector layer 461 is made to grow on the p-type GaAs base layer 610. Cs-O) is diffused or deposited on the surface of the n-type GaAs layer 611 so that the surface of the collector layer exhibits a work function which is as small as 1.4 eV. As stated before, the Cs-O used as the material for reducing the work function may be substituted by another material which contains an alkali metal other than Cs, one element selected from the group consisting of Sb, Bi, Se, As, P, Te, Cu, Ag, Au, Si and O.

In order to attain an ohmic contact between the collector layer 611 and the collector electrode 615 and to reduce the level of the ohmic contact, the collector layer 611 is doped at a high rate of $1\times10^{18}/cm^{-3}$.

In this embodiment, the collector layer 611 has a thickness of 1000 Å. This thickness, however, is only illustrative. Namely, this thickness is preferably reduced provided that a good ohmic contact is maintained between the collector layer 611 and the collector electrode 615. It is possible to form these layers in high quality and uniformity by growing them using an MBE device or an MOCVD device.

The operation under application of the bias voltage is as follows (See broken-line curve in FIG. 38).

A forward bias voltage is applied between the emitter and the base, while a backward bias voltage is applied between the base and the collector. At the same time, a bias voltage which is positive with respect to the collector is applied to the external accelerating electrode (not shown). In consequence, the carriers (electrons) injected from the emitter into the base are accelerated by the electric field formed between the base and the collector and are emitted through the surface in which the material for reducing the work function, e.g., Cs-O, is diffused. The emitted electrons are further accelerated by the external electric field formed by the accelerating electrode so as to have greater kinetic energy.

In this embodiment, there is no spike nor other barrier between the emitter layer and the base layer, because of the provision of the graded layer between these layers. In consequence, the rate of injection of carriers from the emitter layer into the base layer is increased. In addition, a large number of carriers are accelerated by the backward bias between the base and the collector. In consequence, the efficiency of emission of electrons is remarkably increased.

Figure 39:
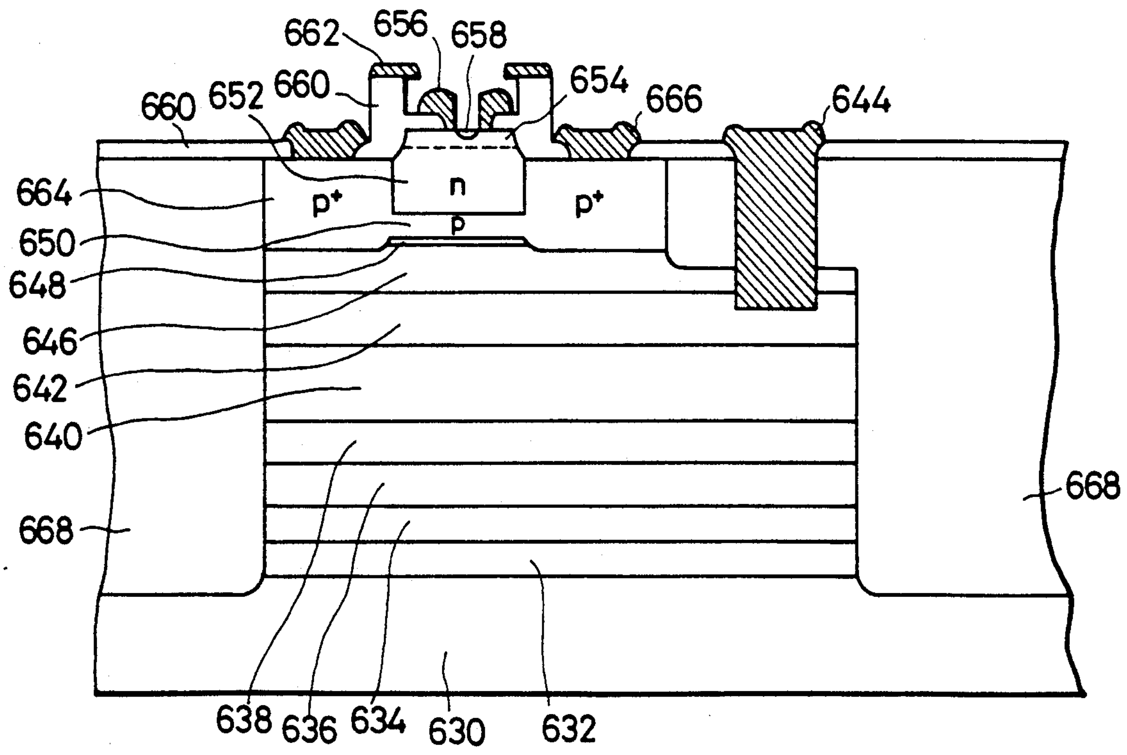
FIG. 39 is a sectional view of a twentieth embodiment of the present invention.

FIG. 39 is a sectional view of a twentieth embodiment which makes use of a semi-insulating substrate. This embodiment is formed by injecting elements similar to those used in the nineteenth embodiment shown in FIG. 37 by ion injection technique.

Referring to FIG. 39, a numeral 630 denotes a Si substrate, 632 denotes an AlP layer, 634 denotes an AlGaP layer, 636 denotes a super-grid layer of Gap and GaAsP, 638 denotes super-grid layer of GaAsP and GaAs, and 640 denotes GaAs layer. This structure is substantially the same as that in the nineteenth embodiment shown in FIG. 37.

A numeral 642 denotes an $n^+$-GaAs layer for attaining an ohmic contact between the emitter electrode and the emitter layer 646 formed of N-type $Al_xGa_{(1-x)}As$ layer ($0<x\leqq 1$), 648 denotes a graded layer in which the crystal mixing ratio x of Al is progressively decreased as the distance from the emitter layer 402 is increased, 650 denotes a p-type GaAs base layer, 652 denotes an n-type GaAs collector layer, 654 denotes an $n^+$-type GaAs layer for attaining good ohmic contact between the collector layer 652 and a collector electrode 656, and 658 denotes a layer having diffused or deposited material such as Cs-O for reducing the work function. Numerals 666 and 662 denotes, respectively, a base electrode and an external acceleration electrode.

This embodiment can be produced, for example, by the following process. After forming the $n^+$-type layer 654, a $p^+$-type region 664 is formed by injecting Be ions into the electrode-forming portion of the p-type GaAs (base). At the same time, a region 668 is formed by injecting B ions for the purpose of insulation between the base and the emitter and the isolation of the device. Then, an $SiO_2$ protection layer 660 is formed and the collector electrode 656 and the base electrode 666 are formed. The laminated structure is locally recessed to expose the $n^+$-type GaAs layer 642 and the recess is filled with a material such as Au-Ge/Au thus forming the emitter electrode 644.

Finally, Cs-O is diffused or deposited, thus completing the production process.

This twentieth embodiment is advantageous over the nineteenth embodiment in that troublesome works such as etching down to the p-type GaAs base layer 642 (see FIG. 37) are eliminated and in that the device can have a flat surface.

The principle of operation of this twentieth embodiment is not described because it is materially the same as that of the nineteenth embodiment.

Thus, the nineteenth embodiment offers a planar type structure which makes easy to produce a multiple device having a multiplicity of devices formed on a common plane.

Although the described nineteenth and twentieth embodiments make use of a buffer layer incorporating a super-grid layer, this is not exclusive and these embodiments may instead incorporate an extremely thin buffer layer (GaAs/GaAs buffer layer (<200 Å)/Si system) which is made to grow on the Si substrate at a low temperature.

As will be understood from the foregoing description, the first to fifteenth embodiments of the present invention offers the following advantages.

(1) Since the emitter and the base have different band gap widths, and since a graded layer is disposed therebetween, the rate of injection of carrier from the emitter to the base is remarkably increased as compared with the case where the band gap width is equal. In addition, the carriers injected into the base are accelerated by the electric field so as to have greater kinetic energy. In consequence, the efficiency of emission of electrons is remarkably increased.

(2) The emitter region and the base region can be formed as epitaxial films having thicknesses on the order of several tens of angstrom (Å), by making an efficient use of an MBE device or an MOCVD device. Thus, the layered structure of the device in accordance with the has high quality and uniformity. Since the thicknesses of layers can be reduced, it is possible to decrease the driving voltage.

(3) Problems concerning heat generation is not so serious because of the use of the Si substrate which exhibits a small heat resistance.

(4) Since the electron beam generator is produced from semiconductor materials, it becomes easy to obtain a device having a plurality of electron beam generators on a common substrate or to couple the electron beam generator to other device or devices. This obviously contributes to an enlargement in the scale of integration of semiconductor devices.

In particular, the twentieth embodiment offers advantages such as elimination of complicated process such as etching, flat surface of the produced device, and increase in the integration scale by forming this device together with other devices on the same substrate.

Figure 40:
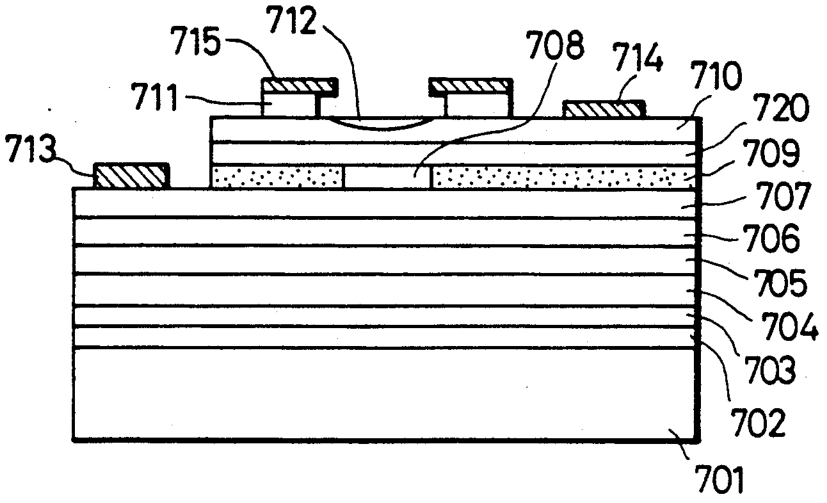
FIG. 40 is a sectional view of a twenty-first embodiment of the present invention.

FIG. 40 is a sectional view of a twenty-first embodiment of the solid-state electron beam generator of the present invention.

In this embodiment, an AlP layer 702 and an AlGaP layer 703 are made to grow on a Si substrate 701 by MOCVD (Metalorganic Chemical Vapor Deposition) method and then a super-grid layer 704 of GaP and GaAsP and a super-grid layer 705 of GaAsP and GaAs are formed. Then, a GaAs layer 706 is made to grow on these super-grid layers. Subsequently, an $n^+$-type GaAs layer 707 and an N-type $Al_xGa_{(1-x)}As$ layer 708 ($0<x\leqq 1$) are made to grow. Oxygen ions are injected into the $Al_xGa_{(1-x)}As$ layer 708 so as to form inert layer 709 in the regions of this layer 708 other than the electron beam generating region.

On the N-type $Al_xGa_{(1-x)}As$ layer 708 is formed a graded layer 720 in which the crystal mixing ratio x of Al is progressively decreased towards the GaAs. A p-type GaAs layer 710 is formed on the graded layer 720. A layer 712 of material for reducing work function is formed by deposition or diffusion on the surface of the n-type GaAs layer 710. An external acceleration electrode 715 is formed on the p-type GaAs layer 710 through the intermediary of an $SiO_2$ insulating layer 711. Then, electrodes 713 and 714 are formed on the $n^+$-type GaAs layer 707 and on the p-type GaAs layer 710, respectively.

The construction will be explained in more detail hereinunder.

As mentioned above, this embodiment incorporates an N-type $Al_xGa_{(1-x)}As$ layer 708 serving as a source for supplying carriers. The symbol x represents the crystal mixing ratio which is selected to meet the condition of $0<x\leqq 1$. The capital-letter symbol N represents an n-type region having a wide band gap. A numeral 709 represents an inert layer formed by injecting oxygen ions into the N-type $Al_xGa_{(1-x)}As$ layer 708.

The embodiment further has the p-type GaAs layer 710. The small-letter symbol "p" is used to mean a p-type region with narrow band gap. In this embodiment, it is possible to add Al such that the p-type GaAs layer is substituted by a P-type $Al_zGa_{(1-z)}As$ layer ($0\leqq z<x$), thereby allowing a control of the band gap.

A reference numeral 712 designates a cesium oxide (Cs-O) layer formed by deposition or diffusion on the surface of the collector layer 710. This Cs-O layer serves as an electron-emission surface. The Cs-O layer 712 may be substituted by another type of layer formed by deposition or diffusion from a material containing an alkali metal such as Cs and at least one element selected from the group consisting of Cu, Ag, Au, Sb, Bi, Se, As, P, Te, Si and O.

Electrode 713 for N-type semiconductor may be formed from a composition such as Au-Ge or Au-Ge-Ni, while the electrode 714 for the p-type semiconductor may be formed from Au-Sn, Ag-Zn, Au-Be or Au-Zn. In the illustrated embodiment, the electrode 714 of the p-type GaAs layer 710 is formed directly on the surface of the p-type GaAs layer. This, however, is not exclusive and the electrode may be formed after doping the surface of this GaAs layer with Be ions so as to form a $p^+$-type region or may be formed on a $p^+$-type GaAs layer grown on the surface of the p-type GaAs layer surface.

Thus, in this twenty-first embodiment, as epitaxial film of GaAs-$Al_xGa_{(1-x)}As$ system has grown on the Si substrate.

The operation of this embodiment will be explained with reference to energy band diagram shown in FIG. 41. In this diagram, the full-line curve shows the energy level [eV] in the thermally equilibrium state of the electron beam generator, while broken-line curve shows the energy level [eV] in the state where a bias voltage is applied.

As explained before, the layer 708 is formed from, for example, $Al_xGa_{(1-x)}As$ layer which has a wide band gap so as to ensure high efficiency of injection of carriers into the layer 710. The crystal mixing ratio x of Al is selected to be $x=0.3$ for attaining a good hetero-junction and considering also influences of the L-band and X-band. This value of the crystal mixing ratio, however, is only illustrative.

The doping rate of the emitter layer 708 is as high as $5\times10$ʃ to $1\times10^{19}$ $cm^{-3}$ so as to allow a large number of carriers to be injected into the base layer 710. This high level of doping causes the state of the layer to be changed into degenerating state and the Fermi level is set above the conductive band.

Since the graded layer 720 is formed between the layer 708 and the layer 710, the crystal mixing ratio x of Al is progressively decreased and reaches zero at the boundary on the layer 710. As shown in FIG. 41, no spike is formed in the hetero junction between the layer 708 and the layer 710, by virtue of the provision of the graded layer 720. The elimination of the spike, which usually acts as a barrier, enables a large number of carriers to be injected into the layer 710, thus assuring a high injection efficiency.

Referring now to the layer 710, this layer 710 is formed from a p-type GaAs layer having a narrow band gap. The amount of dope in this p-type GaAs layer 710 is selected to be on the order of $5\times10^{18}$ $cm^{-3}$ so as to reduce resistance, and the thickness of the layer 710 is selected to be about 300 Å so as to reduce scattering in this layer.

Cs-O is diffused or deposited on the surface of the n-type GaAs layer 710 so that the surface of the layer 710 exhibits a work function which is as small as 1.4 eV. As stated before, the Cs-O used as the material for reducing the work function may be substituted by another material which contains an alkali metal other than Cs, one element selected from the group consisting of Sb, Bi, Se, As, P, Te, Cu, Ag, Au, Si and O.

These layers can be formed in high quality and uniformity by an MBE device or an MOCVD device.

The operation under application of the bias voltage is as follows (See broken-line curve in FIG. 41).

A forward bias voltage is applied between the electrodes 713 and 714, while a bias voltage which is positive with respect to the electrode 714 is applied to the external accelerating electrode 715. As a result, the band of the p-type GaAs layer 710 is deflected downward as shown in FIG. 41, because the p-type GaAs layer with Cs-O diffused thereon exhibits a work function of 1.4 eV while the electronic affinity of the p-type GaAs layer is 4.07 eV. Since the p-type GaAs layer 710 is in the highly doped state, the valence band and the Fermi level substantially coincide with each other. In addition, the band gap of GaAs is 1.428 eV which is greater than the work function (1.4 eV) of the surface having diffused Cs-O. Therefore, the carriers (electrons) of low energy injected from the N-type AlGaAs layer 708 into the p-type GaAs layer 710 drop into the valley V which is formed in the vicinity of the surface as shown in FIG. 41. However, the absolute value of the number of the carriers injected into the layer 710 is increased by virtue of provision of the graded layer, so that the level of the current emitted also is increased correspondingly.

Figure 41:
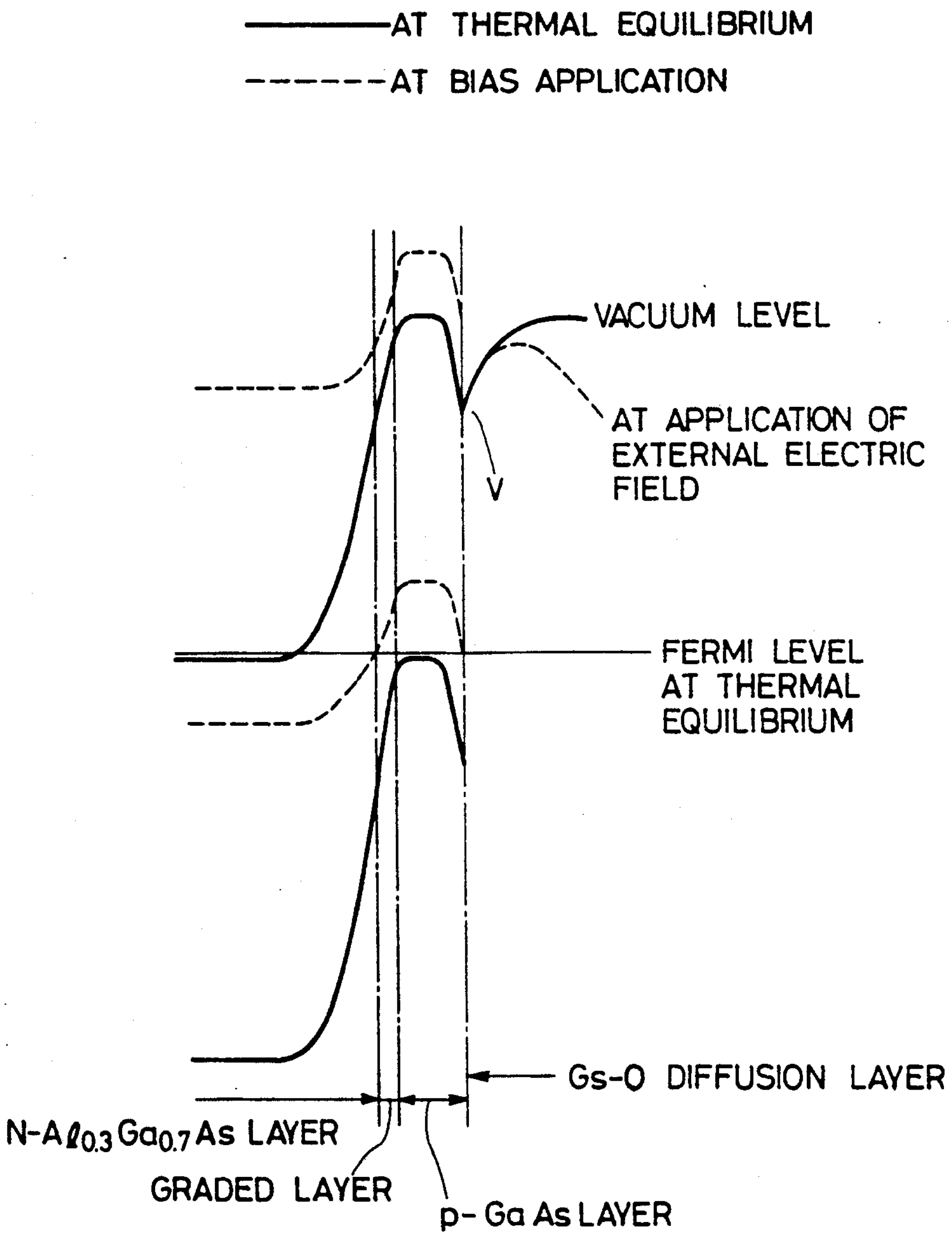
FIG. 41 is an energy band diagram showing electron energy level in the twenty-first embodiment.

The application of the external electric field by the external acceleration electrode 715 causes the vacuum level to be deflected downward as shown in FIG. 41, so that the emitted electrons are further accelerated by this electric field.

Figure 42:
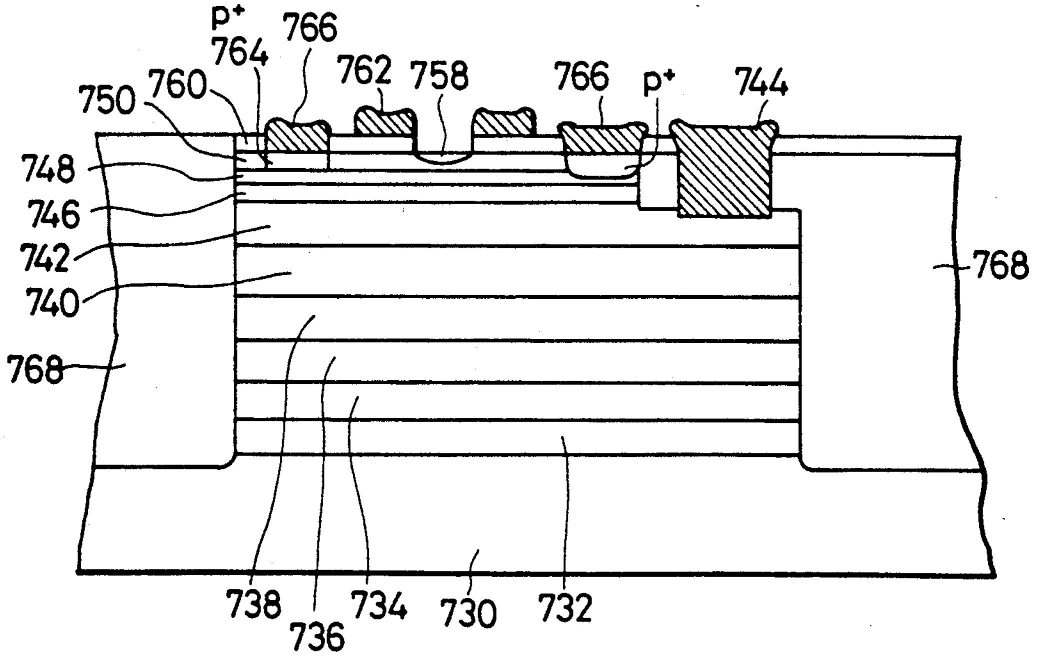
FIG. 42 is a sectional view of a twenty-second embodiment of the present invention.

FIG. 42 is a sectional view of a twenty-second embodiment which makes use of a semi-insulating substrate. This embodiment is formed by injecting elements similar to those used in the twenty-first embodiment shown in FIG. 41 by ion injection technique.

Referring to FIG. 42, a numeral 730 denotes an Si substrate, 732 denotes an AlP layer, 734 denotes an AlGaP layer, 736 denote a super-grid layer of GaP and GaAs, 738 denotes a super-grid layer of GaAsP and GaAs, and 740 denotes a GaAs layer. These layers are substantially the same as those in the twenty-first embodiment shown in FIG. 40.

A numeral 742 denotes an $n^+$-GaAs layer for attaining an ohmic contact with the electrode 744, a numeral 746 denotes a layer formed of N-type $Al_xGa_{(1-x)}As$ ($0<x\leqq 1$), 748 denotes a graded layer in which the crystal mixing ratio of Al is progressively decreased as the distance from the layer 746 is increased, 750 denotes a p-type GaAs base layer, and 758 denotes a layer having diffused or deposited material such as Cs-O for reducing the work function. Numerals 766 and 762 denote, respectively, a bias applying electrode and an external acceleration electrode.

This embodiment can be produced, for example, by the following process. A $p^+$-type region 754 is formed in the electrode-forming portion of the p-type GaAs by injecting Be ions. At the same time, a region 768 is formed by injecting B ions for the purpose of insulation between the layers 746 and 750 and isolation of the device. Then, the $SiO_2$ protection layer 760 is formed, followed by formation of the external acceleration electrode 762 and the electrode 766. Then, a hole is formed to reach the $n^+$-type GaAs layer 742 and is filled with, for example, Au-Ge/Au, thus forming the electrode 744.

Finally, the external acceleration electrode 758 is formed and Cs-O is diffused, thus completing the production process.

This twenty-second embodiment is advantageous over the twenty-first embodiment in that troublesome works such as etching down to the p-type GaAs base layer 505 (see FIG. 31) are eliminated and in that the device can have a flat surface.

The principle of operation of this twenty-second embodiment is not described because it is materially the same as that of the twenty-first embodiment.

Thus, the twenty-second embodiment proposes a planar-type construction which makes it easy to produce a multiple-type device in which a plurality of devices are arranged on a common plane.

Although the described twenty-first and twenty-second embodiments make use of GaAs which is one of a buffer layer incorporating a super-grid layer, this is not exclusive and the embodiments may employ an extremely thin buffer layer (GaAs/GaAs buffer layer (<200 Å)/Si system) grown on the Si substrate at a low temperature.

As will be understood from the foregoing description, the first to fifth embodiments of the present invention offers the following advantages.

(1) Since two compound semiconductors have different band gap widths, and since a graded layer is provided between these semiconductors, the rate of injection of carrier from one semiconductor to another semiconductor is remarkably increased. In consequence, the efficiency of emission of electrons is remarkably increased.

(2) The layers can be formed as epitaxial films having thicknesses on the order of several tens of angstrom (Å), by making an efficient use of an MBE device or an MOCVD device. Thus, the layered structure of the device in accordance with the has high quality and uniformity. Since the thicknesses of layers can be reduced, it is possible to decrease the driving voltage.

(3) Problems concerning heat generation is not so severe because the Si substrate exhibits only small heat resistance.

(4) Since the electron beam generator is produced by using a Si substrate, it becomes easy to obtain a device having a plurality of electron beam generators on a common substrate or to couple the electron beam generator to other device or devices. This obviously contributes to an enlargement in the scale of integration of semiconductor devices.

(5) The layered structure constituting the operating portion has a simple structure so that the manufacture is facilitated.

In particular, the embodiment which makes use of ion injection offers advantages such as elimination of complicated works such as etching, flat surface of the product device and possibility of formation together with other devices on a common substrate so as to assure a larger scale of integration.

I claim:

1. A solid-state electron beam generator having:

a hetero bipolar structure comprising an emitted region having a first band gap, a base region having (i) a second band gap narrower than said first band gap and (ii) a base region electrode, and a collector region having (i) an electron-emitting surface and (ii) a collector region electrode;

electrons from said emitter region being injected into said base region; and a backward bias voltage being applied between said base region electrode and said collector region electrode;

wherein said electrons enter the collector region from the base region, and are accelerated to said electron emitting surface, whereby they are emitted from said electron-emitting surface.

2. A solid-state electron beam generator according to claim 1, wherein said emitter region is constituted by an N-type $Al_xGa_{(1-x)}As$ layer ($0<x\leqq 1$) having said first band gap, and forming a substrate selected from the group consisting of an n-type, $n^+$-type and semi-insulating GaAs substrates, said base region is constituted by a P-type $Al_zGa_{(1-z)}As$ layer ($0\leqq z<x$) having said second band gap, and said collector region is constituted by an n-type $Al_tGa_{(1-t)}As$ ($0\leqq t\leqq 1$) formed on one of said selected substrates.

3. A solid-state electron beam generator according to claim 1, wherein a material containing an alkali metal is diffused in or deposited to said electron-emitting surface of said collector region.

4. A solid-state electron beam generator according to claim 1, wherein said P-type $Al_zGa_{(1-z)}As$ layer ($0\leqq z<x$) constituting said base region is provided with a resonance tunnel section composed in sequence of a non-doped $Al_yGa_{(1-y)}As$ layer, a non-doped $Al_sGa_{(1-s)}As$ layer and a non-doped $Al_yGa_{(1-y)}As$ layer ($0\leqq s<y\leqq 1$).

5. A solid-state electron beam generator according to claim 2, wherein oxygen is charged into a predetermined region of said N-type $Al_xGa_{(1-x)}As$ layer ($0<x\leqq 1$) so as to form an inert region.

6. A solid-state electron beam generator having:

a heterojunction comprising a first region having a first band gap, and a second region having a second band gap narrower than said first band gap; and electrons from said first region being injected into said second region, thereby causing said electrons to be emitted from an end surface of said second region.

7. A solid-state electron beam generator according to claim 6, wherein said first region is constituted by an N-type $Al_xGa_{(1-x)}As$ layer ($0<x\leqq 1$) having said first band gap, and forming a substrate selected from the group consisting of an n-type, $n^+$-type and semi-insulating GaAs substrates, and said second region is constituted by a P-type $Al_zGa_{(1-z)}As$ layer ($0\leqq z<x$) having said second band gap.

8. A solid-state electron beam generator according to claim 6, wherein a material containing an alkali metal is diffused in or deposited to the electron-emitting surface of said second region.

9. A solid-state electron beam generator according to claim 6, wherein said P-type $Al_xGa_{(1-z)}As$ layer ($0\leqq z<x$) constituting said base region is provided with a resonance tunnel section composed in sequence of a non-doped $Al_yGa_{(1-y)}As$ layer, a non-doped $Al_sGa_{(1-}$ $_{s)}$As layer and a non-doped $AlGa_{(1-y)}As$ layer $(0 \leq s < y \leq 1)$.

10. A solid-state electron beam generator according to claim 7, wherein oxygen is charged into a predetermined region of said N-type $Al_xGa_{(1-x)}As$ layer $(0 < x \leq 1)$ so as to form an inert region.

11. A solid-state electron beam generator comprising:

a hetero bipolar semiconductor formed on a GaAs epitaxial film on a Si substrate, said semiconductor comprising an emitter region having a first band gap, a base region having a second band gap narrower than said first band gap, and a collector region having an electron-emitting surface;

electrons from said emitter region being injected into said base region; and a backward bias voltage being applied between said base region and said collector region;

whereby said electrons are emitted from said electron-emitting surface.

12. A solid-state electron beam generator according to claim 11, wherein said emitter region is constituted by an N-type $Al_xGa_{(1-x)}As$ layer $(0 < x \leq 1)$ having said first band gap and formed on said Si substrate, said base region is constituted by a P-type $Al_zGa_{(1-z)}As$ layer $(0 \leq z < x)$ having said second band gap, and said collector region is constituted by an n-type $Al_tGa_{(1-t)}As$ layer $(0 \leq t \leq 1)$.

13. A solid-state electron beam generator according to claim 1, wherein a material containing an alkali metal is diffused in or deposited to said electron-emitting surface of said collector region.

14. A solid-state electron beam generator according to claim 11, wherein said P-type $Al_zGa_{(1-z)}As$ layer $(0 \leq z < x)$ constituting said base region is provided with a resonance tunnel section composed in sequence of a non-doped $Al_yGa_{(1-y)}As$ layer, a non-doped $Al_sGa_{(1-s)}As$ layer and a non-doped $Al_yGa_{(1-y)}As$ layer $(0 \leq s < y \leq 1)$.

15. A solid-state electron beam generator according to claim 12, wherein oxygen is charged into a predetermined region of said N-type $Al_xGa_{(1-x)}As$ layer $(0 < x \leq 1)$ so as to form an inert region.

16. A solid-state electron beam generator comprising:

a heterojunction structure formed on a GaAs epitaxial film on a Si substrate, said hetero junction structure comprising a first region having a first band gap, and a second region having a second band gap narrower than said first band gap; and electrons from said first region being injected into said second region, thereby causing said electrons to be emitted from an end surface of said second region.

17. A solid-state electron beam generator according to claim 16, wherein said first region is constituted by an N-type $Al_xGa_{(1-x)}As$ layer $(0 < x \leq 1)$ having said first band gap and formed on said Si substrate, and said second region is constituted by a P-type $Al_zGa_{(1-z)}$—As layer $(0 \leq z < x)$ having said second band gap.

18. A solid-state electron beam generator according to claim 16, wherein a material containing an alkali metal is diffused in or deposited to the electron-emitting surface of said second region.

19. A solid-state electron beam generator according to claim 16, wherein said P-type $Al_xGa_{(1-z)}As$ layer $(0 \leq z < x)$ constituting said base region is provided with a resonance tunnel section composed in sequence of a non-doped $Al_yGa_{(1-y)}As$ layer, a non-doped $Al_sGa_{(1-s)}As$ layer and a non-doped $Al_yGa_{(1-y)}As$ layer $(0 \leq s < y \leq 1)$.

20. A solid-state electron beam generator according to claim 17, wherein oxygen is charged into a predetermined region of said N-type $Al_xGa_{(1-x)}As$ layer $(0 < x \leq 1)$ so as to form an inert region.

21. A solid-state electron beam generator having:

a hetero bipolar structure comprising an emitter region having a first band gap, a base region having (i) a second band gap narrower than said first band gap, and (ii) base region electrode, a collector region having (i) an electron-emitting surface and (ii) a collector region electrode, and a graded region between said emitter region and said base region and formed from a predetermined material in which the crystal mixing ratio is changed progressively in the direction of said base region;

electrons from said emitter region being injected into said base region; and a backward bias voltage being applied between said base region electrode and said collector region electrode;

wherein said electrons enter the collector region from the base region, and are accelerated to said electron emitting surface, whereby they are emitted from said electron-emitting surface.

22. A solid-state electron beam generator according to claim 21, wherein said emitter region is constituted by an N-type $Al_xGa_{(1-x)}As$ layer $(0 < x \leq 1)$ having said first band gap, and forming a substrate selected from the group consisting of an n-type, a $n^+$-type GaAs substrate, and semi-insulating GaAs substrates, said base region is constituted by a P-type $Al_zGa_{(1-z)}As$ layer $(0 \leq z < x)$ having said second band gap, and said collector region is constituted by an n-type $Al_tGa_{(1-t)}As$ layer $(0 \leq t \leq 1)$.

23. A solid-state electron beam generator according to claim 21, wherein a material containing an alkali metal is diffused in or deposited to said electron-emitting surface of said collector region.

24. A solid-state electron beam generator according to claim 22, wherein said graded region is formed by progressively changing the crystal mixing ratio x of said $Al_xGa_{(1-x)}As$ layer.

25. A solid-state electron beam generator according to claim 22, wherein oxygen is charged into a predetermined region of said N-type $Al_xGa_{(1-x)}As$ layer $(0 < x \leq 1)$ so as to form an inert region.

26. A solid-state electron beam generator having:

a heterojunction comprising a first region having a first band gap, a second region having a second band gap narrower than said first band gap, and a graded region formed of a predetermined material in which the crystal mixing ratio is changed progressively in the direction of the second region; and electrons being injected from said first region into said second region, thereby causing said electrons to be emitted from an electron-emitting surface of said second region.

27. A solid-state electron beam generator according to claim 26, wherein said first region is constituted by an N-type $Al_xGa_{(1-x)}As$ layer $(0 < x \leq 1)$ having said first band gap and formed a substrate selected from an n-type $n^+$-type, semi-insulating GaAs substrates, and said second region is constituted by a P-type $Al_zGa_{(1-z)}As$ layer $(0 \leq z < x)$ having said second band gap.

28. A solid-state electron beam generator according to claim 26, wherein a material containing an alkali metal is diffused in or deposited to the electron-emitting surface of said second region.

29. A solid-state electron beam generator according to claim 27, wherein said graded region is formed by progressively changing the crystal mixing ratio x of said $Al_xGa_{(1-x)}As$ layer.

30. A solid-state electron beam generator according to claim 27, wherein oxygen is charged into a predetermined region of said N-type $Al_xGa_{(1-x)}As$ layer $(0<x\leqq 1)$ so as to form an inert region.

31. A solid-state electron beam generator comprising:

a hetero bipolar semiconductor formed on a GaAs epitaxial film on a Si substrate, said semiconductor comprising an emitter region having a first band gap, a base region having (i) a second band gap narrower than said first band gap and (ii) a base region electrode, a collector region having (i) an electron-emitting surface and (ii) a collector region electrode, and a graded region formed of a predetermined material in which the crystal mixing ratio is changed progressively in the direction of the base region;

electrons from said emitter region being injected into said base region; and a backward bias voltage being applied between said base region electrode and said collector region electrode;

wherein said electrons enter the collector region from the base region, and are accelerated to said electron emitting surface whereby they are emitted from said electron-emitting surface.

32. A solid-state electron beam generator according to claim 31, wherein said emitter region is constituted by an N-type $Al_xGa_{(1-x)}As$ layer $(0<x\leqq 1)$ having said first band gap and formed on said Si substrate, said base region is constituted by a P-type $Al_zGa_{(1-z)}As$ layer $(0\leqq z<x)$ having said second band gap, and said collector region is constituted by an n-type $Al_tGa_{(1-t)}As$ layer $(0\leqq t\leqq 1)$.

33. A solid-state electron beam generator according to claim 31, wherein a material containing an alkali metal is diffused in or deposited to said electron-emitting surface of said collector region.

34. A solid-state electron beam generator according to claim 32, wherein said graded region is formed by progressively changing the crystal mixing ratio x of said $Al_xGa_{(1-x)}As$ layer.

35. A solid-state electron beam generator according to claim 32, wherein oxygen is charged into a predetermined region of said N-type $Al_xGa_{(1-x)}As$ layer $(0<x\leqq 1)$ so as to form an inert region.

36. A solid-state electron beam generator comprising:

a heterojunction structure formed on a GaAs epitaxial film on a Si substrate and constituted by a first region having a first band gap, a second region having a second band gap narrower than said first band gap, and a graded region formed of a predetermined material in which the crystal mixing ratio is changed progressively in the direction of the second region; and electrons from said first region being injected into said second region, thereby causing said electrons to be emitted from an electron-emitting surface of said second region.

37. A solid-state electron beam generator according to claim 36, wherein said first region is constituted by an N-type $Al_xGa_{(1-x)}As$ layer $(0<x\leqq 1)$ having said first band gap, and forming on said Si substrate, and said second region is constituted by a P-type $Al_zGa_{(1-z)}As$ layer $(0\leqq z<x)$ having said second band gap.

38. A solid-state electron beam generator according to claim 36, wherein a material containing an alkali metal is diffused in or deposited to the electron-emitting surface of said second region.

39. A solid-state electron beam generator according to claim 37, wherein said graded region is formed by progressively changing the crystal mixing ratio x of said $Al_xGa_{(1-x)}As$ layer.

40. A solid-state electron beam generator according to claim 37, wherein oxygen is charged into a predetermined region of said N-type $Al_xGa_{(1-x)}As$ layer $(0<x\leqq 1)$ so as to form an inert region.

* * * * *

UNITED STATES PATENT AND TRADEMARK OFFICE

CERTIFICATE OF CORRECTION

PATENT NO. : 5,031,015
DATED : July 9, 1991
INVENTOR(S) : MAMORU MIYAWAKI

It is certified that error appears in the above-indentified patent and that said Letters Patent is hereby corrected as shown below: On the title page:

IN [56] REFERENCES CITED

OTHER PUBLICATIONS, "Pearson" should read --Pearton--.

IN [57] ABSTRACT

Line 11, "$Al_xGa_{1-x)}As$" should read --$Al_xGa_{(1-x)}As$--.

COLUMN 1

Line 17, "generators" should read --generator--.

COLUMN 2

Line 17, "region." should read --region--.
Line 18, "Whereby" should read --whereby--.
Line 30, "hetero junction" should read --heterojunction--.
Line 52, "region. Thereby" should read --region whereby--.

COLUMN 3

Line 3, "hetero junction" should read --heterojunction--.
Line 4, "hetero junc-" should read --heterojunc- --.
Line 45, "hetero junction" should read --heterojunction--.

UNITED STATES PATENT AND TRADEMARK OFFICE
CERTIFICATE OF CORRECTION

PATENT NO. : 5,031,015

DATED : July 9, 1991

INVENTOR(S) : MAMORU MIYAWAKI

It is certified that error appears in the above-indentified patent and that said Letters Patent is hereby corrected as shown below:

COLUMN 4

Line 20, "hetero-junction" should read --heterojunction--.

COLUMN 6

Line 33, "small-letter" should read --small-letter symbol--.
Line 35, "$Ag_tGa_{(1-t)}As$" should read --$Al_tGa_{(1-t)}As$--.

COLUMN 6

Line 68, "thermally" should read --thermal--.

COLUMN 7

Line 8, "hetero junc-" should read --heterojunc- --.
Line 61, "thermally" should read --thermal--.

COLUMN 8

Line 35, "thermally" should read --thermal--.
Line 43, "layer 30a;" should read --layer 30a--.
Line 46, "0=<-" should read --$0 \leq X < y \leq 1$,--.
Line 47, "$X < y \leq 1$," should be deleted.

COLUMN 9

Line 4, "dope" should read --dopant--.
Line 20, "hetero junction" should read --heterojunction--.
Line 43, "layers" should read --layer--.
Line 56, "compoints" should read --components--.

UNITED STATES PATENT AND TRADEMARK OFFICE

CERTIFICATE OF CORRECTION

PATENT NO. : 5,031,015
DATED : July 9, 1991
INVENTOR(S) : MAMORU MIYAWAKI

It is certified that error appears in the above-indentified patent and that said Letters Patent is hereby corrected as shown below:

COLUMN 10

Line 43, "hetero junc-" should read --heterojunc- --.
Line 60, "layer 10" should read --layer 111--.

COLUMN 11

Line 20, "mally" should read --mal--.
Line 27, "hetero junction" should read --heterojunction--.

COLUMN 12

Line 44, "MONOLITHICK" should read --MONOLITHIC--.
Line 54, "portion(s)" should read --portions--.
Line 59, "hetero-junction" should read --heterojunction--.
Line 65, "electron" should read --electrons--.
Line 67, "mally" should read --mal--.

COLUMN 13

Line 35, "tunnel 30" should read --tunnel 130--.
Line 46, "hetero junction" should read --heterojunction--.
Line 67, "portions" should read --portions:--.
Line 68, "layer 132;" should read --layer 139;--.

COLUMN 14

Line 38, "first to fifth" should read --sixth to tenth--.
Line 42, "carrier" should read --carriers--.
Line 63, "other" should read --another-- and "devices." should read --other devices.--.
Line 67, "hetero junc-" should read --heterojunc- --.

UNITED STATES PATENT AND TRADEMARK OFFICE

CERTIFICATE OF CORRECTION

PATENT NO. : 5,031,015

DATED : July 9, 1991

INVENTOR(S) : MaMORU MIYAWAKI

It is certified that error appears in the above-indentified patent and that said Letters Patent is hereby corrected as shown below:

COLUMN 17

Line 5, "thermally" should read --thermal--.
Line 34, "electron" should read --electrons--.
Line 36, "mally" should read --mal--.
Line 42, "layer 230a," should read --layer 230a--.

COLUMN 18

Line 4, "dope" should read --dopant--.
Line 21, "hetero junction" should read --heterojunction--.
Line 34, "been" should read --be an--.
Line 36, "system)/." should read --system).--.
Line 63, "carrier" should read --carriers--.

COLUMN 19

Line 20, "hetero junc-" should read --heterojunc- --.
Line 42, "o-type" should read --p-type--.
Line 62, "10" should read --312--.

COLUMN 20

Line 17, "mally" should read --mal--.
Line 22, "layer 210." should read --layer 310.--.
Line 24, "hetero junc-" should read --heterojunc- --.
Line 29, "$1 \times 10^{19cm-3}$" should read --$1 \times 10^{19} cm^{-3}$--.

COLUMN 20

Line 41, "layer 210." should read --layer 310.--.
Line 45, "dope" should read --dopant--.
Line 47, "$5 \times 10^{18\ cm-3}$" should read --$5 \times 10^{18} cm^{-3}$--.

UNITED STATES PATENT AND TRADEMARK OFFICE
CERTIFICATE OF CORRECTION

PATENT NO. : 5,031,015

DATED : July 9, 1991

INVENTOR(S) : MAMORU MIYAWAKI

It is certified that error appears in the above-indentified patent and that said Letters Patent is hereby corrected as shown below:

COLUMN 20

Line 63, "$V_a$" should read --Va--.
Line 66, "thermally" should read --thermal--.

COLUMN 21

Line 8, "CsO" should read --Cs-O--.
Line 24, "electron" should read --electrons--.
Line 26, "mally" should read --mal--.
Line 32, "310" should read --330-- and "310a," should read --330a--.
Line 34, "310b" should read --330b--.
Line 35, "310c" should read --330c--.
Line 51, "1 X $10^{18cm^{-3}}$," should read --1 X $10^{18}cm^{-3}$,--.
Line 55, "$\Delta E=E_F-E_C \fallingdotseq 0.01$ [EV]" should read --$\Delta E=E_F-E_C \fallingdotseq 0.01$ [eV]--.
Line 60, "1 X $10^{19cm^{-3}}$," should read --1 X $10^{19}cm^{-3}$,--.

COLUMN 22

Line 1, "layer 104" should read --base layer--.
Line 7, "hetero junction" should read --heterojunction--.
Line 29, "are" should read --is--.
Line 44, "first to fifth" should read --thirteenth and fourteenth--.
Line 47, "carrier" should read --carriers--.

COLUMN 23

Line 5, "other" should read --another-- and "devices." should read --other devices.--.
Line 9, "hetero junc-" should read --heretojunc- --.

UNITED STATES PATENT AND TRADEMARK OFFICE

CERTIFICATE OF CORRECTION

PATENT NO. : 5,031,015
DATED : July 9, 1991
INVENTOR(S) : MAMORU MIYAWAKI

It is certified that error appears in the above-indentified patent and that said Letters Patent is hereby corrected as shown below:

COLUMN 23

Line 36, "small-letter" should read --small-letter symbol--.
Line 39, "$Al_tGa_{1-t)}As$" should read --$Al_tGa_{(1-t)}As$--.

COLUMN 24

Line 12, "thermally" should read --thermal--.
Line 20, "hetero junc-" should read --heterojunc- --.
Line 25, "1 X $10^{19cm-3}$" should read --1 X $10^{19}cm^{-3}$--.
Line 49, "dope" should read --dopant--.
Line 52, "layer 6" should read --layer 405--.
Line 62, "one" should read --and at least one--.
Line 68, "1 X $10^{18/cm-3}$" should read --1 X $10^{18}cm^{-3}$--

COLUMN 25

Line 2, "1 X $10^{19}/cm^{-3}$" should read --1 X $10^{19}cm^{-3}$--.
Line 27, "nor" should read --or--.

COLUMN 26

Line 3, "electrode 10." should read --electrode 410.--.
TABLE 5, "$In_xGa_{(1-x)}AsyP_{(1-y)}$" should read --$In_xGa_{(1-x)}As_yP_{(1-y)}$--.

COLUMN 26

Line 47, "first to fifteenth" should read --fifteenth and sixteenth--.
Line 60, "angstrom" should read --angstroms--.
Line 63, "the" (first occurrence) should read --the above--.

UNITED STATES PATENT AND TRADEMARK OFFICE
CERTIFICATE OF CORRECTION

PATENT NO. : 5,031,015

DATED : July 9, 1991

INVENTOR(S) : MAMORU MIYAWAKI

It is certified that error appears in the above-indentified patent and that said Letters Patent is hereby corrected as shown below:

COLUMN 27

Line 2, "other" should read --another-- and "devices." should read --other devices.--.
Line 61, "electrodes" should read --electrode--.
Line 68, "thermally" should read --thermal--.

COLUMN 28

Line 8, "hetero junc-" should read --heterojunc- --.
Line 26, "hetero junction" should read --heterojunction--.
Line 34, "dope" should read --dopant--.
Line 45, "one" should read --and at least one--.

COLUMN 29

Line 16, "nor" should read --or--.
Line 33, "layer" (second occurrence) should be deleted.
Line 67, "fifteenth and sixteenth" should read --seventeenth and eighteenth--.

COLUMN 30

Line 1, "ductors" should read --ductors of--.
TABLE 6, "$In_xGa_{(1-x)}AsyP_{(1-y)}$" should read --$In_xGa_{(1-x)}As_yP_{(1-y)}$--.
Line 29, "first to fifteenth" should read --seventeenth and eighteenth--.
Line 33, "carrier" should read --carriers--.
Line 39, "angstrom" should read --angstroms--.
Line 42, "the" (first occurrence) should read --the above--.
Line 49, "other" should read --another-- and "devices." should read --other devices.--.

UNITED STATES PATENT AND TRADEMARK OFFICE
CERTIFICATE OF CORRECTION

PATENT NO. : 5,031,015

DATED : July 9, 1991

INVENTOR(S) : Mamoru Miyawaki

It is certified that error appears in the above-indentified patent and that said Letters Patent is hereby corrected as shown below:

COLUMN 30

Line 52, "sixteenth" should read --eighteenth--.
Line 53, "process" should read --processes--.

COLUMN 31

Line 29, "small-letter" should read --small-letter symbol--.
Line 37, "10" should read --612--.
Line 62, "thermally" should read --thermal--.

COLUMN 32

Line 1, "ration" should read --ratio--.
Line 3, "hetero junction" should read --heterojunction-
Line 10, "into" should read --into a--.
Line 19, "usually" should read --which usually--.
Line 24, "formed" should read --formed of--.
Line 25, "dope" should read --dopant--.
Line 27, "layer 6" should read --layer 610--.
Line 30, "layer 461" should read --layer 611--.
Line 31, "Cs-O)" should read --Cs-O--.
Line 37, "one" should read --and at least one--.
Line 43, "1 X $10^{18}/cm^{-3}$" should read --1 X $10^{18}cm^{-3}$--.
Line 67, "nor" should read --or--.

COLUMN 33

Line 15, "Gap" should read --Gap --.
Line 25, "layer 402" should read -- layer 646 --.

UNITED STATES PATENT AND TRADEMARK OFFICE

CERTIFICATE OF CORRECTION

PATENT NO. : 5,031,015

DATED : July 9, 1991

INVENTOR(S) : MAMORU MIYAWAKI

It is certified that error appears in the above-indentified patent and that said Letters Patent is hereby corrected as shown below:

COLUMN 34

Line 2, "first to fifteenth" should read --nineteenth and twentieth--.
Line 6, "carrier" should read --carriers--.
Line 15, "angstrom" should read --angstroms--.
Line 18, "the" (first occurrence) should read --the above--.
Line 28, "other" should read --another-- and "devices." should read --other devices.--.
Line 32, "process" should read --processes--.

COLUMN 35

Line 32, "as" should read --an--.
Line 38, "thermally" should read --thermal--.
Line 46, "hetero junc-" should read --heterojunc- --.
Line 51, "5 X 10✓" should read --5 X $10^{17}$--.
Line 60, "hereto junction" should read --heterojunction--.
Line 68, "dope" should read --dopant--.

COLUMN 36

Line 11, "one" should read --and at least one--.
Line 28, "which" should be deleted.

COLUMN 37

Line 17, "Fig. 31)" should read --Fig. 41)--.
Line 34, "first to fifth" should read --twenty-first and twenty-second--.
Line 39, "carrier" should read --carriers--.
Line 44, "angstrom" should read --angstroms--.

UNITED STATES PATENT AND TRADEMARK OFFICE
CERTIFICATE OF CORRECTION

PATENT NO. : 5,031,015

DATED : July 9, 1991

INVENTOR(S) : MAMORU MIYAWAKI

It is certified that error appears in the above-indentified patent and that said Letters Patent is hereby corrected as shown below:

COLUMN 37

Line 47, "the" should read --the above--.
Line 57, "other" should read --another-- and "devices." should read --other devices.--.

COLUMN 38

Line 65, "$Al_xGa_{(1-z)}As$" should read --$Al_zGa_{(1-z)}As$--.

COLUMN 39

Line 1, "$AlGa_{(1-y)}As$" should read --$Al_yGa_{(1-y)}As$--.
Line 46, "hetero junction" should read --heterojunction--.
Line 58, "$Al_zGa_{(1-z)}$-As" should read --$Al_zGa_{(1-z)}As$--.
Line 65, "$Al_xGa_{(1-z)}As$" should read --$Al_zGa_{(1-z)}As$--.

COLUMN 40

Line 31, "GaAs sub-" should be deleted.
Line 32, "strate," should be deleted.
Line 65, "gap and formed" should read --gap, and forming-- and "n-type" should read --n-type,--.
Line 66, "$n^+$-type" should read --$n^+$-type and--.

COLUMN 42

Line 28, "gap, and forming" should read --gap and formed--.

UNITED STATES PATENT AND TRADEMARK OFFICE

CERTIFICATE OF CORRECTION

PATENT NO. : 5,031,015

DATED : July 9, 1991

INVENTOR(S) : MAMORU MIYAWAKI

It is certified that error appears in the above-indentified patent and that said Letters Patent is hereby corrected as shown below:

COLUMN 42

Line 43, Insert:
--41. A solid-state electron beam generator as in any one of Claims 1, 6, 11, 16, 21, 26, 31 or 36, wherein said solid-state electron beam generator has a plurality of hetero bipolar structures.--.

COLUMN 15

Line 40, "small-letter" should read --small-letter symbol--.
Line 52, "10" should read --212--.

COLUMN 16

Line 10, "mally" should read --mal--.
Line 17, "hetero junc-" should read --heterojunc- --.
Line 57, "layer 8." should read --layer 211.--.

Signed and Sealed this

Twenty-eighth Day of December, 1993

Attest:

BRUCE LEHMAN

Attesting Officer

Commissioner of Patents and Trademarks